(12) United States Patent
Lee et al.

(10) Patent No.: US 8,929,145 B2
(45) Date of Patent: *Jan. 6, 2015

(54) NONVOLATILE MEMORY DEVICE, PROGRAMMING METHOD THEREOF AND MEMORY SYSTEM INCLUDING THE SAME

(71) Applicants: Changhyun Lee, Suwon-si (KR); Jinman Han, Seongnam-si (KR); Doogon Kim, Hwaseong-si (KR); Sunghoi Hur, Seoul (KR); Jongin Yun, Seoul (KR)

(72) Inventors: Changhyun Lee, Suwon-si (KR); Jinman Han, Seongnam-si (KR); Doogon Kim, Hwaseong-si (KR); Sunghoi Hur, Seoul (KR); Jongin Yun, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/043,256

(22) Filed: Oct. 1, 2013

(65) Prior Publication Data

US 2014/0029344 A1     Jan. 30, 2014

Related U.S. Application Data

(63) Continuation of application No. 13/029,518, filed on Feb. 17, 2011, now Pat. No. 8,570,805.

(60) Provisional application No. 61/344,353, filed on Jul. 6, 2010.

(30) Foreign Application Priority Data

Feb. 18, 2010   (KR) .................. 10-2010-0014755
Jun. 4, 2010    (KR) .................. 10-2010-0052986

(51) Int. Cl.
  *G11C 16/04*      (2006.01)
  (Continued)

(52) U.S. Cl.
  CPC ........ *G11C 16/107* (2013.01); *H01L 27/11578* (2013.01); *H01L 27/11582* (2013.01);
  (Continued)

(58) Field of Classification Search
  USPC ....................... 365/185.17, 185.18
  See application file for complete search history.

(56) References Cited

U.S. PATENT DOCUMENTS 5,511,022 A   4/1996  Yim et al.
5,673,223 A   9/1997  Park
(Continued)

FOREIGN PATENT DOCUMENTS

CN    1906700 A     1/2007
CN    101106140 A   1/2008
(Continued)

OTHER PUBLICATIONS

US Office Action dated Jan. 15, 2013 for related U.S. Appl. No. 13/023,934.

(Continued)

*Primary Examiner* — Huan Hoang
(74) *Attorney, Agent, or Firm* — Harness, Dickey & Pierce, P.L.C.

(57) ABSTRACT

Provided is a programming method of a nonvolatile memory device. The nonvolatile memory device includes a substrate and a plurality of memory cells which are stacked in the direction perpendicular to the substrate. The programming method applies a first voltage to a selected bit line connected to at least two memory strings in same column including a memory cell of the plurality of memory cell to be programmed, applies a second voltage to an unselected bit line connected to at least two memory strings in same column including a memory cell of the plurality of memory cell to be program-prohibited, applies a third voltage to a selected string selection line connected to at least two memory strings in same row, applies a fourth voltage to an unselected string selection line connected to at least two memory strings in same row, and applies a program operation voltage to a plurality of word lines, each word line connected to each corresponding memory cell in the memory string, wherein the first to third voltages are positive voltages.

6 Claims, 36 Drawing Sheets

(51) Int. Cl.
*H01L 27/115* (2006.01)
*G11C 16/10* (2006.01)
*H01L 29/792* (2006.01)

(52) U.S. Cl.
CPC ............ *G11C 16/10* (2013.01); *H01L 29/7926* (2013.01); *G11C 2213/71* (2013.01); *G11C 16/0483* (2013.01)
USPC .............................. 365/185.17; 365/185.18

(56) References Cited

U.S. PATENT DOCUMENTS

| | | |
|---|---|---|
| 5,715,193 A | 2/1998 | Norman |
| 5,740,107 A | 4/1998 | Lee |
| 5,923,587 A | 7/1999 | Choi |
| 6,009,014 A | 12/1999 | Hollmer et al. |
| 6,028,788 A | 2/2000 | Choi et al. |
| 6,285,587 B1 | 9/2001 | Kwon |
| 6,295,227 B1 | 9/2001 | Sakui et al. |
| 6,650,566 B2 | 11/2003 | Jeong et al. |
| 6,850,439 B1 | 2/2005 | Tanaka |
| 6,894,924 B2 | 5/2005 | Choi et al. |
| 6,975,542 B2 | 12/2005 | Roohparvar |
| 7,064,986 B2 | 6/2006 | Lee et al. |
| 7,079,419 B2 | 7/2006 | Roohparvar |
| 7,177,192 B2 | 2/2007 | Yoon et al. |
| 7,233,522 B2 | 6/2007 | Chen et al. |
| 7,292,476 B2 | 11/2007 | Goda et al. |
| 7,403,422 B2 | 7/2008 | Kim et al. |
| 7,403,429 B2 | 7/2008 | Chae et al. |
| 7,408,806 B2 | 8/2008 | Park et al. |
| 7,417,904 B2 | 8/2008 | Sivero et al. |
| 7,450,433 B2 | 11/2008 | Wan et al. |
| 7,480,178 B2 | 1/2009 | Park et al. |
| 7,489,556 B2 | 2/2009 | Tanzawa |
| 7,518,920 B2 | 4/2009 | Kang |
| 7,529,138 B2 | 5/2009 | Park et al. |
| 7,532,514 B2 | 5/2009 | Cernea et al. |
| 7,551,477 B2 | 6/2009 | Mokhlesi et al. |
| 7,551,492 B2 | 6/2009 | Kim |
| 7,566,927 B2 | 7/2009 | Kim et al. |
| 7,606,074 B2 | 10/2009 | Wan et al. |
| 7,633,803 B2 | 12/2009 | Lee |
| 7,652,931 B2 | 1/2010 | Park et al. |
| 7,668,014 B2 | 2/2010 | Hwang |
| 7,724,577 B2 | 5/2010 | Goda et al. |
| 7,778,078 B2 | 8/2010 | Nagadomi et al. |
| 7,778,084 B2 | 8/2010 | Kim et al. |
| 7,813,184 B2 | 10/2010 | Kim et al. |
| 7,859,902 B2 | 12/2010 | Maejima |
| 7,888,731 B2 | 2/2011 | Kim |
| 7,924,629 B2 | 4/2011 | Park et al. |
| 7,933,151 B2 | 4/2011 | Maeda et al. |
| 7,936,004 B2 | 5/2011 | Kito et al. |
| 7,936,617 B2 | 5/2011 | Sudo |
| 7,940,572 B2 | 5/2011 | Kim |
| 7,952,136 B2 | 5/2011 | Kito et al. |
| 7,983,084 B2 | 7/2011 | Tokiwa et al. |
| 8,013,389 B2 | 9/2011 | Oh et al. |
| 8,023,321 B2 | 9/2011 | Kim |
| 8,125,825 B2 | 2/2012 | Seol |
| 8,169,826 B2 | 5/2012 | Hishida et al. |
| 8,243,518 B2 | 8/2012 | Oh et al. |
| 8,274,108 B2 | 9/2012 | Katsumata et al. |
| 8,318,602 B2 | 11/2012 | Kito et al. |
| 8,467,246 B2 | 6/2013 | Kim et al. |
| 8,570,805 B2 * | 10/2013 | Lee et al. .................. 365/185.17 |
| 8,582,372 B2 | 11/2013 | Kim |
| 8,638,608 B2 | 1/2014 | Lai et al. |
| 2002/0071311 A1 | 6/2002 | Jeong et al. |
| 2005/0006692 A1 | 1/2005 | Kim et al. |
| 2005/0128807 A1 | 6/2005 | Chen et al. |
| 2005/0141283 A1 | 6/2005 | Lee et al. |
| 2005/0248991 A1 | 11/2005 | Lee et al. |
| 2006/0050594 A1 | 3/2006 | Park |
| 2006/0140012 A1 | 6/2006 | Wan et al. |
| 2007/0018320 A1 | 1/2007 | Tanida et al. |
| 2007/0025220 A1 | 2/2007 | Yoshikawa et al. |
| 2007/0070701 A1 | 3/2007 | Kim et al. |
| 2007/0158736 A1 | 7/2007 | Arai et al. |
| 2007/0159886 A1 | 7/2007 | Kang |
| 2007/0183204 A1 | 8/2007 | Kim et al. |
| 2007/0230253 A1 | 10/2007 | Kim |
| 2007/0247912 A1 | 10/2007 | Kamigaichi et al. |
| 2007/0252201 A1 | 11/2007 | Kito et al. |
| 2007/0297234 A1 | 12/2007 | Cernea et al. |
| 2008/0007999 A1 | 1/2008 | Park et al. |
| 2008/0013377 A1 | 1/2008 | Sel et al. |
| 2008/0099819 A1 | 5/2008 | Kito et al. |
| 2008/0173928 A1 | 7/2008 | Arai et al. |
| 2008/0173933 A1 | 7/2008 | Fukuzumi et al. |
| 2008/0181020 A1 | 7/2008 | Yu et al. |
| 2008/0253183 A1 | 10/2008 | Mizukami et al. |
| 2008/0279012 A1 | 11/2008 | Lee |
| 2008/0310230 A1 | 12/2008 | Kim et al. |
| 2009/0002182 A1 | 1/2009 | Knox et al. |
| 2009/0021983 A1 | 1/2009 | Wan et al. |
| 2009/0021988 A1 | 1/2009 | Hong et al. |
| 2009/0027935 A1 | 1/2009 | Nakata et al. |
| 2009/0097309 A1 | 4/2009 | Mizukami et al. |
| 2009/0122613 A1 | 5/2009 | Kim et al. |
| 2009/0168533 A1 | 7/2009 | Park et al. |
| 2009/0172267 A1 | 7/2009 | Oribe et al. |
| 2009/0175081 A1 | 7/2009 | Kim |
| 2009/0180323 A1 | 7/2009 | Park et al. |
| 2009/0268523 A1 | 10/2009 | Maejima |
| 2009/0268524 A1 | 10/2009 | Maejima |
| 2009/0279359 A1 | 11/2009 | Goda et al. |
| 2009/0316491 A1 | 12/2009 | Park et al. |
| 2010/0038703 A1 | 2/2010 | Fukuzumi et al. |
| 2010/0107021 A1 | 4/2010 | Nagadomi et al. |
| 2010/0124120 A1 | 5/2010 | Park et al. |
| 2010/0159657 A1 | 6/2010 | Arai et al. |
| 2010/0177566 A1 | 7/2010 | Kim et al. |
| 2010/0195395 A1 | 8/2010 | Jeong et al. |
| 2010/0238732 A1 | 9/2010 | Hishida et al. |
| 2011/0063913 A1 | 3/2011 | Maejima |
| 2011/0170352 A1 | 7/2011 | Kim |
| 2011/0189853 A1 | 8/2011 | Kito et al. |
| 2011/0199825 A1 | 8/2011 | Han et al. |
| 2011/0216603 A1 | 9/2011 | Han et al. |
| 2011/0238913 A1 | 9/2011 | Kurashige et al. |
| 2012/0045890 A1 | 2/2012 | Sel et al. |
| 2012/0060066 A1 | 3/2012 | Nagadomi et al. |
| 2012/0099377 A1 | 4/2012 | Maejima |
| 2012/0275234 A1 | 11/2012 | Lee et al. |
| 2013/0182502 A1 | 7/2013 | Cheo et al. |
| 2014/0022846 A1 | 1/2014 | Kim |

FOREIGN PATENT DOCUMENTS

| | | |
|---|---|---|
| CN | 101165909 A | 4/2008 |
| CN | 101627444 A | 1/2010 |
| JP | 08-279295 | 10/1996 |
| JP | 90-07383 A | 1/1997 |
| JP | 10-032269 A | 2/1998 |
| JP | H10-093083 | 4/1998 |
| JP | 2000-222895 A | 8/2000 |
| JP | 2002-203393 A | 7/2002 |
| JP | 2005-032430 A | 2/2005 |
| JP | 2005-116119 A | 4/2005 |
| JP | 2005-196931 A | 7/2005 |
| JP | 2006-073168 A | 3/2006 |
| JP | 2007-087569 A | 4/2007 |
| JP | 2007-180389 A | 7/2007 |
| JP | 2007-184090 A | 7/2007 |
| JP | 2007-200540 A | 8/2007 |
| JP | 2007-266143 A | 10/2007 |
| JP | 2007-272952 A | 10/2007 |
| JP | 2007-293986 A | 11/2007 |
| JP | 2007-323716 A | 12/2007 |
| JP | 2008-103429 A | 5/2008 |
| JP | 2008-172164 A | 7/2008 |
| JP | 2008-310949 A | 12/2008 |

(56) References Cited

FOREIGN PATENT DOCUMENTS

| | | |
|---|---|---|
| JP | 2008-311650 A | 12/2008 |
| JP | 2009-026369 A | 2/2009 |
| JP | 2009-088446 A | 4/2009 |
| JP | 2009-124107 A | 6/2009 |
| JP | 2009-266281 A | 11/2009 |
| JP | 2009-266946 A | 11/2009 |
| JP | 2011-508937 A | 3/2011 |
| KR | 10-0157342 B1 | 7/1998 |
| KR | 10-0390145 B1 | 7/2003 |
| KR | 10-0541819 B1 | 1/2006 |
| KR | 2006-0129806 A | 12/2006 |
| KR | 10-0672151 B1 | 1/2007 |
| KR | 10-0688494 B1 | 3/2007 |
| KR | 10-0706797 B1 | 4/2007 |
| KR | 10-0729359 B1 | 6/2007 |
| KR | 2007-0078355 A | 7/2007 |
| KR | 2007-0096972 A | 10/2007 |
| KR | 10-0784862 B1 | 12/2007 |
| KR | 2008-0005765 A | 1/2008 |
| KR | 2008-0110168 A | 12/2008 |
| KR | 2009-0002471 A | 1/2009 |
| KR | 10-0884861 A | 2/2009 |
| KR | 10-0890016 B1 | 3/2009 |
| KR | 2009-0034776 A | 4/2009 |
| KR | 10-0897415 B1 | 5/2009 |
| KR | 2009-0048877 A | 5/2009 |
| KR | 2009-0072406 A | 7/2009 |
| KR | 2009-0079037 A | 7/2009 |
| WO | WO-2009/086618 A1 | 7/2009 |

OTHER PUBLICATIONS

US Office Action dated Jan. 15, 2013 for related U.S. Appl. No. 13/028,918.
US Office Action dated Mar. 12, 2013 for related U.S. Appl. No. 12/985,695.
Jaehoon Jang et al. "Vertical Cell Array Using TCAT (Terabit Cell Array Transistor) Technology for Ultra High Density NAND Flash Memory", VLSI Symp. Tech. Dig., pp. 192-193, 2009.
U.S. Appl. No. 13/721,963, filed Dec. 1, 2012.
U.S. Appl. No. 13/867,716, filed Apr. 22, 2013.
U.S. Appl. No. 13/607,038, filed Sep. 7, 2012.
U.S. Appl. No. 13/545,588, filed Jul. 10, 2012.
U.S. Appl. No. 12/985,695, filed Jan. 6, 2011.
U.S. Appl. No. 13/211,743, filed Aug. 17, 2011.
U.S. Appl. No. 13/967,455, filed Aug. 15, 2013.
U.S. Appl. No. 14/029,100, filed Sep. 17, 2013.
Notice of Allowance dated Feb. 7, 2014 for related U.S. Appl. No. 13/967,455.
US Office Action dated Feb. 14, 2014 for related U.S. Appl. No. 14/029,100.
Notice of Allowance dated Oct. 11, 2013 in corresponding U.S. Appl. No. 13/967,455.
Office Action dated Aug. 30, 2013 in corresponding U.S. Appl. No. 12/985,695.
Office Action dated Nov. 1, 2013 in corresponding U.S. Appl. No. 13/545,588.
U.S. Appl. No. 13/211,743, filed Aug. 17, 2011,
U.S. Appl. No. 13/545/588, filed Jul. 10, 2012.
U.S. Appl. No. 13/721,963, filed Dec. 20, 2012.
Office Action dated Mar. 21, 2014 in copending U.S. Appl. No. 13/607,038.
U.S. Appl. No. 13/967,455, file Aug. 15, 2013.
U.S. Appl. No. 14/302,087, filed Jun. 11, 2014.
U.S. Office Action dated Feb. 28, 2014 from related U.S. Appl. No. 13/721,963.
Notice of Allowance dated Mar. 11, 2014 from related U.S. Appl. No. 13/545,588.
Notice of Allowance for corresponding U.S. Appl. No. 13/607,038 dated Aug. 1, 2014.
T. Maeda et al. "Multi-stacked 1G cell/layer Pipe-shaped BiCS Flash Memory"; 2009 Symposium on VLSI Circuits, p. 22-23; Jun. 2009.
Notice of Allowance for corresponding U.S. Appl. No. 14/029,100 dated Aug. 6, 2014.
US Office Action dated Dec. 24, 2013 for related U.S. Appl. No. 13/867,716.
US Office Action dated Jan. 2, 2014 for related U.S. Appl. No. 12/985,695.

* cited by examiner

Fig. 7

|  | 1st Column | 2nd Column | 3rd Column |
|---|---|---|---|
| BL | Vcc | Vss | Vcc |
| SSL1 | VSSL | | |
| WL | Vpass, Vpgm | | |
| GSL | Vss | | |
| Channel | Vboost1 | Vss | Vboost1 |
| String | NS11 | NS12 | NS13 |

Fig. 8

|  | 1st Column | 2nd Column | 3rd Column |
|---|---|---|---|
| BL | Vcc | Vss | Vcc |
| SSL2 | VSSL | | |
| WL | Vpass, Vpgm | | |
| GSL | Vss | | |
| Channel | Vboost2 | Vboost2 | Vboost2 |
| String | NS21 | NS22 | NS23 |

Fig. 11

|  | 1st Column | 2nd Column | 3rd Column |
|---|---|---|---|
| BL | VBL2 | VBL1 | VBL2 |
| SSL1 | VSSL | | |
| WL | Vpass, Vpgm | | |
| GSL | Vss | | |
| Channel | Vboost1 | VBL1 | Vboost1 |
| String | NS11 | NS12 | NS13 |

Fig. 12

|  | 1st Column | 2nd Column | 3rd Column |
|---|---|---|---|
| BL | VBL2 | VBL1 | VBL2 |
| SSL2 | VSS | | |
| WL | Vpass, Vpgm | | |
| GSL | Vss | | |
| Channel | Vboost2 | Vboost2 | Vboost2 |
| String | NS21 | NS22 | NS23 |

Fig. 15

|  | 1st Column | 2nd Column | 3rd Column |
|---|---|---|---|
| BL | VBL2 | VBL3 | VBL2 |
| SSL1 | VSSL1 | | |
| WL | Vpass, Vpgm | | |
| GSL | Vss | | |
| Channel | Vboost1 | VBL3 | Vboost1 |
| String | NS11 | NS12 | NS13 |

Fig. 16

|  | 1st Column | 2nd Column | 3rd Column |
|---|---|---|---|
| BL | VBL2 | VBL3 | VBL2 |
| SSL2 | VSSL2 | | |
| WL | Vpass, Vpgm | | |
| GSL | Vss | | |
| Channel | Vboost3 | Vboost3 | Vboost3 |
| String | NS21 | NS22 | NS23 |

Fig. 18

|  | 1st Column | 2nd Column | 3rd Column |
|---|---|---|---|
| BL | VBL2 | VBL5 | VBL2 |
| SSL1 | VSSL1 | | |
| WL | Vpass, Vpgm | | |
| GSL | Vss | | |
| Channel | Vboost1 | VBL5 | Vboost1 |
| String | NS11 | NS12 | NS13 |

Fig. 19

|  | 1st Column | 2nd Column | 3rd Column |
|---|---|---|---|
| BL | VBL2 | VBL5 | VBL2 |
| SSL2 | Vss | | |
| WL | Vpass, Vpgm | | |
| GSL | Vss | | |
| Channel | Vboost4 | Vboost4 | Vboost4 |
| String | NS21 | NS22 | NS23 |

NONVOLATILE MEMORY DEVICE, PROGRAMMING METHOD THEREOF AND MEMORY SYSTEM INCLUDING THE SAME

CROSS-REFERENCE TO RELATED APPLICATIONS

This application is a continuation application of U.S. application Ser. No. 13/029,518, filed Feb. 17, 2011, which claims priority under 35 U.S.C. §119 to Korean Patent Application No. 2010-0014755 filed on Feb. 18, 2010 and Korean Patent Application No. 2010-052986 filed on Jun. 4, 2010 in the Korean Intellectual Property Office (KIPO) and U.S. Provisional Ser. No. 61/344,353, filed on Jul. 6, 2010, the entire contents of each of which are herein incorporated by reference.

BACKGROUND

The present disclosure herein relates to a semiconductor memory, and more particularly, to a Three-Dimensional (3D) nonvolatile memory device, a programming method thereof and a memory system including the same.

A semiconductor memory device is a memory device that is implemented with semiconductor materials such as silicon (Si), germanium (Ge), gallium arsenide (GaAs) and indium phosphide (InP). Semiconductor memory devices may be largely divided into volatile memory devices and nonvolatile memory devices.

A volatile memory device is a memory device in which stored data are erased when a power source is shut off. Examples of volatile memory devices include Static Random Access Memory (SRAM), Dynamic Random Access Memory (DRAM) and Synchronous Dynamic Random Access Memory (SDRAM). Nonvolatile memory device is a memory device that retains stored data even when a power source is shut off. Examples of nonvolatile memory devices include Read-Only Memory (ROM), Programmable Read Only Memory (PROM), Erasable Programmable Read Only Memory (EPROM), Electrical Erasable Programmable Read Only Memory (EEPROM), flash memory devices, Phase-change Random Access Memory (PRAM), Magnetoresistive Random Access Memory (MRAM), Resistive Random Access Memory (RRAM) and Ferroelectric Random Access Memory (FRAM). The flash memory device is largely categorized into a NOR type and a NAND type.

SUMMARY

The present disclosure provides a nonvolatile memory device (for example, having a 3-dimensional array structure), a programming method thereof and a memory system including the same.

Example embodiments of inventive concepts provide programming methods of a nonvolatile memory device including a substrate and a plurality of memory strings each memory string including a plurality of memory cells stacked in the direction vertical to the substrate, including applying a first voltage to a selected bit line connected to at least two memory strings in same column including a memory cell of the plurality of memory cell to be programmed, applying a second voltage to an unselected bit line connected to at least two memory strings in same column including a memory cell of the plurality of memory cell to be program-prohibited, applying a third voltage to a selected string selection line connected to at least two memory strings in same row, applying a fourth voltage to an unselected string selection line connected to at least two memory strings in same row, and applying a program operation voltage to a plurality of word lines, each word line connected to each corresponding memory cell in the memory string, wherein the first to third voltages are positive voltages.

In example embodiments, the first voltage has a lower level than the second voltage, the fourth voltage has a lower level than the third voltage, and the fourth voltage has a lower level than the first voltage.

In example embodiments, the applying the program operation voltage comprises applying a pass voltage to the plurality of word lines and then applying to a program voltage to a selected word line.

In example embodiments, partial lines of the plurality of word lines, which are connected to memory cells disposed at the same height from the substrate, are connected in common, and the program operation voltage is applied to the partial lines which are connected in common.

In example embodiments, the fourth voltage is a positive voltage.

In example embodiments, the fourth voltage has a lower level than the third voltage.

In example embodiments, the first voltage has a lower level than the second voltage.

In example embodiments, the first voltage has the same level as a level of the fourth voltage.

In example embodiments, the methods further comprising applying a ground voltage to the unselected string selection line before the applying a program operation voltage to a plurality of word lines.

In example embodiments, the fourth voltage has the same level as a level of the third voltage.

In example embodiments, the methods further comprising applying a fifth voltage having a lower level than the first voltage to the selected bit line before the applying a program operation voltage to a plurality of word lines.

In example embodiments, the fifth voltage has a positive level.

In example embodiments, the first positive voltage has the same level as a level of the second positive voltage.

In example embodiments, a channel voltage of the selected memory cell is formed as a positive voltage while the program operation voltage is being applied.

Example embodiments of inventive concepts provide nonvolatile memory devices comprising a memory cell array comprising a substrate and a plurality of memory cells which are stacked in a direction vertical to the substrate and a reading and writing circuit connected to the memory cell array through a plurality of bit lines, wherein in a programming operation, the reading and writing circuit applies a first positive voltage to at least one bit line corresponding to memory cells to be programmed and a second positive voltage to at least one bit line corresponding to memory cells to be program-prohibited.

In example embodiments, the first positive voltage has a lower level than the second positive voltage.

In example embodiments, groups of the plurality of memory cells respectively configure NAND strings, the bit lines are respectively connected to at least two of the NAND strings, and the nonvolatile memory device further comprises a decoder transferring a program operation voltage to word lines connected to the at least two NAND strings, in the programming operation.

In example embodiments, the program operation voltage comprises a program voltage transferred to a selected word line, and a pass voltage transferred to unselected word lines.

In example embodiments, each of the NAND strings is extended in a direction vertical to the substrate and is connected to a corresponding bit line among the bit lines.

In example embodiments, the reading and writing circuit comprises a plurality of page buffers respectively corresponding to the bit lines, wherein each of the page buffers comprises a latch receiving and storing a writing data in a programming operation, a bias circuit setting up a corresponding bit line to the first positive voltage when the writing data stored in the latch is a program data.

In example embodiments, nonvolatile memory devices further comprise a decoder connected to the memory cell array through word lines and selection lines, wherein in the programming operation, the reading and writing circuit applies a first positive voltage to a selected bit line and applies a second positive voltage to an unselected bit line, in the programming operation, the decoder applies a third positive voltage to a selected selection line among the selection lines, applies a fourth positive voltage to an unselected selection line, and applies a program operation voltage to the word lines.

In example embodiments, in the programming operation, the decoder further applies the fourth positive voltage larger than a ground voltage to the unselected selection line and then applies a ground voltage to the unselected selection line.

Example embodiments of inventive concepts provide memory systems comprising a nonvolatile memory device, and a controller controlling the nonvolatile memory device, wherein the nonvolatile memory device comprises a memory cell array comprising a substrate and a plurality of memory cells which are stacked in a direction vertical to the substrate and a reading and writing circuit connected to the memory cell array through bit lines, wherein in a programming operation, the reading and writing circuit applies a positive voltage to bit lines corresponding to memory cells to be programmed.

In example embodiments, the controller and the nonvolatile memory device configure a semiconductor drive (Solid State Drive (SSD)).

In example embodiments, the controller and the nonvolatile memory device configure a memory card.

Example embodiments of inventive concepts provide memory devices comprising a plurality of memory strings perpendicular to a substrate, in a two-dimensional array, each including at least one string selection transistor, the plurality of memory strings arranged in rows and columns, wherein columns of the plurality of memory strings are each connected to a corresponding bit line by the corresponding at least one string selection transistor and rows of the plurality of memory strings are each connected to a corresponding string select line by the corresponding at least one string selection transistor and a writing circuit connected to the bit lines, wherein in a program operation to program a selected memory cell of a selected memory string connected to a selected bit line and a selected string select line, the writing circuit applies a first positive voltage to the selected bit line.

In example embodiments, the first positive voltage is less than a threshold voltage of the at least one string selection transistor.

In example embodiments, the writing circuit applies the first positive voltage to the selected memory string connected to the selected bit line and to non-selected strings connected to the selected bit line.

In example embodiments, the writing circuit applies a second positive voltage to the plurality of memory strings connected to non-selected bit lines.

In example embodiments, the first positive voltage is smaller than the second positive voltage.

In example embodiments, the first positive voltage is smaller than a power source voltage.

In example embodiments, the second positive voltage is equal to a power source voltage.

In example embodiments, memory devices further comprise a decoder, connected to the plurality of string select lines, configured to apply a third positive voltage to the selected string select line.

In example embodiments, the third positive voltage is equal to a power source voltage.

In example embodiments, the decoder further applies a fourth positive voltage to the plurality of memory strings connected to non-selected string select lines.

In example embodiments, the fourth positive voltage is smaller than the third positive voltage.

In example embodiments, the fourth positive voltage is a ground voltage.

In example embodiments, the decoder is configured to apply a program operation voltage to an unselected word line and a selected word line connected to the plurality of memory cells in the memory string to program the selected memory cell.

In example embodiments, the program operation voltage includes a pass voltage applied to the plurality of word lines and a program voltage applied to a selected word line.

In example embodiments, the fourth positive voltage is larger than a ground voltage and a channel of a memory string connected to the unselected string select lines and the unselected bit line are precharged lower than a channel of a memory string connected to the selected string select line and the unselected bit line.

In example embodiments, the decoder is configured to apply a program voltage to an unselected word line and a selected word line connected to the plurality of memory cells in the memory string to program the selected memory cell.

In example embodiments, if the fourth positive voltage is equal to the third positive voltage, the decoder applies the program voltage to the a unselected word line and the selected word line after the corresponding string selection transistors connected to the non-selected string select lines are turned off.

In example embodiments, the writing circuit includes at least one page buffer for writing data to one of the plurality of memory strings via one of the bit lines, the at least one page buffer including a first latch configured to store first writing data to be written and a bias circuit, configured to set up the bit line to a positive voltage when the first writing data stored in the latch is program data.

In example embodiments, the bias circuit includes first and second transistors, wherein a gate node of the first transistor is connected to the latch, a first node of the first transistor receives a reference voltage, a second node of the first transistor is connected to a first node of the second transistor, a second node of the second transistor is connected to the corresponding bit line, wherein the second transistor electrically connects the second node of the first transistor and the bit line in response to a program operation signal.

In example embodiments, the bias circuit includes first, second, and third transistors, wherein a gate node of the first transistor is connected to the latch, a first node of the first transistor receives a reference voltage, a second node of the first transistor is connected to a gate node of the second transistor, a first node of the second transistor is connected to power source voltage, a second node of the second transistor is connected to a first node of the third transistor, wherein the third transistor electrically connects the second node of the second transistor and the bit line in response to a program operation signal.

In example embodiments, memory devices further comprise a second latch, configured to store second writing data, a data transfer circuit, configured to transfer the second writing data from the second latch to the first latch upon completion of writing the first writing data to the memory device.

In example embodiments, memory devices further comprise a second latch, configured to store second writing data, a data transfer circuit, configured to transfer the second writing data from the second latch to the first latch upon completion of writing the first writing data to the memory device.

Example embodiments of inventive concepts provide memory devices comprising a plurality of memory strings perpendicular to a substrate, in a two-dimensional array, each including at least one string selection transistor, the plurality of memory strings arranged in rows and columns, wherein columns of the plurality of memory strings are each connected to a corresponding bit line by the corresponding at least one string selection transistor and rows of the plurality of memory strings are each connected to a corresponding string select line by the corresponding at least one string selection transistor and a decoder connected to the string select lines, wherein in a program operation to program a selected memory cell of a selected memory string connected to a selected bit line, the decoder applies a first positive voltage to the non-selected string select lines.

In example embodiments, the decoder is configured to apply a second positive voltage to the selected string select line.

In example embodiments, the second positive voltage is equal to a power source voltage.

In example embodiments, the first positive voltage is smaller than the second positive voltage.

In example embodiments, the decoder is configured to apply a program operation voltage to an unselected word line and a selected word line connected to the plurality of memory cells in the memory string to program the selected memory cell.

In example embodiments, the first positive voltage is larger than a ground voltage and a channel of memory string connected to the unselected string select lines are precharged lower than a channel of a memory string connected to the selected string select line.

In example embodiments, if the first positive voltage is equal to the second positive voltage, the decoder applies the program operation voltage to the a unselected word line and the selected word line after the corresponding string selection transistors connected to the non-selected string select lines are turned off.

BRIEF DESCRIPTION OF THE DRAWINGS

The accompanying drawings are included to provide a further understanding of inventive concepts, and are incorporated in and constitute a part of this specification. The drawings illustrate example embodiments of inventive concepts and, together with the description, serve to explain principles of the inventive concepts. In the drawings:

FIGS. 7 and 8 are tables showing a program voltage condition of the memory block of FIG. 6, according to example embodiments of inventive concepts;

FIGS. 11 and 12 are example tables showing program voltage conditions based on the voltage shift of FIG. 10;

FIGS. 15 and 16 are example tables showing program voltage conditions based on the voltage shift of FIG. 14;

FIGS. 18 and 19 are example tables showing program voltage conditions based on the voltage shift of FIG. 17;

DETAILED DESCRIPTION OF EXAMPLE EMBODIMENTS

Figure 1:
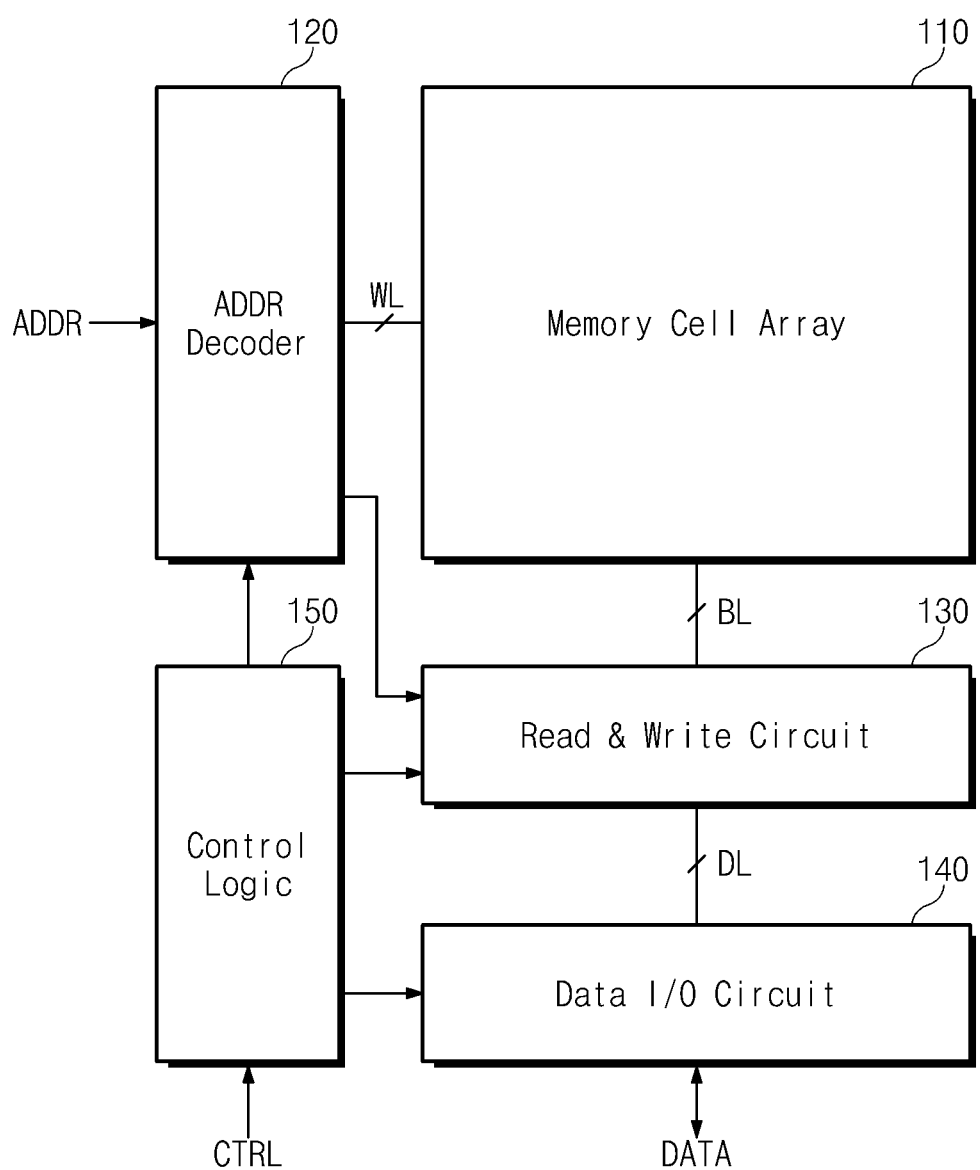
FIG. 1 is a block diagram illustrating a nonvolatile memory device according to example embodiments of inventive concepts.

Exemplary embodiments of inventive concepts will be described below in more detail with reference to the accompanying drawings. The inventive concepts may, however, be embodied in different forms and should not be construed as limited to example embodiments set forth herein. Rather, these example embodiments are provided so that this disclosure will be thorough and complete, and will fully convey the scope of the inventive concept to those skilled in the art. Like reference numerals refer to like elements throughout. Similar reference numerals refer to similar elements throughout.

FIG. 1 is a block diagram illustrating a nonvolatile memory device 100 according to example embodiments of inventive concepts.

Referring to FIG. 1, a nonvolatile memory device 100 according to example embodiments of inventive concepts includes a memory cell array 110, an address decoder 120, a reading and writing circuit 130, a data input/output (I/O) circuit 140, and a control logic 150.

The memory cell array 110 is connected to the address decoder 120 through word lines WL, and is connected to the reading and writing circuit 140 through bit lines BL. The memory cell array 110 includes a plurality of memory cells. For example, the memory cell array 110 includes a plurality of memory cells which are stacked in a direction vertical to a substrate of the memory device. For instance, the memory cell array 110 is configured with a plurality of memory cells each of which may store one or more bits in each cell.

The address decoder 120 is connected to the memory cell array 110 through the word lines WL. The address decoder 120 operates according to the control of the control logic 150. The address decoder 120 receives an address ADDR from the outside.

The address decoder 120 decodes the row address of the received address ADDR to select at least one word line of the word lines WL. Also, the address decoder 120 decodes the column address of the received address ADDR and transfers the decoded column address to the reading and writing circuit 130. For example, the address decoder 120 includes elements such as a row decoder, a column decoder and an address buffer.

The reading and writing circuit 130 is connected to the memory cell array 110 through the bit lines BL, and is connected to the data input/output circuit 140 through data lines DL. The reading and writing circuit 130 receives the decoded column address from the address decoder 120. The reading and writing circuit 130 selects the bit lines BL in response to the decoded column address under control of the control logic 150.

For example, the reading and writing circuit 130 receives data from the data input/output circuit 140, and writes the received data into the memory cell array 110 through the bit lines. The reading and writing circuit 130 reads data from the memory cell array 110 and outputs the read data to the data input/output circuit 140. The reading and writing circuit 130 reads data from a first storage region of the memory cell array 110 and writes the read data into a second storage region of the memory cell array 110. For example, the reading and writing circuit 130 performs a copy-back operation.

For example, the reading and writing circuit 130 includes elements such as a page buffer (or page register) and a column selection circuit. As another example, the reading and writing circuit 130 includes elements such as a sensing amplifier, a writing driver and a column selection circuit.

The data input/output circuit 140 is connected to the reading and writing circuit 130 through the data lines DL. The data input/output circuit 140 operates according to the control of the control logic 150. The data input/output circuit 140 exchanges data DATA with an external device. The data input/output circuit 140 transfers the data DATA received from an external device to the reading and writing circuit 130 through the data lines DL. The data input/output circuit 140 transfers data DATA, which is transferred through the data lines DL from the reading and writing circuit 130, to an external device. For example, the data input/output circuit 140 includes elements such as a data buffer.

The control logic 150 is connected to the address decoder 120, the reading and writing circuit 130 and the data input/output circuit 140. The control logic 150 controls the overall operation of the nonvolatile memory device 100 (for example, a flash memory device). The control logic 150 operates in response to a control signal CTRL from an external device.

Figure 2:
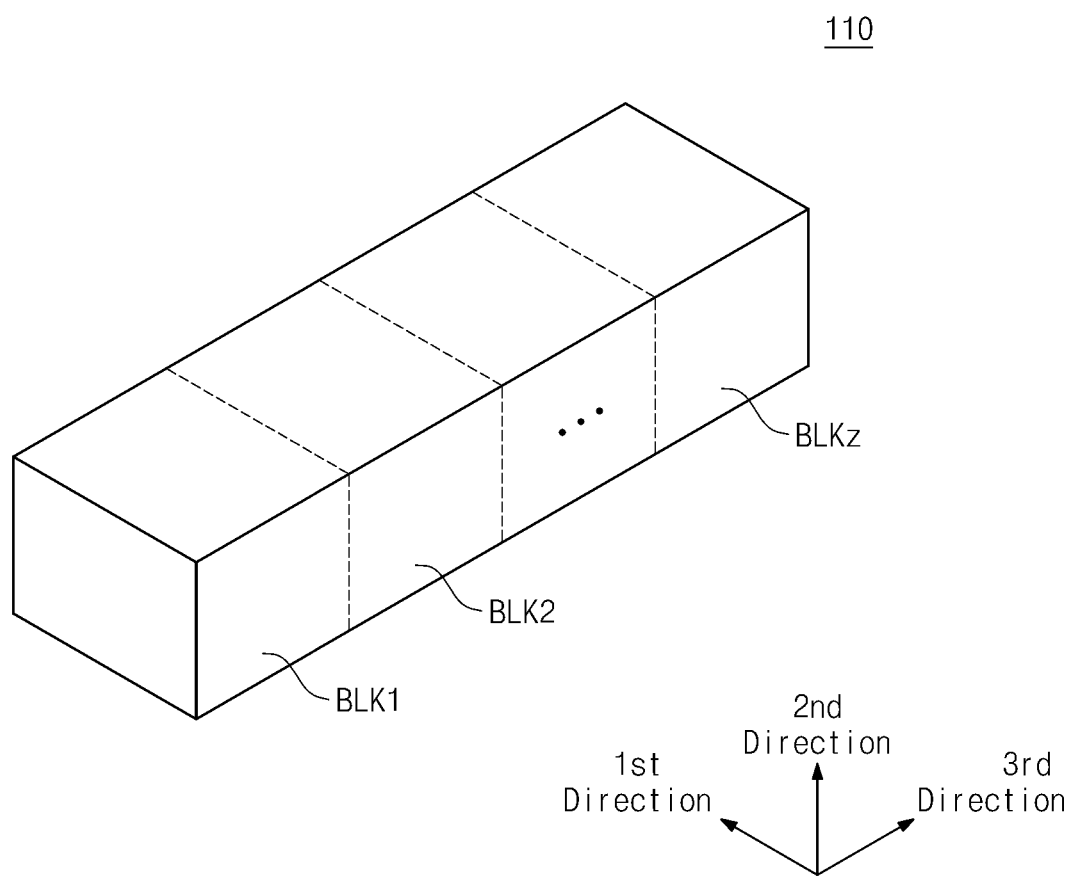
FIG. 2 is a block diagram illustrating the memory cell array 110 of FIG. 1.

FIG. 2 is a block diagram illustrating the memory cell array 110 of FIG. 1.

Referring to FIG. 2, the memory cell array 110 includes a plurality of memory blocks BLK1 to BLKh. Each memory block BLK has a three-dimensional (3D) structure (or vertical structure). Each memory block BLK includes structures that are extended in first to third directions. For example, the each memory block BLK includes a plurality of NAND strings NS that are extended in the second direction. For example, the plurality of NAND strings NS are provided in the first to third directions.

Each NAND string NS is connected to a bit line BL, a string selection line SSL, a ground selection line GSL, word lines WL, and a common source line CSL. That is, the each memory block is connected to a plurality of bit lines BL, a plurality of string selection lines SSL, a plurality of ground selection lines GSL, a plurality of word lines WL, and a common source line CSL. The memory blocks BLK1 to BLKh will be described below in more detail with reference to FIG. 3.

Figure 3:
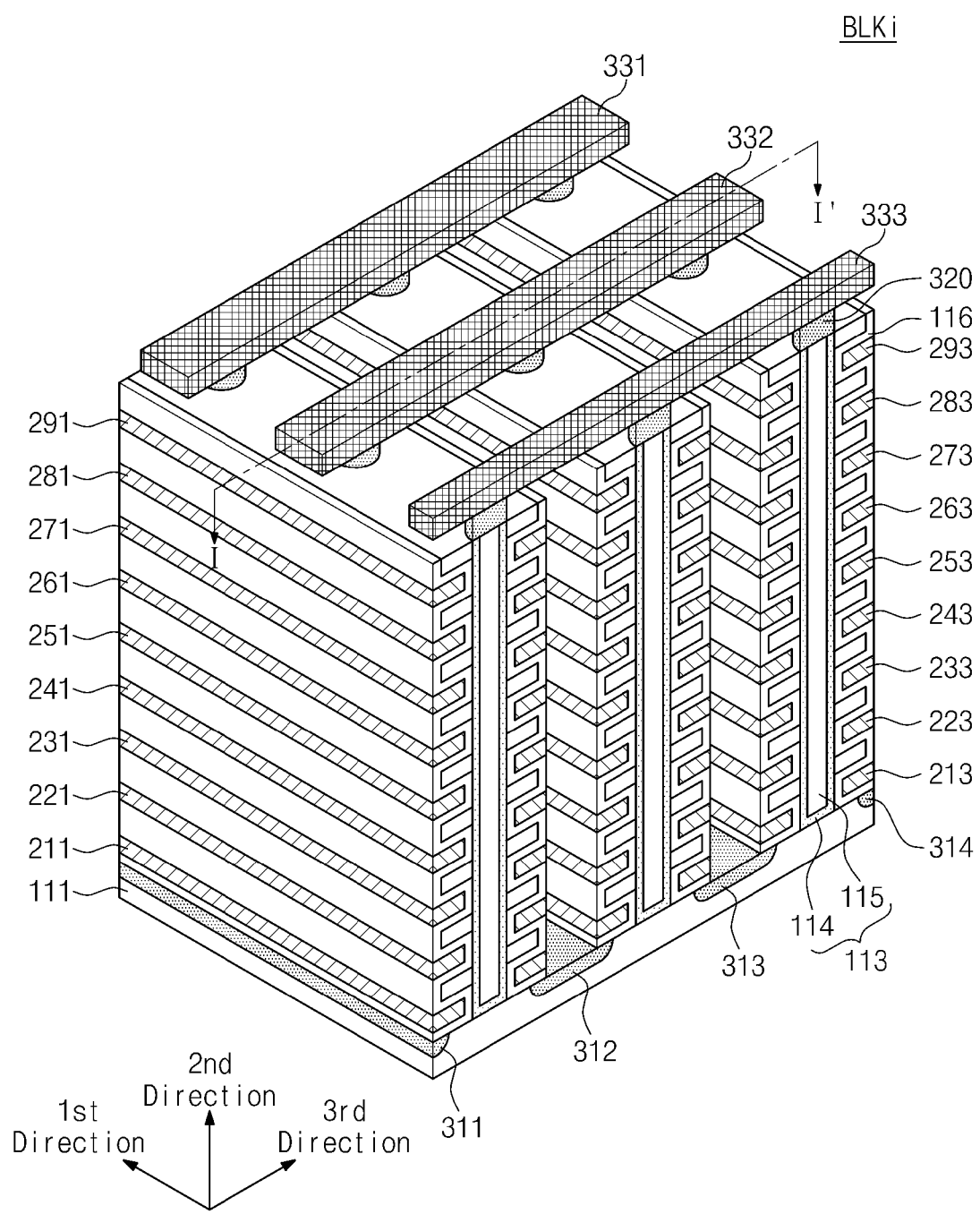
FIG. 3 is a perspective view illustrating any one of the memory blocks of FIG. 2, according to example embodiments of inventive concepts.
Figure 4:
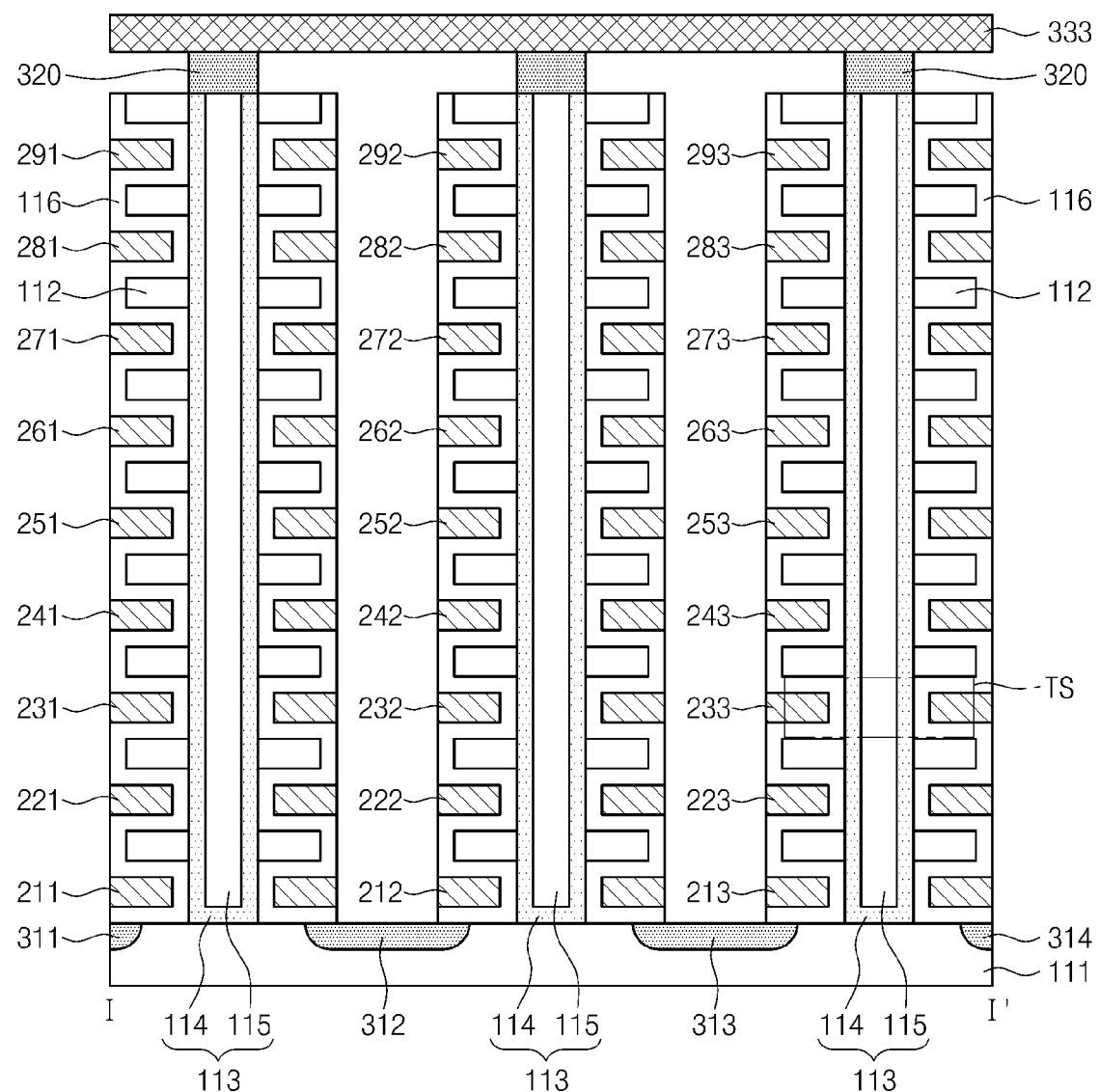
FIG. 4 is a cross-sectional view taken along line I-I' of FIG. 3.

FIG. 3 is a perspective view illustrating a memory block BLKi of the memory blocks BLK1 to BLKh in FIG. 2, according to example embodiments of inventive concepts. FIG. 4 is a cross-sectional view taken along line I-I' of FIG. 3.

Referring to FIGS. 3 and 4, a memory block BLKi includes structures that are extended in first to third directions.

First, a substrate 111 is provided. Exemplarily, the substrate 111 may be a well having a first type. For example, the substrate 111 may be a p well that is formed by implanting a group-III element such as boron (B). As an example, the substrate 111 may be a pocket p well that is provided in an n well. Hereinafter, it is assumed that the substrate 111 is p-type well (or p-type pocket well). However, the type of the substrate 111 is not limited thereto.

A plurality of doping regions 311 to 314 that are extended in the first direction are provided on the substrate 111. For example, a plurality of doping regions 311 to 314 have second-type different from that of the substrate 111. For example, the doping regions 311 to 314 may have n-type. Hereinafter, it is assumed that the first to fourth doping regions 311 to 314 have n-type. However, the conductive type of the first to fourth doping regions 311 to 314 is not limited thereto.

In a region on the substrate 111 between the first and second doping regions 311 and 312, a plurality of insulating materials 112 extended in the first direction are sequentially provided in the second direction. For example, the plurality of insulating materials 112 is separated by a predetermined distance in the second direction and provided. For example, the insulating materials 112 may be separated by a predetermined distance in the second direction and provided. Exemplarily, the insulating materials 112 may include an insulating material such as silicon oxide.

In the region on the substrate 111 between the first and second doping regions 311 and 312, provided are a plurality of pillars 113 that are sequentially disposed in the first direction and passes through the insulating materials 112 in the second direction. Exemplarily, each of the pillars 113 is contacted with the substrate 111 through the insulating materials 112.

Exemplarily, the each pillar 113 may be formed of a plurality of materials. For example, the surface layer 114 of the each pillar 113 may include a silicon material having a first type. For example, the surface layer 114 of the each pillar 113 may include a silicon material having the same type of that of the substrate 111. Hereinafter, it is assumed that the surface layer 114 of the each pillar 113 includes p-type silicon. However, the surface layer 114 of the each pillar 113 is not limited thereto.

The inner layer 115 of the each pillar 113 is formed of an insulating material. For example, the inner layer 115 of the each pillar 113 may include an insulating material such as silicon oxide. As an example, the inner layer 115 of the each pillar 113 may include an air gap.

In a region between the first and second doping regions 311 and 312, an insulation layer 116 is provided along the exposed surface of the substrate 111, the insulating materials 112 and the pillars 113. For example, the insulating layer 116 may be removed which is provided to the exposed surface of the second direction of the last insulating material 112 provided in the second direction.

For example, the thickness of the insulation layer 116 may be less than one-half of a distance between the insulating materials 112. That is, a region, where any material other than the insulating materials 112 and the insulation layer 116 may be disposed, are provided between an insulation layer 116, provided to the lower surface of a first insulating material among the insulating materials 112, and an insulation layer 116, provided to the upper surface of a second insulating material in the lower portion of the first insulating material.

In the region between the first and second doping regions 311 and 312, conductive materials 211 to 291 are provided onto the exposed surface of the insulation layer 116. For example, the conductive material 211 extended in the first direction is provided between the insulating material 112 adjacent to the substrate 111 and the substrate 111. More specifically, the conductive material 211 extended in the first direction is provided between the insulation layer 116 of the lower surface of the insulating material 112 adjacent to the substrate 111 and the substrate 111.

A first conductive material extended in the first direction is provided between the insulation layer 116 of the upper surface of a specific insulating material among the insulating materials 112 and the insulation layer 116 of the lower surface of an insulating material that is disposed at the lower portion of the specific insulating material. Exemplarily, the first conductive materials 221 to 281 extended in the first direction are provided between the insulating materials 112. Exemplarily, the first conductive materials 211 to 291 may be metal materials. Exemplarily, the first conductive materials 211 to 291 may be conductive materials such as polysilicon.

The same structure as a structure on the first and second doping regions 311 and 312 is provided between the second and third doping regions 312 and 313. Between the second and third doping regions 312 and 313, exemplarily, provided are the insulating materials 112 extended in the first direction, the pillars 113 that are sequentially disposed in the first direction and passes through the insulating materials 112 in the third direction, the insulation layer 116 that is provided to the insulating materials 112 and the exposed surface of the pillars 113, and the first conductive materials 212 to 292 extended in the first direction.

The same structure as a structure on the first and second doping regions 311 and 312 is provided between the third and fourth doping regions 313 and 314. Between the third and fourth doping regions 313 and 314, exemplarily, provided are the insulating materials 112 extended in the first direction, the pillars 113 that are sequentially disposed in the first direction and passes through the insulating materials 112 in the third direction, the insulation layer 116 that is provided to the insulating materials 112 and the exposed surface of the pillars 113, and the first conductive materials 213 to 293 extended in the first direction.

Hereinafter, the heights of first conductive materials 211 to 291, 212 to 292 and 213 to 293 are defined. The first conductive materials 211 to 291, 212 to 292 and 213 to 293 are defined to have first to ninth heights sequentially from the substrate 111. That is, the first conductive materials 211 to 213 adjacent to the substrate 111 have the first height. The first conductive materials 291 to 293 adjacent to the second conductive materials 331 to 333 have the ninth height. As a distance between the first conductive material and the substrate 111 increases, the height of the first conductive material increases.

Drains 320 are provided onto the pillars 113, respectively. Exemplarily, the drains 320 may be silicon materials that are doped in a second type. For example, the drains 320 may be silicon materials that are doped in an n-type. Hereinafter, it is assumed that the drains 320 include n-type silicon. However, the drains 320 are not limited thereto. Exemplarily, the width of each of the drains 320 may be greater than that of a corresponding pillar 113. For example, the each drain 320 may be provided in a pat shape to the upper surface of a corresponding pillar 113.

Second conductive materials 331 to 333 extended in the third direction are provided onto the drains 320. The second conductive materials 331 to 333 are sequentially disposed in the first direction. The second conductive materials 331 to 333 are connected to the drains 320 of a corresponding region, respectively. Exemplarily, the drains 320 and the conductive material extended in the third direction may be connected through a contact plug. Exemplarily, the second conductive materials 331 to 333 may be metal materials. Exemplarily, the second conductive materials 331 to 333 may be conductive materials such as polysilicon.

In FIGS. 3 and 4, the each pillar 113 forms a string together with a region adjacent to the insulation layer 116 and an adjacent region among conductive lines 211 to 291, 212 to 292 and 213 to 293. For example, the each pillar 113 forms a NAND string NS together with a region adjacent to the insulation layer 116 and an adjacent region among conductive lines 211 to 291, 212 to 292 and 213 to 293. The NAND string NS includes a plurality of transistor structures TS. The transistor structure TS will be described below in more detail with reference to FIG. 5.

Figure 5:
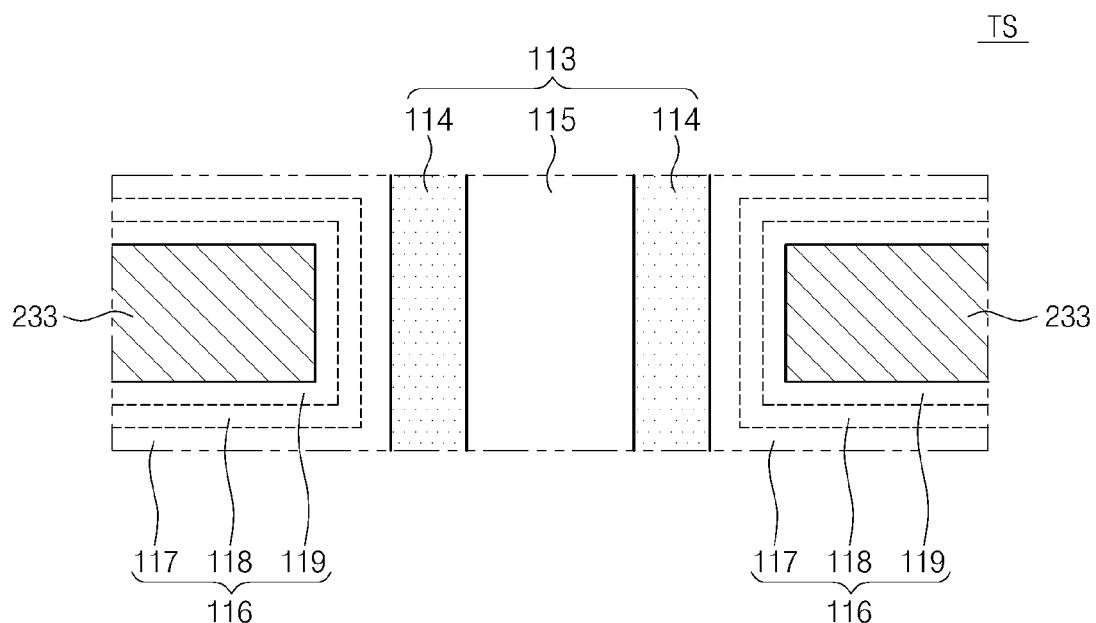
FIG. 5 is a cross-sectional view illustrating a transistor structure of FIG. 4.

FIG. 5 is a cross-sectional view illustrating the transistor structure TS of FIG. 4.

Referring to FIGS. 3 to 5, the insulation layer 116 includes first to third sub-insulation layers 117 to 119. A surface layer including the p-type silicon of the pillar 113 serves as a body. The first sub-insulation layer 117 adjacent to the pillar 113 serves as a tunneling insulation layer. For example, the first sub-insulation layer 117 adjacent to the pillar 113 may include a thermal oxide layer.

The second sub-insulation layer 118 serves as a charge storage layer. For example, the second sub-insulation layer 118 serves as a charge trapping layer. For example, the second sub-insulation layer 118 may include a nitride layer or metal oxide layer (for example, an aluminum oxide layer or a hafnium oxide layer).

The third sub-insulation layer 119 adjacent to the first conductive material 233 serves as a blocking insulation layer. Exemplarily, the third sub-insulation layer 119 adjacent to the conductive material 233 extended in the first direction may be formed as a single layer or a multi-layer. The third sub-insulation layer 119 may be a high dielectric layer (for example, an aluminum oxide layer or a hafnium oxide layer) having a higher dielectric constant than the first and second sub-insulation layers 117 and 118.

The first conductive material 233 serves as a gate (or a control gate). That is, the first conductive material 233 serving as the gate (or the control gate), the third sub-insulating layer 119 serving as a blocking insulation layer, the second sub-insulation layer 118 serving as a charge storage layer and the first sub-insulation layer 117 serving as a tunneling insulation layer and the surface layer 114 which includes the p-type silicon and serves as a body forms a transistor (or a memory cell transistor structure). Exemplarily, the first to third sub-insulation layers 117 to 119 may form oxide-nitride-oxide (ONO). Hereinafter, the surface layer 114 including the p-type silicon of the pillar 113 is referred to as a second-direction body.

The memory block BLKi includes the plurality of pillars 113. That is, the memory block BLKi includes a plurality of NAND strings NS. In more detail, the memory block BLKi includes a plurality of NAND strings NS that are extended in the second direction (or the direction vertical to the substrate). The each NAND string NS includes a plurality of transistor structures TS that are disposed in the second direction. At least one of the transistor structures TS of the each NAND string NS serves as a string selection transistor SST. At least one of the transistor structures TS of the each NAND string NS serves as a ground selection transistor GST.

Gates (or control gates) correspond to the first conductive materials 211 to 291, 212 to 292 and 213 to 293 that are extended in the first direction. That is, the gates (or the control gates) are extended in the first direction and forms word lines and at least two selection lines (for example, at least one string selection line SSL and at least one ground selection line GSL). The second conductive materials 331 to 333 extended in the third direction are connected to the one end of the each NAND string NS. Exemplarily, the second conductive materials 331 to 333 extended in the third direction serve as bit lines BL. That is, in one memory block BLKi, a plurality of NAND strings are connected to one bit line BL.

Second type doping regions 311 to 314 extended in the first direction are provided to the other end of the each NAND string. The second type doping regions 311 to 314 extended in the first direction serve as the common source line CSL.

To sum up the above-described, the memory block BLKi includes a plurality of NAND strings that are extended in the direction (i.e., the second direction) vertical to the substrate 111, and servers as a NAND flash memory block (for example, a charge trapping type) where the plurality of NAND strings NS are connected to one bit line BL.

In FIGS. 3 to 5, it has been described above that the first conductive lines 211 to 291, 212 to 292 and 213 to 293 are provided to nine layers. However, the first conductive lines 211 to 291, 212 to 292 and 213 to 293 are not limited thereto. For example, the first conductive lines may be provided to at least eight layers forming memory cells and at least two layers forming selection transistors. The first conductive lines may be provided to at least sixteen layers forming memory cells and at least two layers forming selection transistors. Also, the first conductive lines may be provided to a plurality of layers forming memory cells and at least two layers forming selection transistors. For example, the first conductive lines may be provided to a layer forming dummy memory cells.

In FIGS. 3 to 5, it has been described above that three NAND strings NS are connected to one bit line BL, but an embodiment of the inventive concept is not limited thereto. Exemplarily, in the memory block BLKi, an m number of NAND strings NS may be connected to one bit line BL. In this case, the number of conductive materials 211 to 291, 212 to 292 and 213 to 293 extended in the first direction and the number of doping regions 311 to 314 serving as the common source line CSL may also be controlled in proportion to the number of NAND strings NS connected to one bit line BL.

In FIGS. 3 to 5, it has been described above that three NAND strings NS are connected to one first conductive material extended in the first direction, but an embodiment of the inventive concept is not limited thereto. For example, an n number of NAND strings NS may be connected to one first conductive material. In this case, the number of bit lines 331 to 333 may be controlled in proportion to the number of NAND strings NS that are connected to one first conductive material.

For example, the closer to the substrate 111, a cross-sectional area base on the first and third directions of the pillar 113 may decrease. For example, the cross-sectional area base on the first and third directions of the pillar 113 may be varied by the characteristic or error of a process.

Exemplarily, the pillar 113 is formed by providing materials such as a silicon material and an insulating material to a hole that is formed by etching. As an etched depth increases, a cross-sectional area based on the first and third directions of a hole formed by etching may decrease. That is, the closer to the substrate 111, the cross-sectional area based on the first and third directions of the pillar 113 may decrease.

Figure 6:
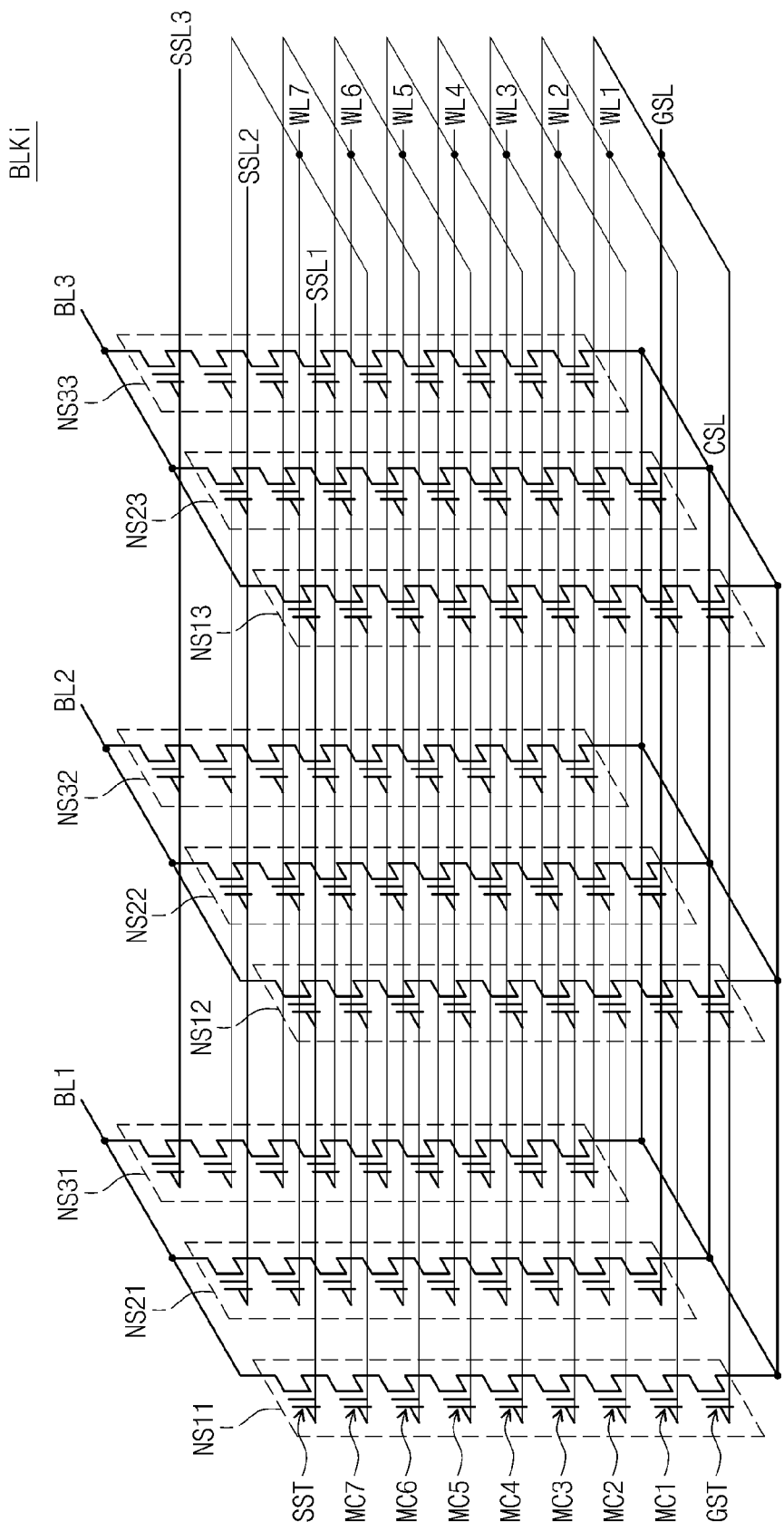
FIG. 6 is an example circuit diagram illustrating an equivalent circuit of a memory block which will be described below with reference to FIGS. 3 to 5.

FIG. 6 is a circuit diagram illustrating an equivalent circuit of the memory block BLKi which has been described above with reference to FIGS. 3 to 5.

Referring to FIGS. 3 to 5, NAND strings NS11 to NS31 are provided between a first bit line BL1 and a common source line CSL. NAND strings NS11, NS22 and NS32 are provided between a second bit line BL2 and the common source line CSL. NAND strings NS13, NS23 and NS33 are provided between a third bit line BL3 and the common source line CSL. The first to third bit lines BL1 to BL3 corresponds to the second conductive materials 331 to 333 that are extended in the third direction.

The string selection transistor SST of the each NAND string NS is connected to a corresponding bit line BL. The ground selection transistor GST of the each NAND string NS is connected to the common source line CSL. Memory cells MC are provided between the string selection transistor SST and common source line CSL of the each NAND string NS.

Hereinafter, NAND strings NS are defined in a basis of rows and columns. The NAND strings NS, which are connected to one bit line in common, form one column. For example, the NAND strings NS11 to NS31 connected to the first bit line BL1 may correspond to a first column. The NAND strings NS12 to NS32 connected to the second bit line BL2 may correspond to a second column. The NAND strings NS13 to NS33 connected to the third bit line BL3 may correspond to a third column. The NAND strings connected to one string selection line SSL form one row. For example, the NAND strings NS11 to NS13 connected to a first string selection line SSL1 may form a first row. The NAND strings NS21 to NS23 connected to a second string selection line SSL2 may form a second row. The NAND strings NS31 to NS33 connected to a third string selection line SSL3 may form a third row.

In the each NAND string NS, a height is defined. Exemplarily, in the each NAND string NS, the height of the ground selection transistor GST is defined as 1. The height of a memory cell MC1 adjacent to the ground selection transistor GST is defined as 2. The height of the string selection transistor SST is defined as 9. The height of a memory cell MC7 adjacent to the string selection transistor SST is defined as 8. As a distance between the memory cell MC and the ground selection transistor GST increases, the height of the memory cell MC increases. That is, the first to seventh memory cells MC1 to MC7 are defined as having second to eighth heights, respectively.

The NAND strings NS of the same row share the ground selection line GSL. The NAND strings NS of different rows share the ground selection line GSL. The first conductive lines 211 to 213 having a first height are connected and thereby forms the ground selection line GSL.

The memory cells MC having the same height in the NAND strings NS of the same row shares a word line WL. The word lines WL of NAND strings NS that have the same height and correspond to different rows are connected in common. That is, memory cells having the same height share the word line WL.

The first conductive lines 221 to 223 having a second height are connected in common and thereby form a first word line WL1. The first conductive lines 231 to 233 having a third height are connected in common and thereby form a second word line WL2. The first conductive lines 241 to 243 having a fourth height are connected in common and thereby form a third word line WL3. The first conductive lines 251 to 253 having a fifth height are connected in common and thereby form a fourth word line WL4. The first conductive lines 261 to 263 having a sixth height are connected in common and thereby form a fifth word line WL5. The first conductive lines 271 to 273 having a seventh height are connected in common and thereby form a sixth word line WL6. The first conductive lines 281 to 283 having an eighth height are connected in common and thereby form a seventh word line WL7.

The NAND strings NS of the same row share the sting selection line SSL. The NAND strings NS of different rows are connected to string selection lines SSL1 to SSL3, respectively. The first to third string selection lines SSL1 to SSL3 correspond to the first conductive lines 291 to 293 having a ninth height, respectively.

Hereinafter, first string selection transistors SST1 are defined as string selection transistors SST connected to the first string selection line SSL1. Second string selection transistors SST2 are defined as string selection transistors SST connected to the second string selection line SSL2. Third string selection transistors SST3 are defined as string selection transistors SST connected to the third string selection line SSL3.

The common source line CSL is connected to the NAND strings NS in common. For example, in an active region on the substrate 111, the first to fourth doping regions 311 to 314 may be connected and thereby form the common source line CSL.

As illustrated in FIG. 6, the word lines WL having the same depth are connected in common. Accordingly, when a specific word line WL is selected, all NANS strings NS connected to the specific word line WL are selected. The NAND strings NS of different rows are connected to different string selection lines SSL. Therefore, by selecting and unselecting the string selection lines SSL1 to SSL3, the NAND strings NS of an unselected row among NAND strings NS connected to the same word line WL may be separated from a corresponding bit line, and the NAND strings of an unselected row may be connected a corresponding bit line.

That is, by selecting and unselecting the string selection lines SSL1 to SSL3, the row of the NAND strings NS may be selected. Furthermore, by selecting the bit lines BL1 to BL3, the NAND strings NS of a selected row may be selected in column units.

Exemplarily, one of the string selection lines SSL1 and SSL2 may be selected in a programming and reading operation. That is, the programming and reading operation is performed in the row units of the NAND strings NS11 to NS13, NS21 to NS23 and NS31 to NS33.

Exemplarily, in a programming and reading operation, a selection voltage may be applied to the selected word line of a selected row and a non-selection voltage may be applied to unselected word lines. For example, a selection voltage may be a program voltage pgm or a read voltage Vr. As an example, a non-selection voltage may be a pass voltage Vpass or a non-selection read voltage Vread. That is, the programming and reading operation may be performed in word line units of the selected row of the NAND strings NS11 to NS13, NS21 to NS23 and NS31 to NS33.

Exemplarily, a first voltage may be applied to a bit line corresponding to a memory cell to be programmed. Furthermore, a second voltage may be applied to a bit line corresponding to a memory cell to be program-prohibited. Hereinafter, a bit line corresponding to a memory cell to be programmed is called a selected bit line. A bit line corresponding to a memory cell to be program-prohibited is called an unselected bit line.

Hereinafter, it is assumed that the first row of the NAND strings NS11 to NS13, NS21 to NS23 and NS31 to NS33 is selected in a programming operation. Furthermore, it is assumed that a second bit line BL2 is selected. Also, it is assumed that first and third bit lines BL1 and BL3 are not selected.

FIGS. 7 and 8 are example tables showing a program voltage condition of the memory block of FIG. 6, according to example embodiments of inventive concepts. Exemplarily, the voltage conditions of the NAND strings NS11 to NS13 of the first row are listed in FIG. 7. The voltage conditions of the NAND strings NS21 to NS23 of the second row are listed in FIG. 8. For example, the voltage conditions of the NAND strings NS31 to NS33 of the third row are the same as the voltage conditions of the NAND strings NS21 to NS23 of the second row. Therefore, the voltage conditions of the NAND strings NS31 to NS33 of the third row will be omitted.

Referring to FIGS. 6 and 7, a ground voltage Vss is applied to a selected bit line BL2, and a power source voltage Vcc is applied to unselected bit lines BL1 and BL3. A string selection line voltage VSSL is applied to the string selection line SSL1 of a selected row. For example, the string selection line voltage VSSL may have a higher level than the threshold voltages of the string selection transistors SST of the NAND strings NS11 to NS13.

The program voltage Vpgm and the pass voltage Vpass are applied to the word lines WL1 to WL7. For example, the pass voltage Vpass is applied to a selected word line and thereafter the program voltage Vpgm is applied to the selected word line. The pass voltage Vpass is applied to an unselected word line during the program operation. As an example, the program voltage Vpgm and the pass voltage Vpass configure a program operation voltage that is applied to the word lines WL1 to WL7.

The ground voltage Vss is applied to the ground selection line GSL. Since the ground voltage Vss is applied to the ground selection line GSL, the memory cells MC1 to MC7 of the NAND strings NS11 to NS13 are electrically disconnected from the common source line CSL.

When the pass voltage Vpass is applied to the word lines WL1 to WL7, a channel is formed in the memory cells MC1 to MC7 of the NAND strings NS11 to NS13. The string selection transistors SST of the NAND strings NS11 to NS13 are turned on, and thus the channels of the memory cells MC1 to MC7 of the NAND strings NS11 to NS13 are set up according to voltages that are applied to the bit lines BL1 to BL3. For example, the ground voltage Vss may be applied to the channels of the memory cells MC1 to MC7 of the NAND string NS12. The power source voltage Vcc may be provided to the channels of the memory cells MC1 to MC7 of the NAND strings NS11 and NS13, respectively. As an example, the channel voltage of the memory cells MC1 to MC7 of the NAND strings NS11 and NS13 may be in floating state in a voltage lower by the threshold voltage Vth of the string selection transistor SST than the power source voltage Vcc.

Hereinafter, the channel of the memory cells MC1 to MC7 of the NAND string (for example, NS12) of a selected row connected to a selected bit line (for example, BL2) is referred to as a selected channel. The channels of the memory cells MC1 to MC7 of the NAND string (for example, NS11 and NS13) of a selected row connected to unselected bit lines (for example, BL1 and BL3) are referred to as first unselected channels.

Exemplarily, in the programming operation, the pass voltage Vpass may be applied to the word lines WL1 to WL7. The pass voltage Vpass may be a high voltage. When the pass voltage Vpass is applied to the word lines WL1 to WL7, the voltage of a selected channel is maintained as a ground voltage.

When the pass voltage Vpass is applied to the word lines WL1 to WL7, the voltages of the first unselected channels increase by coupling effect due to the pass voltage Vpass. For example, the voltages of the first unselected channels increase from a voltage that is transferred from the unselected bit lines BL1 and BL3. When the voltages of the first unselected channels reach a specific level (for example, a difference between the string selection line voltage VSSL and the threshold voltage of the string selection transistor SST), string selection transistors SST corresponding to the first unselected channels are turned off. That is, the first unselected channels are floated. Subsequently, the voltages of the first unselected channels more increase by coupling effect due to the pass voltage Vpass.

The pass voltage Vpass is applied to the word lines WL1 to WL7, and thereafter the program voltage Vpgm is applied to a selected word line. Exemplarily, the program voltage Vpgm may be a high voltage. The program voltage Vpgm may have a higher level than the pass voltage Vpass.

When the program voltage Vpgm is applied to a selected word line, the voltage of a selected channel maintains the ground voltage Vss. That is, the program voltage Vpgm is applied to the control gate of a selected memory cell, and the ground voltage Vss is applied to the channel of the selected memory cell. Due to the voltage difference between the program voltage Vpgm and the ground voltage Vss, Fowler-Nordheim (F-N) tunneling occurs in the selected memory cell. The selected memory cell is programmed due to the F-N tunneling.

When the program voltage Vpgm is applied to the selected word line, the voltages of the first unselected channels increase by coupling effect due to the program voltage Vpgm. For example, the voltages of the first unselected channels may reach a first boosting voltage Vboost1. A difference between the program voltage Vpgm and the first boosting voltage Vboost1 does not cause F-N tunneling. That is, in a selected row, memory cells corresponding to unselected bit lines BL1 and BL3 are program-prohibited.

Referring to FIGS. 6 to 8, the NAND strings NS21 to NS23 of an unselected row and the NAND strings NS11 to NS13 of a selected row share the bit lines BL1 to BL3, respectively. Therefore, bit line voltages provided to the NAND strings NS21 to NS23 of the unselected row are the same as bit line voltages that are provided to the NAND strings NS11 to NS13 of the selected row.

The ground voltage Vss is applied to the string selection line SSL2 of the selected row. The NAND strings NS21 to NS23 of the unselected row and the NAND strings NS11 to NS13 of the selected row share the word lines WL1 to WL7. Therefore, the voltages of the word lines WL1 to WL7 of the unselected row are the same as the voltages of the word lines WL1 to WL7 of the selected row.

The NAND strings NS21 to NS23 of the unselected row and the NAND strings NS11 to NS13 of the selected row share the ground selection line GSL. Therefore, the voltage of the ground selection line GSL of the unselected row is the same as the voltage of the ground selection line GSL of the selected row.

Since the ground voltage Vss is applied to the string selection line SSL of the unselected row, the NAND strings NS21 to NS23 of the unselected row are electrically disconnected from the bit lines BL1 to BL3. The ground voltage Vss is applied to the ground selection line GSL of the unselected row, and thus the NAND strings NS21 to NS23 of the unselected row are electrically disconnected from the common source line CSL. That is, the memory cells MC1 to MC7 of the NAND strings NS21 to NS23 of the unselected row are floated.

In the programming operation, the pass voltage Vpass is applied to the word lines WL1 to WL7. When the pass voltage Vpass is applied to the word lines WL1 to WL7, channels (hereinafter referred to as second unselected channels) are respectively formed in the NAND strings NS21 to NS23 of the unselected row. The memory cells MC1 to MC7 of NAND strings NS21 to NS23 of the unselected row have been floated, and thus the second unselected channels also are in a floated state. Accordingly, the voltages of the second unselected channels increase by coupling effect due to the pass voltage Vpass.

The pass voltage Vpass is applied, and thereafter the program voltage Vpgm is applied to a selected word line. The voltages of the second unselected channels increase by coupling effect due to the program voltage Vpgm. For example, the voltages of the second unselected channels increase to a second boosting voltage Vboost2. A difference between the program voltage Vpgm and the second boosting voltage Vboost2 does not cause F-N tunneling. Accordingly, programming is prohibited in the NAND strings NS21 to NS23 of the unselected row.

The program voltage Vpgm and the pass voltage Vpass are a high voltage. Therefore, the second boosting voltage Vboost2 that is generated by coupling effect due to the program voltage Vpgm and the pass voltage Vpass is a high voltage. In the NAND strings NS21 to NS23 of the unselected row, an electric field by the second boosting voltage Vboost2 and the bit line voltage is formed at the string selection transistor SST cause.

As the size of an electric field increases at the string selection transistor SST of each NAND string, the probability that leakage occurs to a bit line through the string selection transistor SST from the channel of the NAND string increases. When leakage occurs to a bit line through the string selection transistor SST from the channel of the NAND string, the boosted channel voltage of the NAND string decreases. When the boosted channel voltage of the NAND string decreases, the memory cells of a program-prohibited NAND string may be soft-programmed. That is, when the size of the electric field increases which is formed at the string selection transistor SST of the program-prohibited NAND string, the possibility of program disturbance increases.

Exemplarily, the power source voltage Vcc is applied to the first bit line BL1. The channel voltage of the NAND string NS21 connected to the first bit line BL1 is the second boosting voltage Vboost2. Therefore, an electric field corresponding to the difference between the second boosting voltage Vboost2 and the power source voltage Vcc is formed in the both ends of the string selection transistor SST of the NAND string NS21. Likewise, an electric field corresponding to the difference between the second boosting voltage Vboost2 and the power source voltage Vcc is formed in the both ends of the string selection transistor SST of the NAND string NS23.

The ground voltage Vss is applied to the second bit line BL2. The channel voltage of the NAND string NS22 connected to the second bit line BL2 is the second boosting voltage Vboost2. Therefore, an electric field corresponding to the difference between the second boosting voltage Vboost2 and the ground voltage Vss is formed in the both ends of the string selection transistor SST of the NAND string NS22.

Hereinafter, an electric field that is formed in the both ends of the string selection transistor SST of the each NAND string is referred to as a string electric field.

That is, the string electric field of the NAND string (for example, NS22) of an unselected row connected to a selected bit line (for example, BL2) is greater than the string electric field of the NAND string (for example, NS21 or NS23) of an unselected row connected to an unselected bit line (for example, BL1 or BL3). Therefore, the probability that program disturbance may occur in the NAND string NS22 of the unselected row connected to the selected bit line BL2 is higher than the probability that program disturbance may occur in the NAND string NS21 or NS23 of the unselected row connected to the unselected bit line BL1 or BL3.

For preventing these limitations, the nonvolatile memory device according to an embodiment of the inventive concept applies a first positive voltage to a selected bit line and applies a second positive voltage to an unselected bit line.

Figure 9:
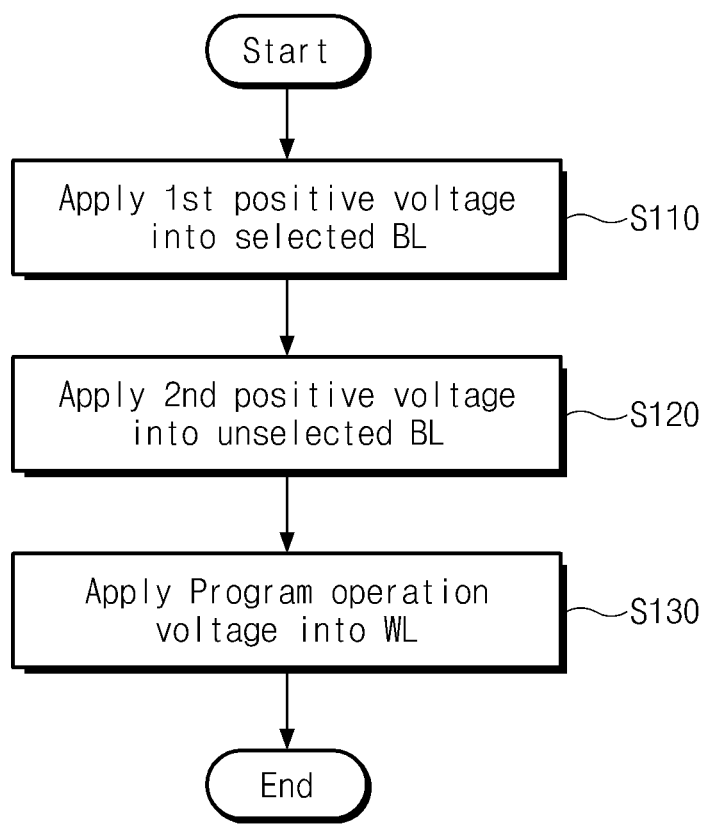
FIG. 9 is an example flowchart illustrating a programming method of the nonvolatile memory device of FIG. 1.

FIG. 9 is a flowchart illustrating a programming method of the nonvolatile memory device 100 of FIG. 1.

Referring to FIGS. 1 and 9, a first positive voltage is applied to a selected bit line in operation S110. For example, a first bit line voltage VBL1 may be applied to the selected bit line. As an example, the first bit line voltage VBL1 may have a lower level than the power source voltage Vcc. For example, the reading and writing circuit 130 may set up the first bit line voltage VBL1 into a selected bit line.

A second positive voltage is applied to an unselected bit line in operation S120. For example, a second bit line voltage VBL2 may be applied to the unselected bit line. As an example, the second bit line voltage VBL2 may be the power source voltage Vcc. For example, the reading and writing circuit 130 may set up the second bit line voltage VBL2 into selected bit lines.

A program operation voltage is applied to word lines in operation S130. For example, the program voltage Vpgm is applied to a selected word line, and the pass voltage Vpass is applied to unselected word lines. As an example, the address decoder 120 may transfer the program operation voltage to the word lines.

In the above-described embodiment of the inventive concept, it has been described above that operation S110 of applying the first positive voltage to the selected bit line differs from operation S120 of applying the second positive voltage to the unselected bit line. However, an operation of applying the first positive voltage to the selected bit line and an operation of applying the second positive voltage to the unselected bit line may be performed at the same time, or may be sequentially performed. When an operation of applying the first positive voltage to the selected bit line and an operation of applying the second positive voltage to the unselected bit line are sequentially performed, the order in which the operations are performed is not limited.

Figure 10:
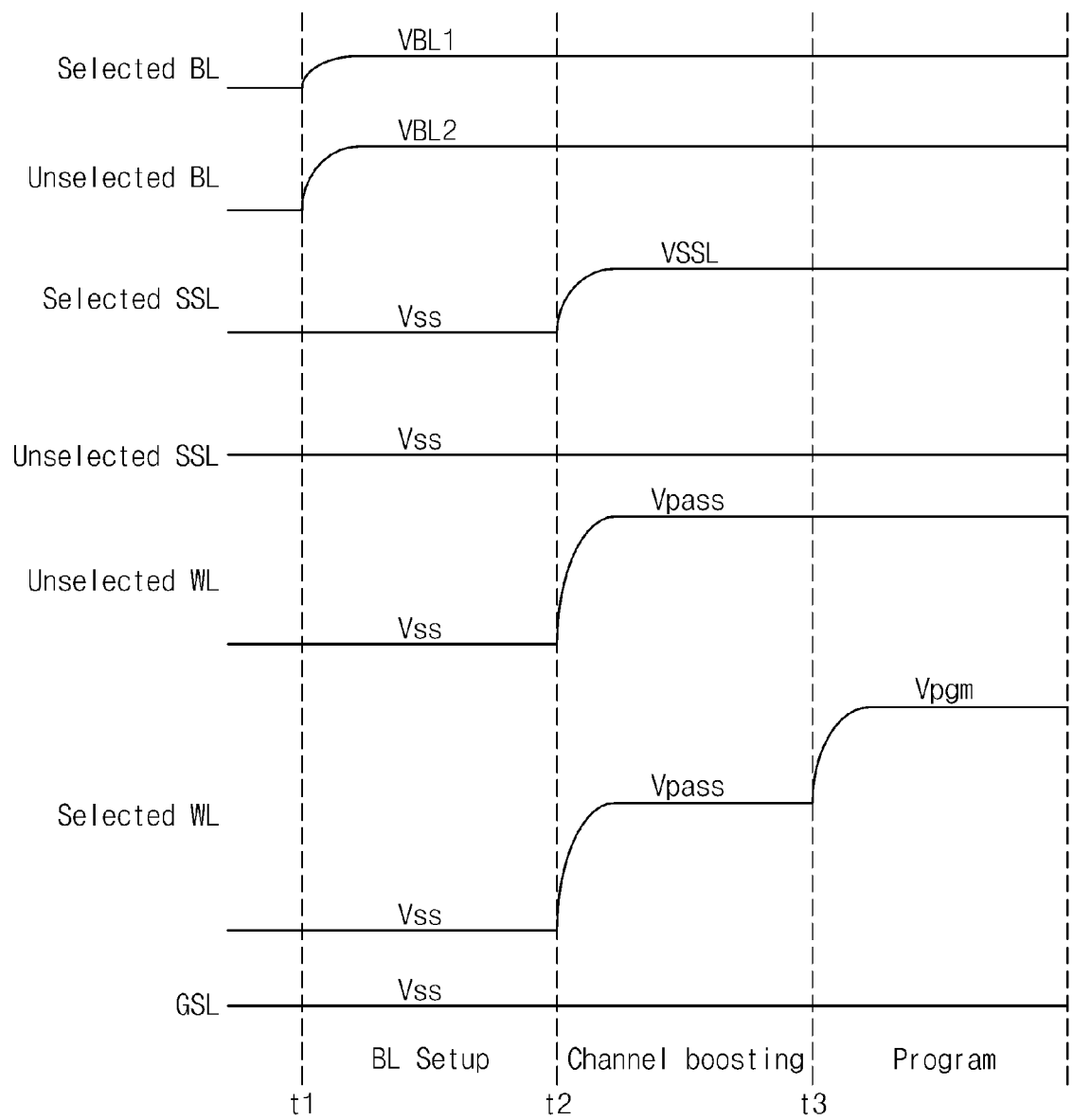
FIG. 10 is an example timing diagram showing voltage shift based on the programming method of FIG. 9.

FIG. 10 is a timing diagram showing voltage shift based on the programming method of FIG. 9.

Referring to FIGS. 9 and 10, bit line setup is performed for a first time t1 to a second time t2. For example, bit line setup may be performed like operation S110 and operation S120. As an example, the first bit line voltage VBL1 may be applied to the selected bit line of the bit lines BL, and the second bit line voltage VBL2 may be applied to the unselected bit line of the bit lines BL.

Exemplarily, the first bit line voltage VBL1 may have a lower level than the power source voltage Vcc. For example, the first bit line voltage VBL1 may have a level within a range of about 0.1 V to 0.5 V. As an example, the first bit line voltage VBL1 may be about 0.3 V. Preferably the first bit line voltage VBL1 may be greater than 0 and smaller than a difference voltage between the string selection line voltage VSSL and a threshold voltage of the string selection transistor SST. For example, the second bit line voltage VBL2 may be the power source voltage Vcc.

For the second time t2 to a third time t3, channel boosting is performed. For example, a string selection line voltage VSSL is applied to a string selection line SSL corresponding to the NAND strings of a selected row. The string selection line voltage VSSL may have a higher level than the threshold voltage of the string selection transistor SST. For example, the string selection line voltage VSSL may be the power source voltage Vcc. That is, the NAND strings of the selected row are electrically connected to the bit lines BL.

The ground voltage Vss is applied to the string selection line SSL corresponding to the NAND strings of an unselected row. That is, the NAND strings of the unselected row are electrically disconnected from the bit lines BL.

The pass voltage Vpass is applied to a selected word line and unselected word lines. That is, channels are formed in the memory cells of the NAND strings, respectively.

Programming is performed for the third time t3. For example, the program voltage Vpgm is applied to a selected word line.

In a bit line setup period, a channel boosting period and a programming period, the ground voltage Vss is applied to the ground selection line GSL. That is, NAND strings are electrically disconnected from the common source line CSL. Exemplarily, a positive voltage may be applied to the common source line CSL for preventing leakage due to a voltage difference between the boosted channel voltage of a NAND string NS and the voltage of the common source line CSL.

In FIG. 10, it has been described above that the string selection line voltage VSSL and the pass voltage Vpass are applied at the second time t2. However, the string selection line voltage VSSL and the pass voltage Vpass are not limited to be applied at the second time t2. For example, the string selection line voltage VSSL is applied to a string selection line SSL corresponding to the NAND strings of a selected row, and thereafter the pass voltage Vpass may be applied to a selected word line and unselected word lines.

FIGS. 11 and 12 are tables showing program voltage conditions based on the voltage shift of FIG. 10. Exemplarily, as described above with reference to FIG. 7, the voltage conditions of the NAND strings NS11 to NS13 of a selected row are listed in FIG. 11. Furthermore, as described above with reference to FIG. 8, the voltage conditions of the NAND strings NS21 to NS23 of an unselected row are listed in FIG. 12.

Referring to FIGS. 10 and 11, a first bit line voltage VBL1 is applied to a selected bit line BL2, and a second bit line voltage VBL2 is applied to unselected bit lines BL1 and BL3. A string selection line voltage VSSL is applied to a first string selection line SSL1. The pass voltage Vpass and the program voltage Vpgm are applied to the word lines WL. The ground voltage Vss is applied to the ground selection line GSL.

As described above with reference to FIG. 7, the channels of the NAND strings NS11 and NS13 corresponding to the unselected bit lines BL1 and BL3 are boosted to the first boosting voltage Vboost1. Therefore, the NAND strings NS11 and NS13 corresponding to the unselected bit lines BL1 and BL3 are program-prohibited.

The channel voltage of the NAND string NS12 corresponding to the selected bit line BL2 is the first bit line voltage VBL1. The first bit line voltage VBL1 has a lower level than the power source voltage Vcc. Therefore, programming is performed in the NAND string NS12 corresponding to the selected bit line BL2 by a voltage difference between the program voltage Vpgm and the first bit line voltage VBL1.

Referring to FIGS. 10 to 12, the first bit line voltage VBL1 is applied to the selected bit line BL2, and the second bit line voltage VBL2 is applied to the unselected bit lines BL1 and BL3. The ground voltage Vss is applied to the second string selection line SSL2. The pass voltage Vpass and the program voltage Vpgm are applied to the word lines WL. The ground voltage Vss is applied to the ground selection line GSL.

As described above with reference to FIG. 8, the channel voltage of the NAND strings NS21 to NS23 of the unselected row is boosted to the second boosting voltage Vboost2. The first bit line voltage VBL1 has been applied to the selected bit line BL2. Therefore, the string electric field of the NAND string NS22 of the unselected row connected to the selected bit line BL2 is formed based on a difference between the second boosting voltage Vboost2 and the first bit line voltage VBL1. Comparing the voltage conditions that have been described above with reference to FIGS. 7 and 8, the string electric field of the NAND string NS22 of the unselected row connected to the selected bit line BL2 is reduced. Accordingly, program disturbance is prevented, and the reliability of the nonvolatile memory device 100 is improved.

Figure 13:
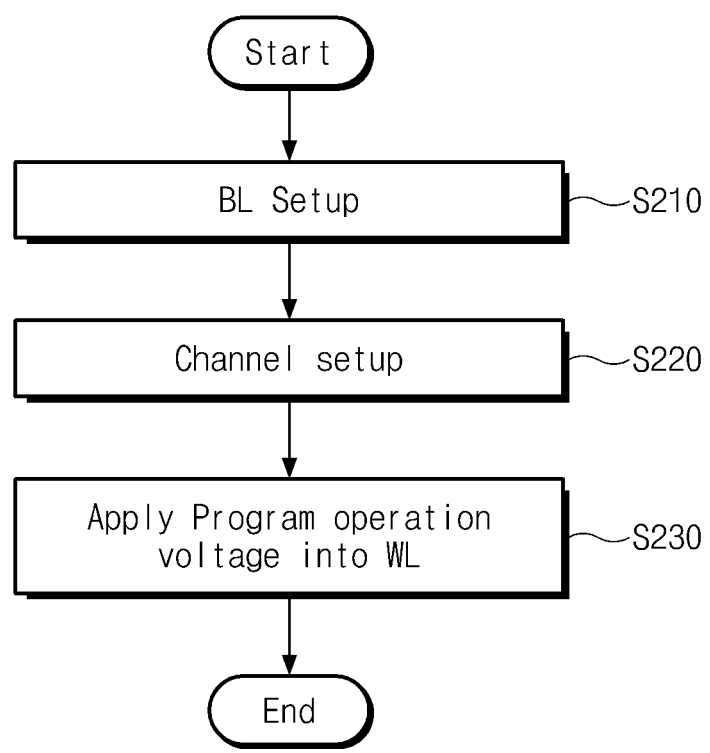
FIG. 13 is a flowchart illustrating a programming method of the nonvolatile memory device 100 of FIG. 1, according to example embodiments of inventive concepts.

FIG. 13 is a flowchart illustrating a programming method of the nonvolatile memory device 100 of FIG. 1, according to example embodiments of inventive concepts.

Referring to FIGS. 1 to 13, bit lines are set up in operation S210. For example, as described above with reference to FIGS. 9 to 12, the first positive voltage, e.g., the first bit line voltage VBL1 may be applied to selected bit lines. The second positive voltage, i.e., the second bit line voltage VBL2 may be applied to unselected bit lines. A channel is set up in operation S220. For example, the channel of a NAND string to be programmed and the channel of a NAND string to be program-prohibited may be set up to a higher positive voltage than the ground voltage Vss.

The program operation voltage is applied to word lines in operation S230. For example, the program voltage Vpgm is applied to a selected word line, and the pass voltage Vpass is applied to unselected word lines.

Figure 14:
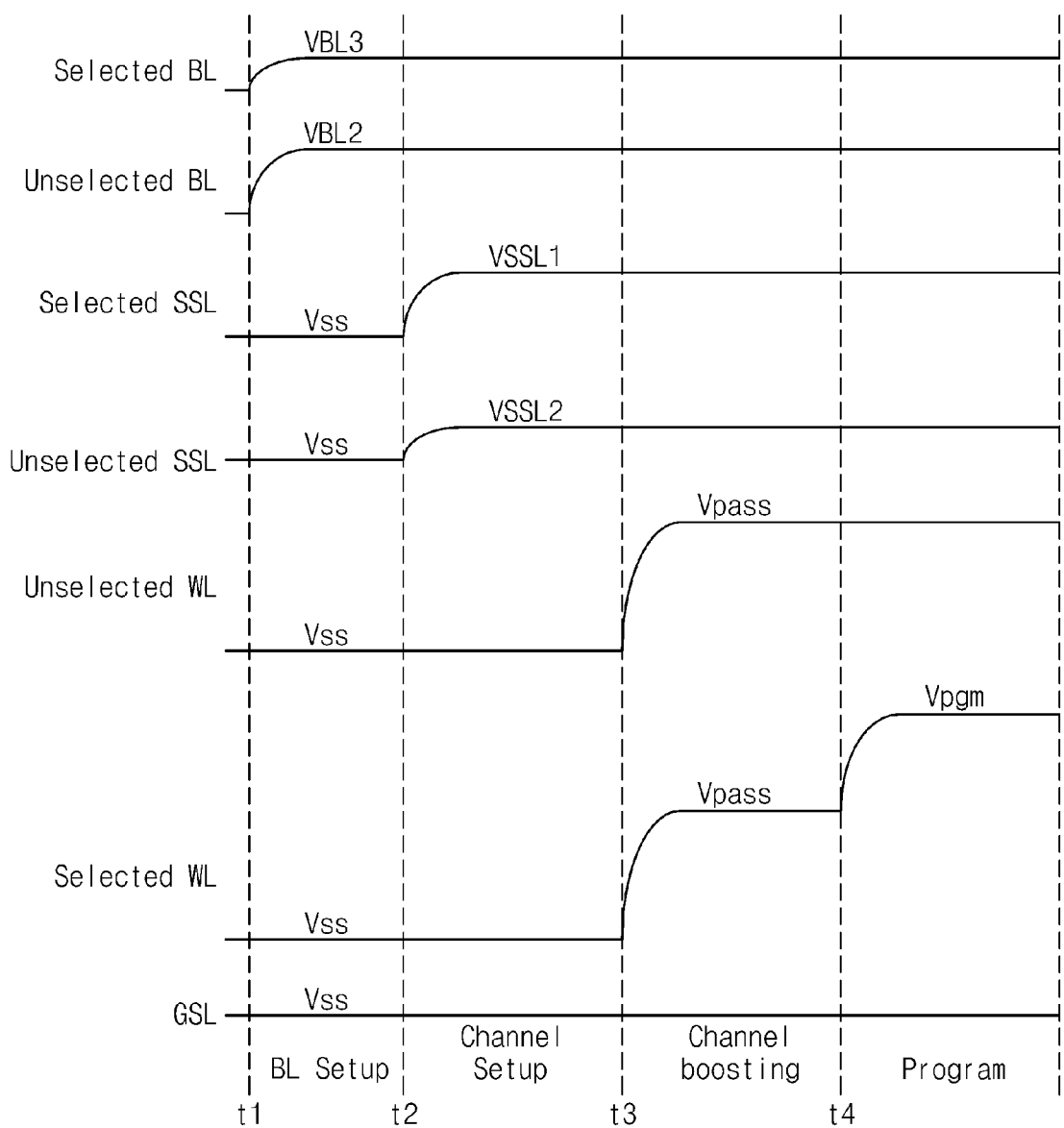
FIG. 14 is an example timing diagram showing voltage shift based on the programming method of FIG. 13.

FIG. 14 is an example timing diagram showing voltage shift based on the programming method of FIG. 13.

Referring to FIGS. 13 and 14, bit line setup is performed during a first time t1 to a second time t2. For example, bit line setup may be performed like the described in operation S210. As an example, a third bit line voltage VBL3 may be applied to the selected bit line of the bit lines BL, and the second bit line voltage VBL2 may be applied to the unselected bit line of the bit lines BL.

Exemplarily, the third bit line voltage VBL3 may have a lower level than the power source voltage Vcc. For example, the second bit line voltage VBL2 may be the power source voltage Vcc.

During the second time t2 to a third time t3, channel setup is performed. For example, a first string selection line voltage VSSL1 is applied to a selected string selection line SSL, i.e., a string selection line SSL connected to the NAND strings of a selected row. A second string selection line voltage VSSL2 is applied to an unselected string selection line SSL, i.e., a string selection line SSL connected to the NAND strings of an unselected row.

Exemplarily, the first and second string selection line voltages VSSL1 and VSSL2 are positive voltages. For example, the second string selection line voltage VSSL2 may have a lower level than the first string selection line voltage VSSL1. As an example, the first string selection line voltage VSSL1 may be the power source voltage Vcc. For example, the second string selection line voltage VSSL2 may be a voltage that turns on the string selection transistor SST.

In this case, the channel of NAND strings connected to the selected bit line among the NAND strings of the selected row is set up by the third bit line voltage VBL3 and the first string selection line voltage VSSL1. The channel of NAND strings connected to the unselected bit line among the NAND strings of the selected row is set up by the second bit line voltage VBL2 and the first string selection line voltage VSSL1. The channel of NAND strings connected to the selected bit line among the NAND strings of the unselected row is set up by the third bit line voltage VBL3 and the second string selection line voltage VSSL2. The channel of NAND strings connected to the unselected bit line among the NAND strings of the unselected row is set up by the second bit line voltage VBL2 and the second string selection line voltage VSSL2.

During the third time t3 and a fourth time t4, channel boosting is performed. For example, the pass voltage Vpass may be applied to selected and unselected word lines WL.

The channels of the NAND strings are set up to a positive voltage by the second and third bit line voltages VBL2 and VBL3 and the first and second string selection line voltages VSSL1 and VSSL2. When the pass voltage Vpass is applied to the word lines WL, the channel voltage of NAND strings to be program-prohibited is boosted from the positive voltage.

Programming is performed at the fourth time t4. For example, the program voltage Vpgm is applied to a selected word line.

In a bit line setup period, a channel setup period, a channel boosting period and a programming period, the ground voltage Vss is applied to the ground selection line GSL. That is, the NAND strings are electrically disconnected from the common source line CSL. Exemplarily, a positive voltage may be applied to the common source line CSL for preventing leakage due to a voltage difference between the boosted channel voltage of a NAND string NS and the voltage of the common source line CSL.

FIGS. 15 and 16 are tables showing program voltage conditions based on the voltage shift of FIG. 14. Exemplarily, as described above with reference to FIG. 11, the voltage conditions of the NAND strings NS11 to NS13 of a selected row are listed in FIG. 15. Furthermore, as described above with reference to FIG. 12, the voltage conditions of the NAND strings NS21 to NS23 of an unselected row are listed in FIG. 16.

Referring to FIGS. 14 and 15, the third bit line voltage VBL3 is applied to the selected bit line BL2, and the second bit line voltage VBL2 is applied to the unselected bit lines BL1 and BL3. The first string selection line voltage VSSL1 is applied to the first string selection line SSL1. The second string selection line voltage VSSL2 is applied to the second string selection line SSL2. The pass voltage Vpass and the program voltage Vpgm are applied to the word lines WL. The ground voltage Vss is applied to the ground selection line GSL.

As described above with reference to FIG. 10, the channels of the NAND strings NS11 and NS13 corresponding to the unselected bit lines BL1 and BL3 are boosted to the first boosting voltage Vboost1. For example, the channel voltage of the NAND strings NS11 and NS13 is boosted from a level that is set up by the second bit line voltage VBL2 and the first string selection line voltage VSSL1. Therefore, the NAND strings NS11 and NS13 corresponding to the unselected bit lines BL1 and BL3 are program-prohibited.

The channel voltage of the NAND string NS12 corresponding to the selected bit line BL2 is the third bit line voltage VBL3. The third bit line voltage VBL3 has a lower level than the power source voltage Vcc. Also, the level of the third bit line voltage VBL3 is set in order not to boost the channel potential set up by the third bit line voltage VBL3 by the Vpass and the Vpem. Therefore, programming is performed in the NAND string NS12 corresponding to the selected bit line BL2 by a voltage difference between the program voltage Vpgm and the third bit line voltage VBL3.

Referring to FIGS. 14 to 16, the third bit line voltage VBL3 is applied to the selected bit line BL2, and the second bit line voltage VBL2 is applied to the unselected bit lines BL1 and BL3. The second string selection line voltage VSSL2 is applied to the second string selection line SSL2. The pass voltage Vpass and the program voltage Vpgm are applied to the word lines WL. The ground voltage Vss is applied to the ground selection line GSL.

The channel voltage of the NAND strings NS21 to NS23 of the unselected row is boosted to the third boosting voltage Vboost3. For example, the channel voltage of the NAND strings NS21 and NS23 may be boosted from a level that is set up by the second bit line voltage VBL2 and the second string selection line voltage VSSL2. The channel voltage of the NAND string NS22 may be boosted from a level that is set up by the third bit line voltage VBL3 and the second string selection line voltage VSSL2. For example, the level of the third bit line voltage VBL3 may be set enough to boost the channel potential by set up by the third bit line voltage VBL3 and the second string selection line voltage VSSL2.

Exemplarily, the third bit line voltage VBL3 may have the same level as that of the second string selection line voltage VSSL2.

The third bit line voltage VBL3 has been applied to the selected bit line BL2. Therefore, the string electric field of the NAND string NS22 of the unselected row connected to the selected bit line BL2 is formed based on a difference between a third boosting voltage Vboost3 and the third bit line voltage VBL3.

Comparing the voltage conditions that have been described above with reference to FIGS. 7 and 8, the string electric field of the NAND string NS22 of the unselected row connected to the selected bit line BL2 is reduced. Accordingly, program disturbance is prevented, and the reliability of the nonvolatile memory device 100 is improved.

Moreover, the channel voltage of the NAND string NS22 of the unselected row connected to the selected bit line BL2 is boosted from a level that is set up by the third bit line voltage VBL3 and the second string selection line voltage VSSL2. Accordingly, the boosting of the NAND string NS22 is stably performed, and the program disturbances of memory cells connected to the NAND string NS22 is prevented.

Figure 17:
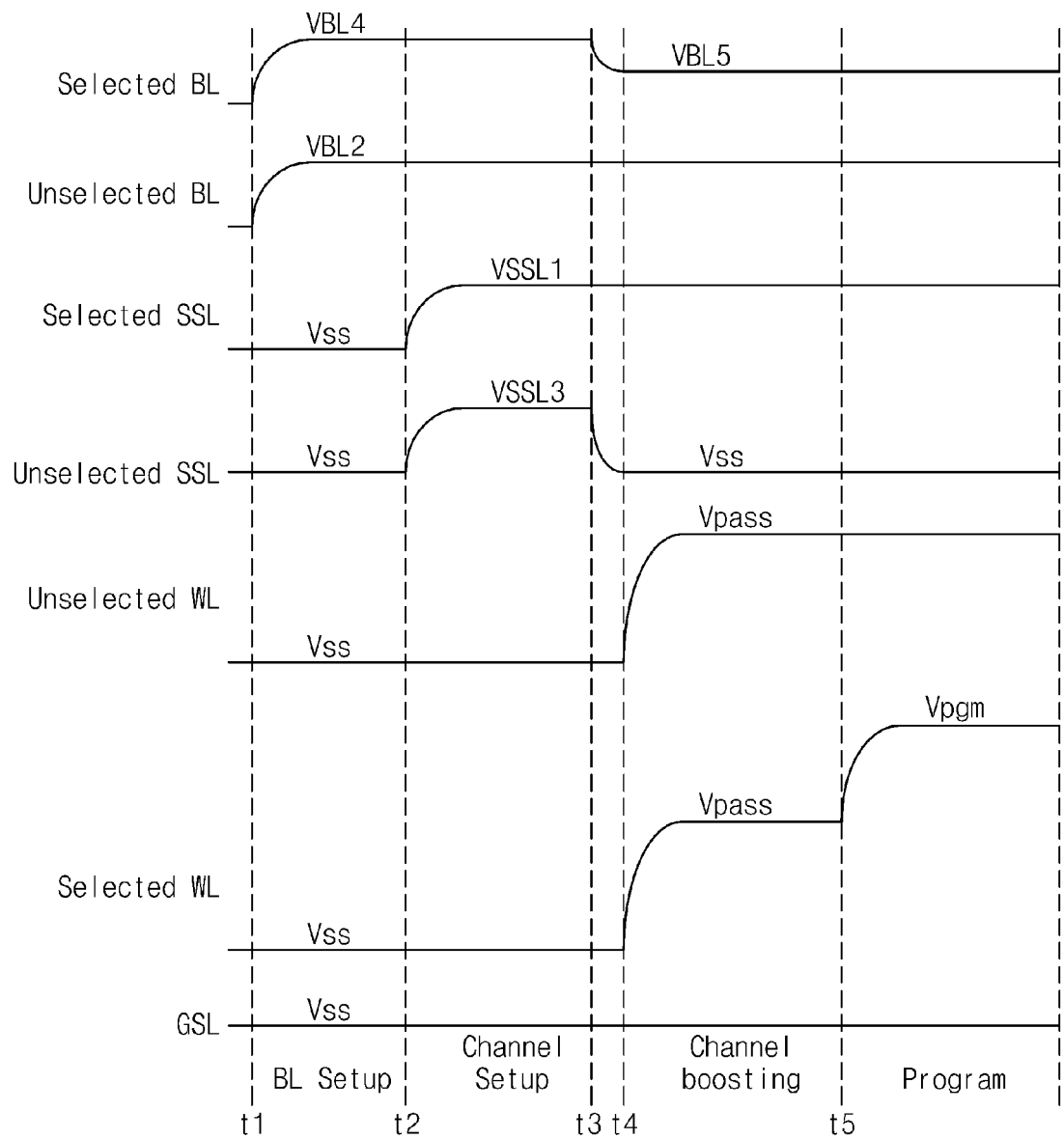
FIG. 17 is a timing diagram showing voltage shift based on the programming method of FIG. 13, according to example embodiments of inventive concepts.

FIG. 17 is a timing diagram showing voltage shift based on the programming method of FIG. 13, according to example embodiments of inventive concepts.

Referring to FIGS. 13 and 17, bit line setup is performed during the first time t1 to the second time t2. As an example, a fourth bit line voltage VBL4 may be applied to the selected bit line of the bit lines BL, and the second bit line voltage VBL2 may be applied to the unselected bit line of the bit lines BL.

Exemplarily, the fourth bit line voltage VBL4 may be the power source voltage Vcc. For example, the second bit line voltage VBL2 may be the power source voltage Vcc.

During the second time t2 to the third time t3, channel setup is performed. For example, the first string selection line voltage VSSL1 is applied to a selected string selection line SSL, i.e., a string selection line SSL connected to the NAND strings of a selected row. The third string selection line voltage VSSL3 is applied to an unselected string selection line SSL, i.e., a string selection line SSL connected to the NAND strings of an unselected row.

Exemplarily, the first and third string selection line voltages VSSL1 and VSSL3 are positive voltages. For example, the third string selection line voltage VSSL3 may have a lower level than the first string selection line voltage VSSL1. As an example, the first string selection line voltage VSSL1 may be the power source voltage Vcc. For example, the third string selection line voltage VSSL3 may be the power source voltage Vcc.

In this case, the channel of NAND strings connected to the selected bit line among the NAND strings of the selected row is set up by the fourth bit line voltage VBL4 and the first string selection line voltage VSSL1. The channel of NAND strings connected to the unselected bit line among the NAND strings of the selected row is set up by the second bit line voltage VBL2 and the first string selection line voltage VSSL1. The channel of NAND strings connected to the selected bit line among the NAND strings of the unselected row is set up by the fourth bit line voltage VBL4 and the third string selection line voltage VSSL3. The channel of NAND strings connected to the unselected bit line among the NAND strings of the unselected row is set up by the second bit line voltage VBL2 and the third string selection line voltage VSSL3.

During the third time t3 and the fourth time t4, the voltage of the unselected string selection line SSL is discharged to the ground voltage Vss. The voltage of the selected bit line is lowered from the fourth bit line voltage VBL4 to a fifth bit line voltage VBL5.

During the fourth time t4 to a fifth time t5, channel boosting is performed. For example, the pass voltage Vpass may be applied to selected and unselected word lines WL.

The channels of the NAND strings are set up to a positive voltage by the second and fourth bit line voltages VBL2 and VBL4 and the first and third string selection line voltages VSSL1 and VSSL3. When the pass voltage Vpass is applied to the word lines WL, the channel voltage of NAND strings to be program-prohibited is boosted from the positive voltage.

Programming is performed from the fifth time t5. For example, the program voltage Vpgm is applied to a selected word line.

In the bit line setup period, the channel setup period, the channel boosting period and the programming period, the ground voltage Vss is applied to the ground selection line GSL. That is, the NAND strings are electrically disconnected from the common source line CSL.

FIGS. 18 and 19 are example tables showing program voltage conditions based on the voltage shift of FIG. 17. Exemplarily, as described above with reference to FIG. 11, the voltage conditions of the NAND strings NS11 to NS13 of a selected row are listed in FIG. 18. Furthermore, as described above with reference to FIG. 12, the voltage conditions of the NAND strings NS21 to NS23 of an unselected row are listed in FIG. 19.

Referring to FIGS. 17 and 19, the fourth bit line voltage VBL4 is applied to the selected bit line BL2 and then the fifth bit line voltage VBL5 is applied to the selected bit line BL2, and the second bit line voltage VBL2 is applied to the unselected bit lines BL1 and BL3. The first string selection line voltage VSSL1 is applied to the first string selection line SSL1. The third string selection line voltage VSSL3 is applied to the second string selection line SSL2 and thereafter the ground voltage Vss is applied to the second string selection line SSL2. The pass voltage Vpass and the program voltage Vpgm are applied to the word lines WL. The ground voltage Vss is applied to the ground selection line GSL.

As described above with reference to FIG. 10, the channels of the NAND strings NS11 and NS13 corresponding to the unselected bit lines BL1 and BL3 are boosted to the first boosting voltage Vboost1. For example, the channel voltage of the NAND strings NS11 and NS13 is boosted from a level that is set up by the second bit line voltage VBL2 and the first string selection line voltage VSSL1. Therefore, the NAND strings NS11 and NS13 corresponding to the unselected bit lines BL1 and BL3 are program-prohibited.

The channel voltage of the NAND string NS12 corresponding to the selected bit line BL2 is the fifth bit line voltage VBL5. The fifth bit line voltage VBL5 has a lower level than the power source voltage Vcc. Also, the level of the fifth bit line voltage VBL5 is set in order not to boost the channel potential by the fifth bit line voltage VBL5 by the Vpass and Vpgm. Therefore, programming is performed in the NAND string NS12 corresponding to the selected bit line BL2 by a voltage difference between the program voltage Vpgm and the fifth bit line voltage VBL5.

Referring to FIGS. 17 to 19, the fourth bit line voltage VBL4 is applied to the selected bit line BL2 and then the fifth bit line voltage VBL5 is applied to the selected bit line BL2, and the second bit line voltage VBL2 is applied to the unselected bit lines BL1 and BL3. The third string selection line voltage VSSL3 is applied to the second string selection line SSL2 and thereafter the ground voltage Vss is applied to the second string selection line SSL2. The pass voltage Vpass and the program voltage Vpgm are applied to the word lines WL. The ground voltage Vss is applied to the ground selection line GSL.

The channel voltage of the NAND strings NS21 to NS23 of the unselected row is boosted to the fourth boosting voltage Vboost4. For example, the channel voltage of the NAND strings NS21 to NS23 may be boosted from a level that is set up by the second bit line voltage VBL2 and the third string selection line voltage VSSL3. The channel voltage of the NAND string NS22 may be boosted from a level that is set up by the fourth bit line voltage VBL4 and the third string selection line voltage VSSL3.

When the pass voltage Vpass and the program voltage Vpgm are applied, the fifth bit line voltage VBL5 is applied to the selected bit line BL2. Therefore, the string electric field of the NAND string NS22 of the unselected row connected to the selected bit line BL2 is formed based on a difference between a fourth boosting voltage Vboost4 and the fifth bit line voltage VBL5.

Comparing the voltage conditions that have been described above with reference to FIGS. 7 and 8, the string electric field of the NAND string NS22 of the unselected row connected to the selected bit line BL2 is reduced. Accordingly, program disturbance is prevented, and the reliability of the nonvolatile memory device 100 is improved.

The ground voltage Vss has been applied to the unselected string selection line SSL2. Accordingly, leakage between the selected bit line BL2 and the NAND string NS22 of the unselected row can be reduced. The channel voltage of the NAND string NS22 of the unselected row connected to the selected bit line BL2 is boosted from a level that is set up by the fourth bit line voltage VBL4 and the third string selection line VSSL3. Accordingly, the boosting of the NAND string NS22 can be stably performed, and the program disturbance of memory cells connected to the NAND string NS22 can be prevented.

Figure 20:
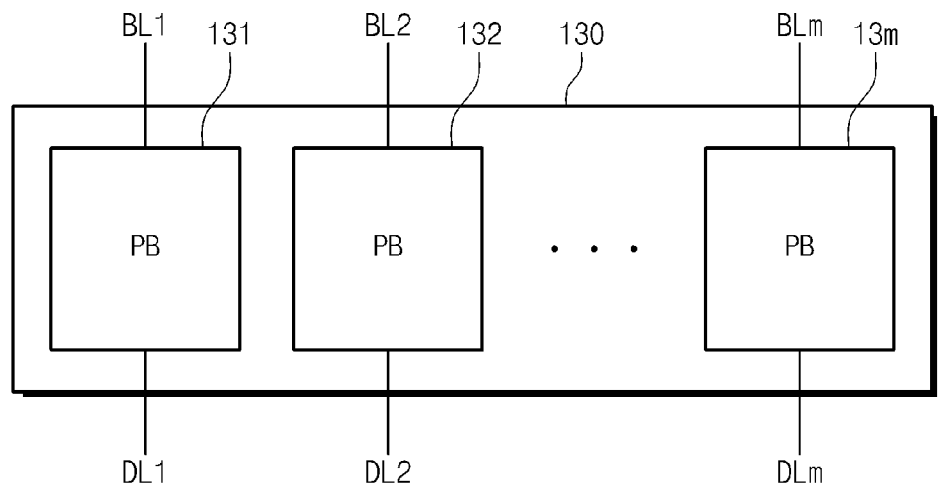
FIG. 20 is an example block diagram illustrating a reading and writing circuit of FIG. 1.

FIG. 20 is an example block diagram illustrating the reading and writing circuit 130 of FIG. 1.

Referring to FIG. 20, the reading and writing circuit 130 includes a plurality of page buffers 13*l* to 13*m*. The page buffers 13*l* to 13*m* are connected between the bit lines BL and the data lines DL, respectively.

In the writing operation, each page buffer receives a writing data from a corresponding data line. The each page buffer stores the writing data received. Based on the writing data stored, the each page buffer sets up a corresponding bit line. For example, when the received writing data is a program data, the each page buffer sets up a corresponding bit line to the first bit line voltage VBL1, the third bit line voltage VBL3 or the fourth and fifth bit line voltages VBL4 and VBL5. As an example, the each page buffer sets up a corresponding bit line to the second bit line voltage VBL2.

Figure 21:
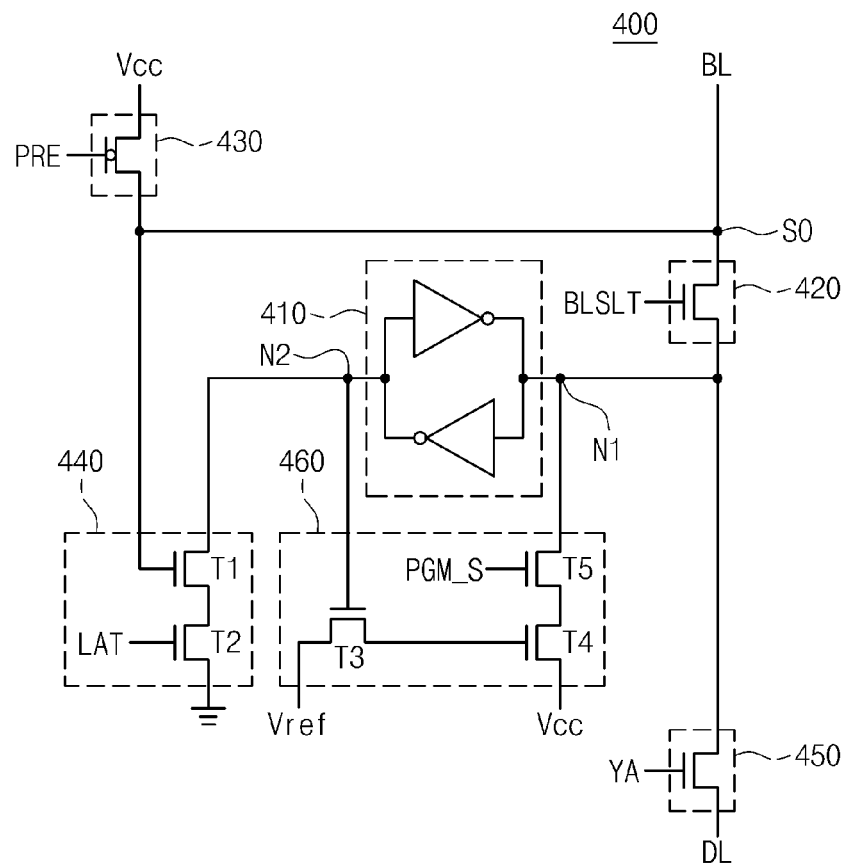
FIG. 21 is a circuit diagram illustrating one of page buffers of FIG. 20, according to example embodiments of inventive concepts.

FIG. 21 is a circuit diagram illustrating one of the page buffers 131 to 13*m* of FIG. 20, according to example embodiments of inventive concepts.

Referring to FIG. 21, a page buffer 400 includes a latch 410, a selection circuit 420, a loading circuit 430, a sensing circuit 440, a Y gate circuit 450, and a bias circuit 460.

The latch 410 is connected to the selection circuit 420, the sensing circuit 440, the Y gate circuit 450 and the bias circuit 460. Exemplarily, a first node N1 of the latch 410 is connected to the selection circuit 420, the Y gate circuit 450 and the bias circuit 460. In the writing operation, the latch 410 stores a writing data. In the reading operation, the latch 410 stores data that is read.

The selection circuit 420 is connected to a bit line BL, the latch 410, the loading circuit 430, the sensing circuit 440, the Y gate circuit 450 and the bias circuit 460. In the writing operation, for example, the selection circuit 420 electrically connects the latch 410 and the bit line BL in response to a selection signal BLSLT. As an example, the selection circuit 420 includes a switch. For example, the selection circuit 420 includes a transistor. The selection circuit 420 operates in response to the selection signal BLSLT.

The loading circuit 430 is connected to the bit line BL, the selection circuit 420 and the sensing circuit 440. In the reading operation, for example, the loading circuit 430 charges a sensing node SO with the power source voltage Vcc. As an example, the loading circuit 430 includes a switch. For example, the loading circuit 430 includes a transistor. The loading circuit 430 provides the power source voltage Vcc to the bit line BL in response to a precharge signal PRE.

The sensing circuit 440 is connected to the bit line BL, the latch 410, the selection circuit 420, the loading circuit 430 and the bias circuit 460. In the reading operation, for example, the sensing circuit 440 transfers the voltage of the sensing node SO to the latch 410 in response to a latch signal LAT. As an example, the latch signal LAT is activated in the reading operation. At this point, a first transistor T1 is driven in response to the voltage level of the sensing node SO. That is, when the voltage level of the sensing node SO is high, the sensing circuit 440 transfers the ground voltage Vss to the latch 410. When the voltage level of the sensing node SO is low, the sensing circuit 440 does not transfer the ground voltage Vss to the latch 410. That is, in the reading operation, the state of the latch 410 is changed according to the voltage level of the sensing node SO.

For example, the sensing circuit 440 includes at least two switches. As an example, the sensing circuit 440 includes first and second transistors T1 and T2. The first transistor T1 is connected to the bit line BL, the latch 410, the selection circuit 420, the loading circuit 430 and the bias circuit 460. The second transistor T2 provides the ground voltage Vss to the first transistor T1 in response to the latch signal LAT.

The Y gate circuit 450 is connected to the latch 410, the selection circuit 420, and the bias circuit 460. For example, in the reading and writing operation, the Y gate circuit 450 connects a data line DL and the latch 410. As an example, in the reading operation, the Y gate circuit 450 transfers a reading data stored in the latch 410 to the data line DL. For example, in the writing operation, the Y gate circuit 450 transfers data, which is received through the data line DL, to the latch 410.

For example, the Y gate circuit 450 includes a switch. As an example, the Y gate circuit 450 includes a transistor. For example, the Y gate circuit 450 operates in response to a column address YA.

The bias circuit 460 is connected to the latch 410, the selection circuit 420, the loading circuit 430, the sensing circuit 440 and the Y gate circuit 450. For example, in the writing operation, the bias circuit 460 provides a writing data stored in the latch 410 to the bit line BL. As an example, the bias circuit 460 provides the first bit line voltage VBL1, the third bit line voltage VBL3 or the fourth and fifth bit line voltages VBL4 and VBL5 to the bit line BL. For example, when the writing data stored in the latch 410 is a program data, the bias circuit 460 provides the first bit line voltage VBL1, the third bit line voltage VBL3 or the fourth and fifth bit line voltages VBL4 and VBL5 to the bit line BL.

For example, the bias circuit 460 includes at least three switches. As an example, the bias circuit 460 includes third to fifth transistors T3 to T5. The third transistor T3 transfers a reference voltage Vref to the fourth transistor T4 in response to the voltage level of a second node N2 of the latch 410. The fourth transistor T4 transfers the power source voltage Vcc to the fifth transistor T5 in response to a voltage transferred from the third transistor T3. The fifth transistor T5 transfers the output of the fourth transistor T4 to the first node N1 of the latch 410 in response to a program signal PGM_S.

In the writing operation, the address ADDR and the writing data are received. In response to the column address of the address ADDR, the Y gate circuit 450 is turned on. When the Y gate circuit 450 is turned on, the writing data is transferred to the latch 410.

Subsequently, the selection signal BLSLT is activated. When the selection signal BLSLT is activated, the selection circuit 420 electrically connects the first node N1 of the latch 410 and the bit line BL.

When the writing data is a program data, the voltage of the first node N1 of the latch 410 has a low level, and the voltage of the second node N2 of the latch 410 has a high level. When the voltage of the second node N2 of the latch 410 has a high level, the third transistor T3 is turned on. Therefore, the reference voltage Vref is transferred to the gate of the fourth transistor T4.

The fourth transistor T4 is connected between a power source voltage (Vcc) node and the fifth transistor T5. In response to the reference voltage Vref received from the third transistor T3, the fourth transistor T4 transfers the power source voltage Vcc to the fifth transistor T5. Exemplarily, the level of a voltage transferred to the fifth transistor T5 through the fourth transistor T4 may be lower than the gate voltage of the fourth transistor T4, e.g., the reference voltage Vref. For example, the level of the reference voltage Vref may be set in order for the level of the voltage, which is transferred to the fifth transistor T5 through the fourth transistor T4, to be controlled to the first bit line voltage VBL1, the third bit line voltage VBL3 or the fourth and fifth bit line voltages VBL4 and VBL5. In response to the reference voltage Vref transferred through the third transistor T3, that is, the fourth transistor T4 controls the level of the power source voltage Vcc to the level of the first bit line voltage VBL1, the level of the third bit line voltage VBL3 or the levels of the fourth and fifth bit line voltages VBL4 and VBL5 and transfers the controlled voltage to the fifth transistor T5.

In the writing operation, the program signal PGM_S is activated. In the writing operation, therefore, the output of the bias circuit 460 is transferred to the bit line BL. That is, when the writing data is the program data, the bit line BL is set up to the first bit line voltage VBL1, the third bit line voltage VBL3 or the fourth and fifth bit line voltages VBL4 and VBL5. When the writing data is a program-prohibited data, the voltage of the first node N1 of the latch 410 has a high level, and the voltage of the second node N2 of the latch 410 has a low level. When the voltage of the second node N2 of the latch 410 has a low level, the third transistor T3 of the bias circuit 460 is turned off. Thus, the fourth transistor T4 is also turned off, and the bias circuit 460 and the bit line BL are electrically disconnected. Since the voltage of the first node N1 of the latch 410 has a high level, the bit line BL is set up to a high level. For example, the bit line BL is set up to the second bit line voltage VBL2.

As described above, the page buffer 400 drives a bit line corresponding to the program data to the first bit line voltage VBL1, the third bit line voltage VBL3 or the fourth and fifth bit line voltages VBL4 and VBL5, and drives a bit line corresponding to the program-prohibited data to the second bit line voltage VBL2. Accordingly, the reliability of the nonvolatile memory device 100 improves.

Figure 22:
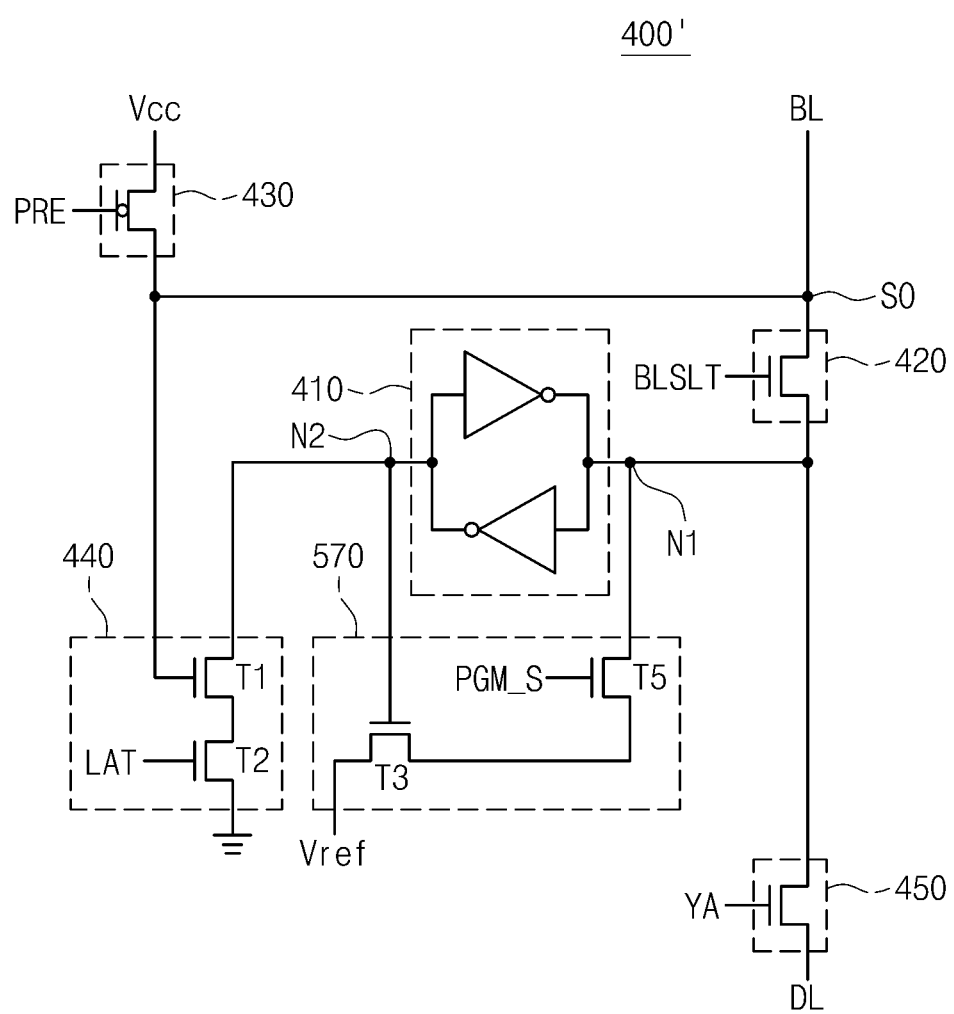
FIG. 22 is a circuit diagram illustrating one of page buffers of FIG. 20, according to example embodiments of inventive concepts.

FIG. 22 is a circuit diagram illustrating one of the page buffers 131 to 13m of FIG. 20, according to example embodiments of inventive concepts.

Referring to FIG. 22, a page buffer 400' includes a latch 410, a selection circuit 420, a loading circuit 430, a sensing circuit 440, a Y gate circuit 450, and a bias circuit 470. The latch 410, the selection circuit 420, the loading circuit 430, the sensing circuit 440 and the Y gate circuit 450 are identically configured with those of FIG. 21. Therefore, detailed descriptions on the latch 410, the selection circuit 420, the loading circuit 430, the sensing circuit 440 and the Y gate circuit 450 will be omitted.

Except for the removal of the fourth transistor T4, the bias circuit 470 is identically configured with the bias circuit 460 that has been described above with reference to FIG. 21. In response to the voltage level of a second node N2 of the latch 410, for example, a third transistor T3 transfers a reference voltage Vref. The reference voltage Vref is transferred to a fifth transistor T5.

The fifth transistor T5 is turned on in response to a program signal PGM_S. In response to the program signal PGM_S, that is, the fifth transistor T5 transfers the output of the third transistor T3 to a bit line BL. Exemplarily, when a writing data is a program data, the third transistor T3 is turned on. That is, when a writing data is a program data, the bit line BL is set up to the reference voltage Vref. Exemplarily, the level of the reference voltage Vref is set to the level of the first bit line voltage VBL1, the level of the third bit line voltage VBL3 or the levels of the fourth and fifth bit line voltages VBL4 and VBL5.

Figure 23:
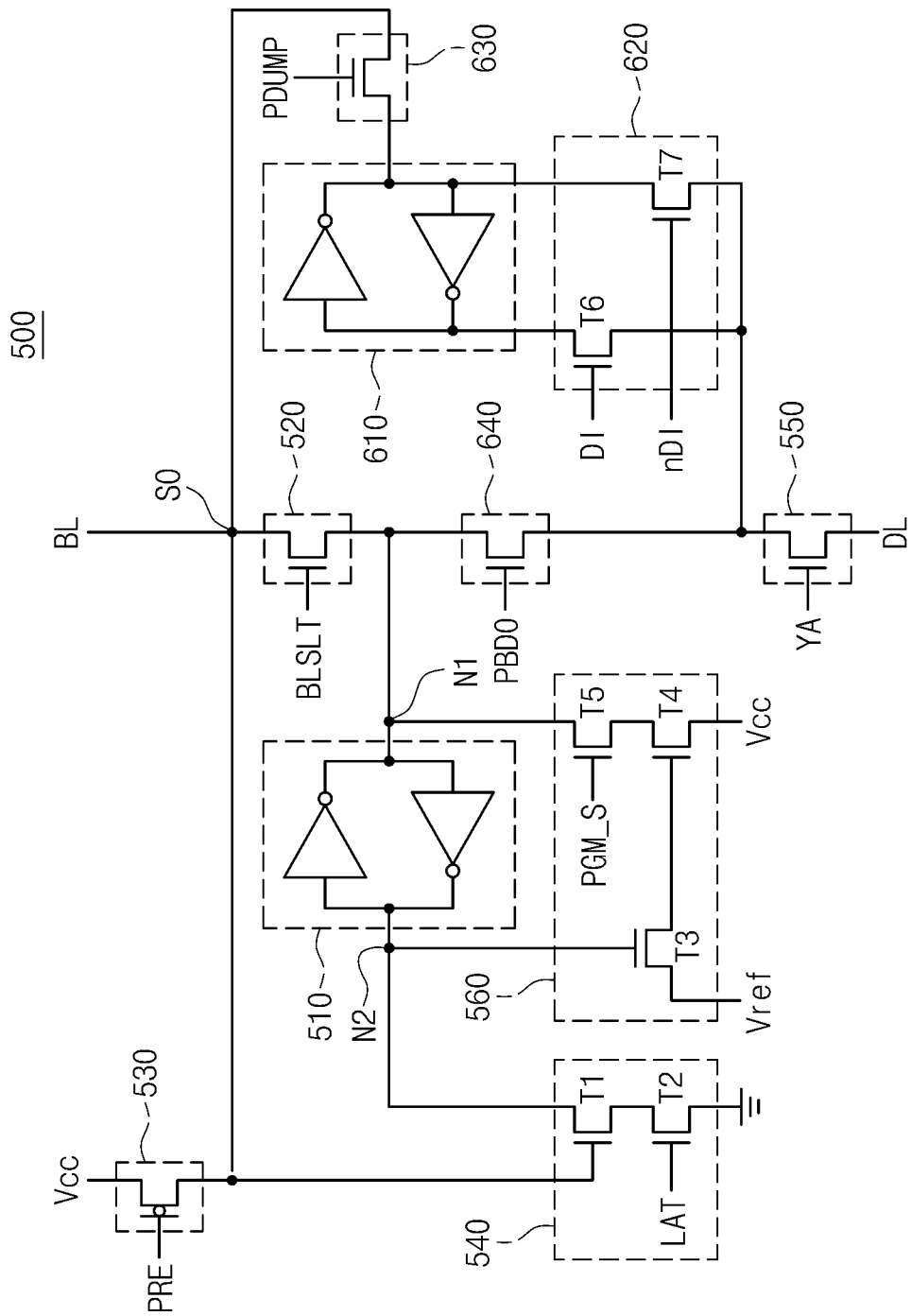
FIG. 23 is a circuit diagram illustrating one of page buffers of FIG. 20, according to example embodiments of inventive concepts.

FIG. 23 is a circuit diagram illustrating one of the page buffers 131 to 13m of FIG. 20, according to example embodiments of inventive concepts.

Referring to FIG. 23, a page buffer 500 includes a first latch 510, a first selection circuit 520, a loading circuit 530, a sensing circuit 540, a Y gate circuit 550, a bias circuit 560, a second latch 610, a data transfer circuit 620, and a dump circuit 630. The first latch 510, the first selection circuit 520, the loading circuit 530, the sensing circuit 540, the Y gate circuit 550 and the bias circuit 560 are identically configured with the latch 410, the selection circuit 420, the loading circuit 430, the sensing circuit 440, the Y gate circuit 450 and the bias circuit 460 that have been described above with reference to 21. Therefore, detailed descriptions on the first latch 510, the first selection circuit 520, the loading circuit 530, the sensing circuit 540, the Y gate circuit 550 and the bias circuit 560 will be omitted.

The second latch 610 is connected to the data transfer circuit 620 and the dump circuit 630. The second latch 610 stores a writing data or a reading data.

The data transfer circuit 620 is connected to the second latch 610, the Y gate circuit 550 and the second selection circuit 640. The data transfer circuit 620 transfers data, which is received through the Y gate circuit 550, to the latch 610. Exemplarily, the data transfer circuit 620 includes at least two switches. For example, the data transfer circuit 620 includes sixth and seventh transistors T6 and T7. The sixth transistor T6 operates in response to a data signal D1. The seventh transistor T7 operates in response to a data inversion signal nDI. The sixth and seventh transistors T6 and T7 are connected to the both ends of the second latch 610 and the Y gate circuit 550, respectively.

The dump circuit 630 is connected to the second latch 610, the first selection circuit 520, the loading circuit 530 and the sensing circuit 540. The dump circuit 630 transfers data stored in the second latch 610 to the first latch 510. For example, the dump circuit 630 includes at least one switch. For example, the dump circuit 630 includes at least one transistor. For example, the dump circuit 630 operates in response to a dump signal DUMP.

When the dump signal DUMP is activated, the data of the second latch 610 is transferred to a sensing node SO. At this point, if a latch signal LAT is activated, the data of the first latch 510 is shifted according to the voltage level of the sensing node SO. That is, the data of the second latch 610 is transferred to the first latch 510.

The second selection circuit 640 is connected to the first latch 510, the first selection circuit 520, the bias circuit 560 and the Y gate circuit 550. For example, in the reading operation, the second selection circuit 640 transfers a reading data stored in the first latch 510 to a data line DL through the Y gate circuit 550. As an example, the second selection circuit 640 includes at least one switch. For example, the second selection circuit 640 includes at least one transistor. For example, the second selection circuit 640 operates in response to a second selection circuit PBD0.

Figure 24:
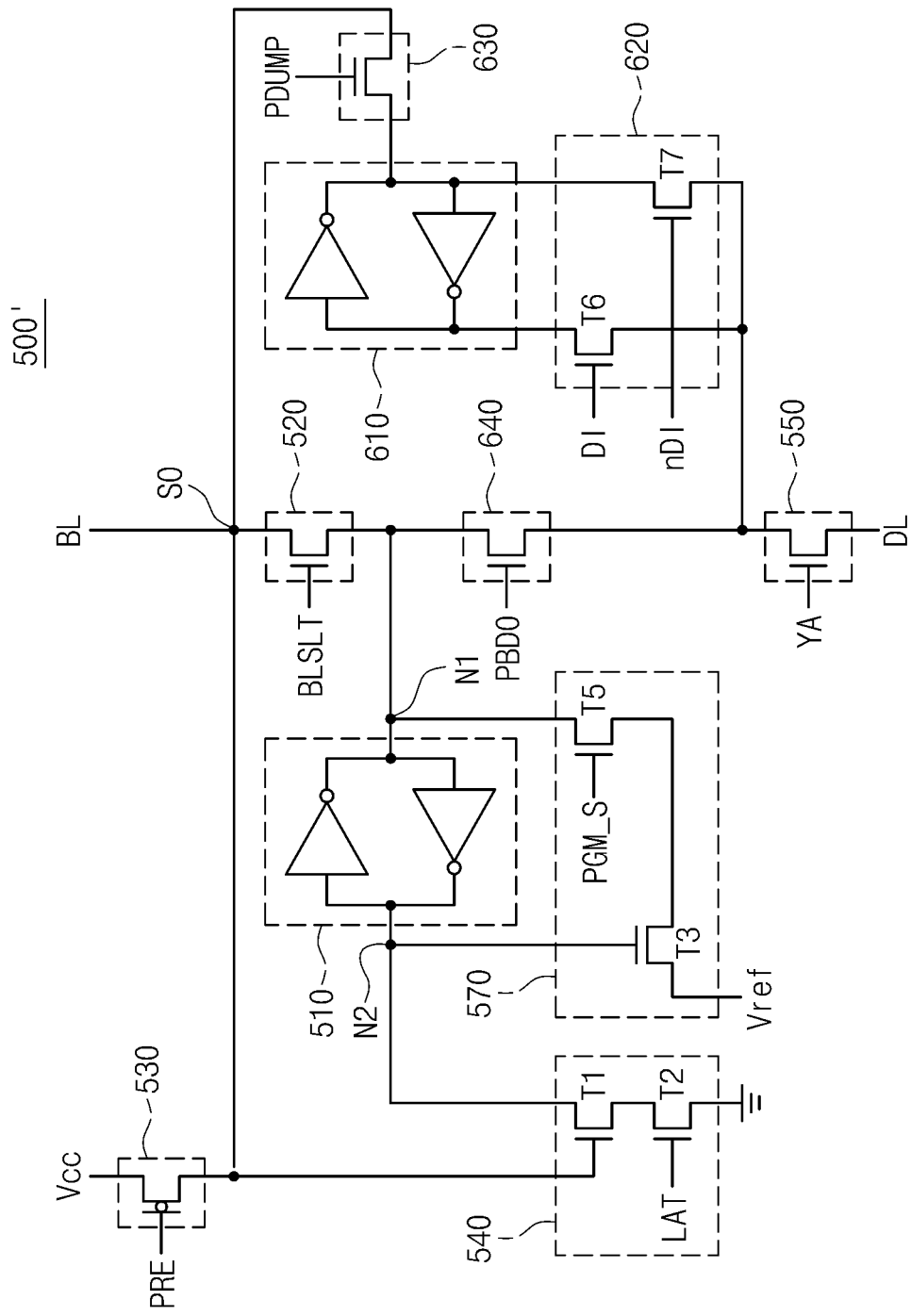
FIG. 24 is a circuit diagram illustrating one of page buffers of FIG. 20, according to example embodiments of inventive concepts.

FIG. 24 is a circuit diagram illustrating one of the page buffers 131 to 13m of FIG. 20, according to example embodiments of inventive concepts.

Referring to FIG. 24, a page buffer 500' includes a first latch 510, a first selection circuit 520, a loading circuit 530, a sensing circuit 540, a Y gate circuit 550, a bias circuit 570, a second latch 610, a data transfer circuit 620, and a dump circuit 630. The first latch 510, the first selection circuit 520, the loading circuit 530, the sensing circuit 540, the Y gate circuit 550, the second latch 610, the data transfer circuit 620 and the dump circuit 630 are identically configured with those of FIG. 21. The bias circuit 570 is identically configured with the bias circuit 470 that has been described above with reference to FIG. 22. In FIGS. 21 to 24, the elements of the page buffer have been described above. However, the elements of the page buffer are not limited the elements that have been described above with reference to FIGS. 21 to 24.

Exemplarily, the page buffer 500 or 500' performs cache programming. For example, a first writing data is loaded into the first latch 510. While the first writing data is being programmed, a second writing data is loaded into the second latch 610. When the programming of the first writing data is completed, the second writing data is dumped to the first latch 610. Subsequently, the second writing data is programmed. Likewise, while the second writing data is being programmed, a third writing data is loaded into the second latch 610. If cache programming is performed, the operation speed of the nonvolatile memory device 100 can be enhanced.

Exemplarily, the page buffer 500 or 500' performs a multi level programming. For example, it is assumed that the Least Significant Bit (LSB) data is stored in a memory cell. The page buffer 500 or 500' reads the LSB data stored in the memory cell and stores the LSB data in the second latch 610. The page buffer 500 or 500' receives the Most Significant Bit (MSB) data. For example, the MSB data may be a writing data. The page buffer 500 or 500' stores the received MSB data in the first latch 510. Based on the LSB data and the writing data (or MSB data) that are stored in the first and second latches 510 and 610, the page buffer 500 or 500' performs multi level programming.

Figure 25:
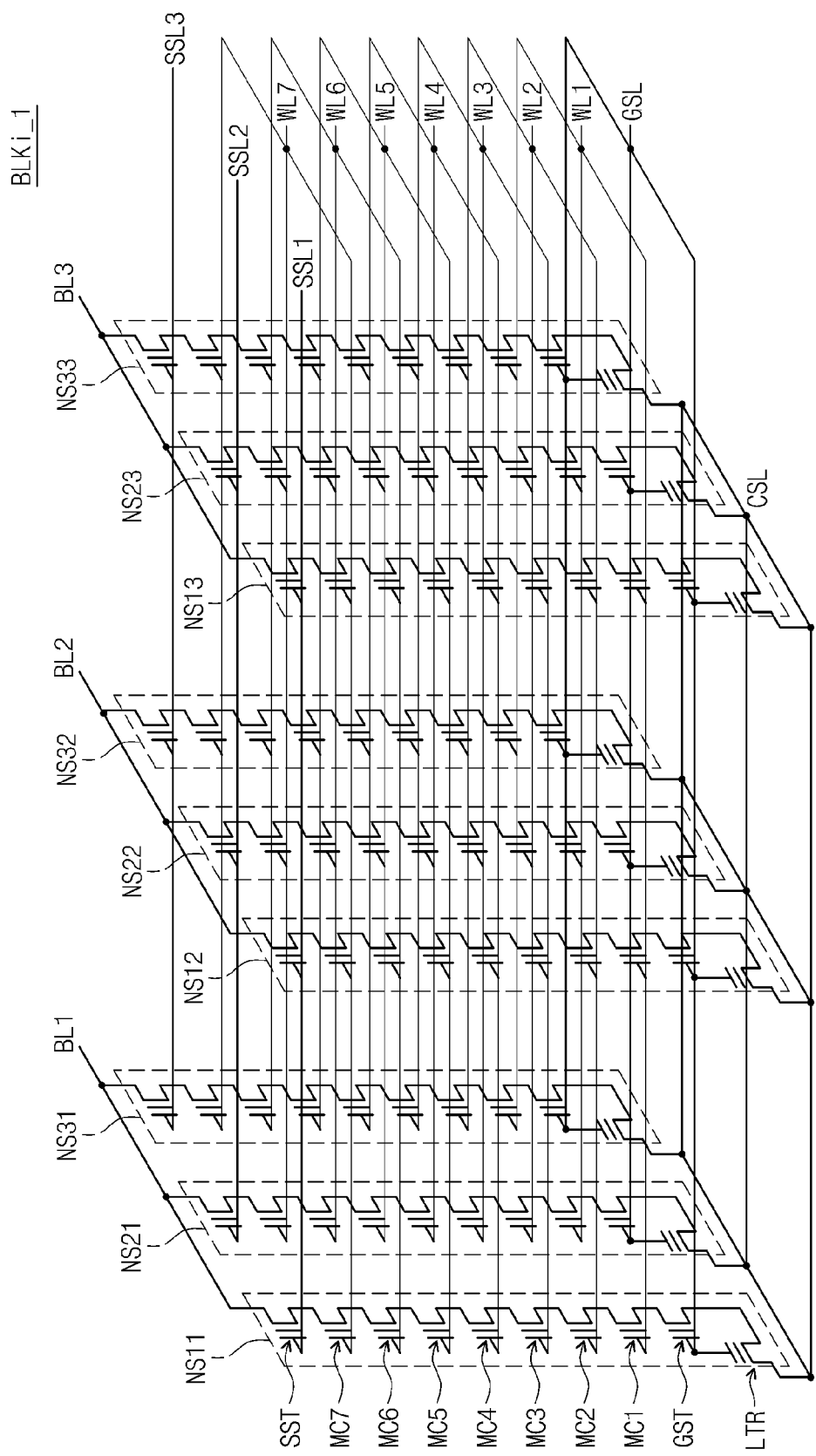
FIG. 25 is a circuit diagram illustrating an equivalent circuit BLKi_1 of the memory block BLKi described with reference to FIGS. 3 and 5 according to example embodiments of inventive concepts.

FIG. 25 is a circuit diagram illustrating an equivalent circuit BLKi_1 of the memory block BLKi described with reference to FIGS. 3 and 5 according to example embodiments of inventive concepts. Compared to the equivalent circuit described with reference to FIG. 6, a lateral transistor LTR is additionally provided at each NAND string NS of the memory block BLKi_1.

In each NAND string NS, the lateral transistor LTR is connected between a ground selection transistor GST and a common source line CSL. A gate (or a control gate) of the lateral transistor LTR and a gate (or control gate) of the ground selection transistor GST are connected to the ground selection line GSL.

As described with reference to FIGS. 3 through 6, the first conductive materials 211, 212, and 213 having the first height correspond to first to third ground selection lines GSL1 to GSL3, respectively.

Once a specific voltage is applied to the first conductive materials 211, 212, and 213 having the first height, a channel is formed in a region of the surface layer 114 adjacent to the first conductive materials 211, 212, and 213. Moreover, if a specific voltage is applied to the first conductive materials 211, 212, and 213, a channel is formed in a region of the substrate 111 adjacent to the first conductive materials 211, 212, and 213.

A first doping region 311 is connected to a channel in the substrate 111, which is formed by a voltage of the first conductive material. The channel of the substrate 111 generated by a voltage of the first conductive material 211 is connected to a channel formed by voltage of the first conductive material 211 in the surface layer 114 operating as a body of the second direction.

Likewise, a channel is formed in the substrate 111 by a voltage of the first conductive materials 211, 212, and 213. First to fourth doping regions 311 to 314 are respectively connected to the surface layers 114 operating as a body of the second direction through a channel formed by a voltage of the first conductive materials 211, 212, and 213 in the substrate 111.

As described with reference to FIGS. 3 through 6, the first to fourth doping regions 311 to 314 are commonly connected to form a common source line CSL. The common source line CSL and the channels of the memory cells MC1 to MC7 are electrically connected through channels perpendicular and parallel to the substrate 111, which are formed by a voltage of the ground selection line GSL.

That is, it is understood that transistors perpendicular and parallel to a substrate, driven by the ground selection line GSL, are provided between the common source line CSL and the first memory cells MC1. A transistor perpendicular to a substrate may be understood as a ground selection transistor GST and a transistor parallel to a substrate may be understood as a lateral transistor LST.

Figure 26:
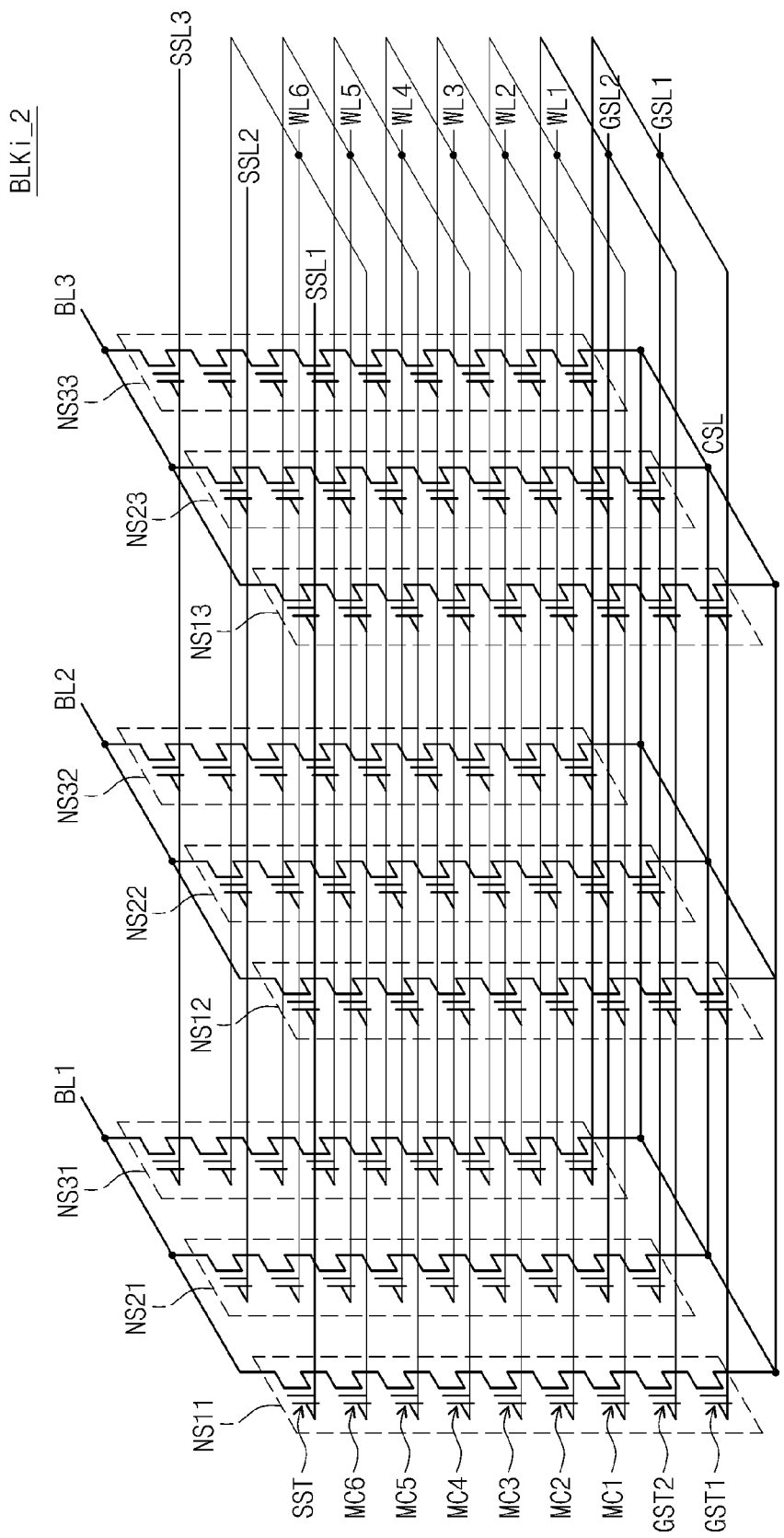
FIG. 26 is a circuit diagram illustrating an equivalent circuit BLKi_1 of the memory block BLKi described with reference to FIGS. 3 and 5 according to example embodiments of inventive concepts.

FIG. 26 is a circuit diagram illustrating an equivalent circuit BLKi_1 of the memory block BLKi described with reference to FIGS. 3 and 5 according to example embodiments of inventive concepts. Compared to the equivalent circuit described with reference to FIG. 6, two ground selection transistors GST1 and GST2 may be provided between the memory cells MC1 to MC6 and the common source line CSL in each NAND string NS. The ground selection lines GSL1 and GSL2 corresponding to the ground selection transistor GST1 or GST2 having the same height may be commonly connected. Moreover, the ground selection lines GSL1 and GSL2 corresponding to the same NAND string NS may be commonly connected.

Figure 27:
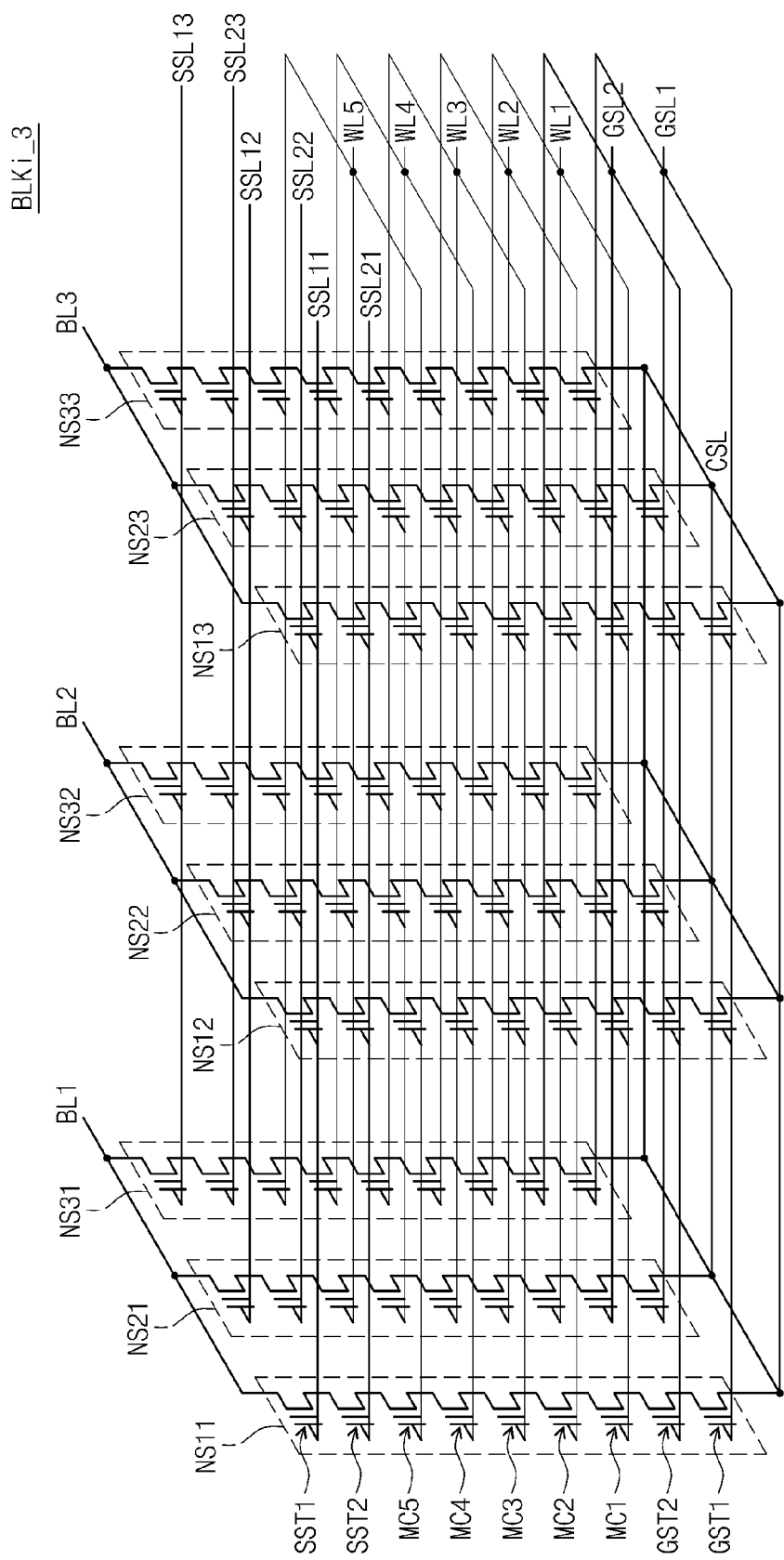
FIG. 27 is a circuit diagram illustrating an equivalent circuit BLKi_2 of the memory block BLKi described with reference to FIGS. 3 and 5 according to example embodiments of inventive concepts.

FIG. 27 is a circuit diagram illustrating an equivalent circuit BLKi_2 of the memory block BLKi described with reference to FIGS. 3 and 5 according to example embodiments of inventive concepts. Compared to the memory block BLKi_1 of FIG. 16, two string selection transistors SSTa and SSTb may be provided between the memory cells MC1 to MC5 and the bit line BL.

In NAND strings in the same row, the string selection transistor SSTa or SSTb having the same height may share one string selection line SSL. For example, in the NAND strings NS11 to NS13 of a first row, the a string selection transistors SSTa share a 1a string selection line SSL1a. The b string selection transistors SSTb share a 1b string selection line SSL1b.

In NAND strings NS21 to NS23 in the second row, the a string selection transistors SSTa share a 2a string selection line SSL2a. The b string selection transistors SSTb share a 2b string selection line SSL2b.

In NAND strings NS21 to NS23 in the third row, the a string selection transistors SSTa share a 3a string selection line SSL3a. The b string selection transistors SSTb share a 3b string selection line SSL3b.

Figure 28:
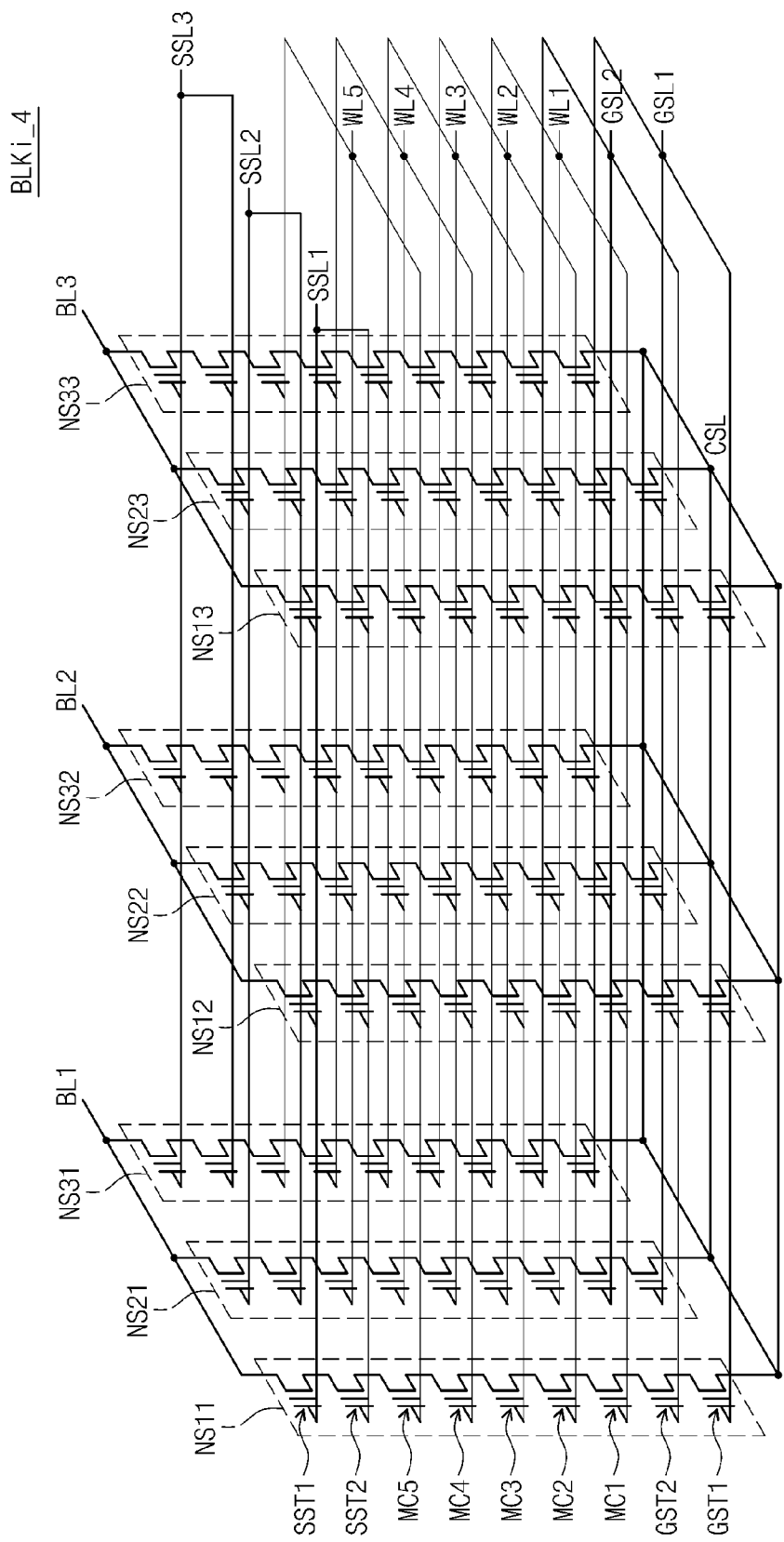
FIG. 28 is a circuit diagram illustrating an equivalent circuit BLKi_3 of the memory block BLKi described with reference to FIGS. 3 and 5 according to example embodiments of inventive concepts.

FIG. 28 is a circuit diagram illustrating an equivalent circuit BLKi_3 of the memory block BLKi described with reference to FIGS. 3 and 5 according to example embodiments of inventive concepts. Compared to the memory block BLKi_2 of FIG. 17, string selection lines SSL corresponding to the NAND strings NS of the same row are commonly connected.

Figure 29:
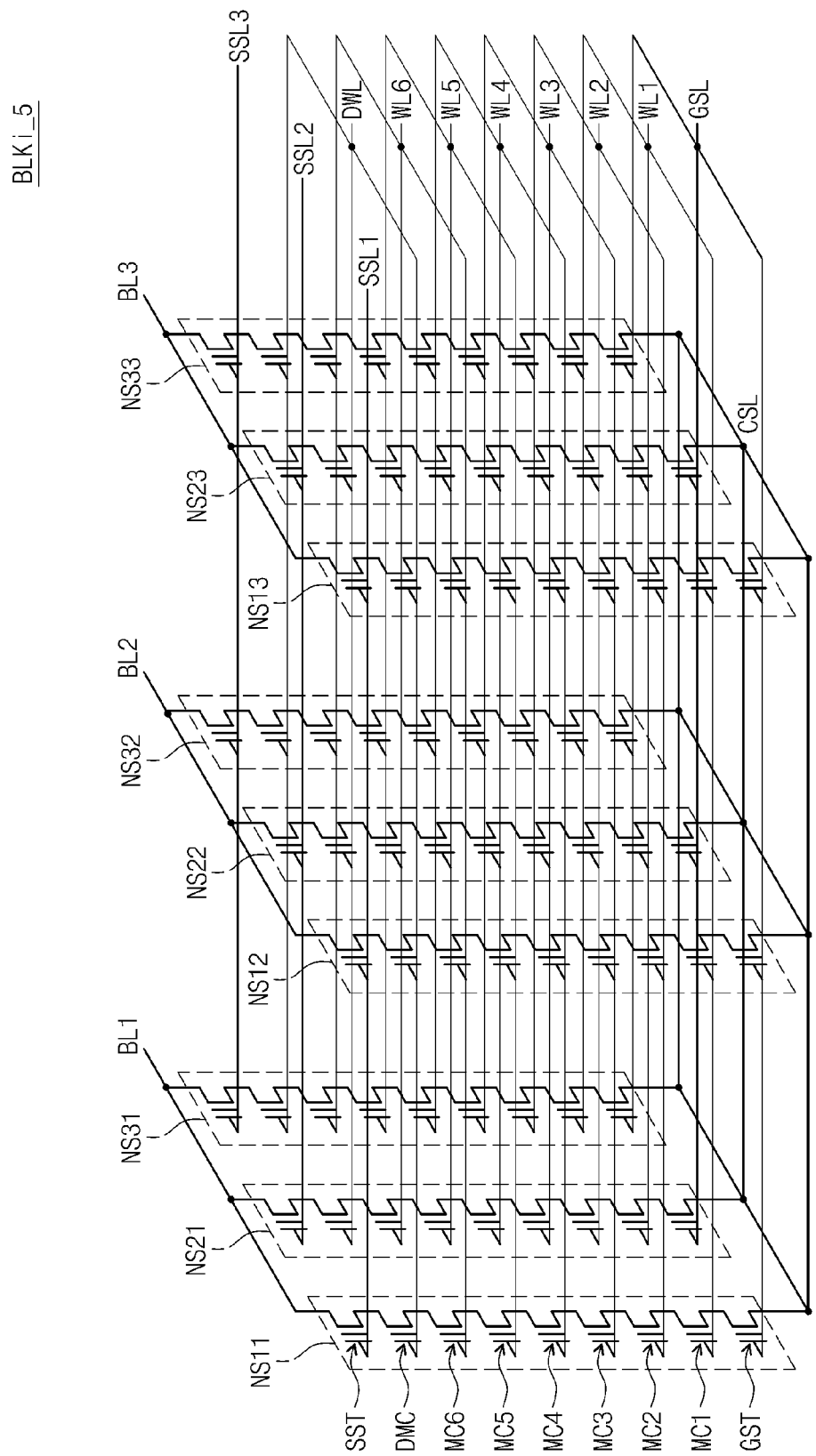
FIG. 29 is a circuit diagram illustrating an equivalent circuit BLKi_4 of the memory block BLKi described with reference to FIGS. 3 and 5 according to example embodiments of inventive concepts.

FIG. 29 is a circuit diagram illustrating an equivalent circuit BLKi_4 of the memory block BLKi described with reference to FIGS. 3 and 5 according to example embodiments of inventive concepts. Compared to the memory block BLKi of FIG. 6, the dummy memory cell DMC is provided between the string selection transistor SST and the memory cells MC6 in each NAND string NS. The dummy memory cells DMC1 are commonly connected to the dummy word lines DWL. That is, the dummy word line DWL is provided between the string selection lines SSL1 to SSL3 and the word line WL6.

Figure 30:
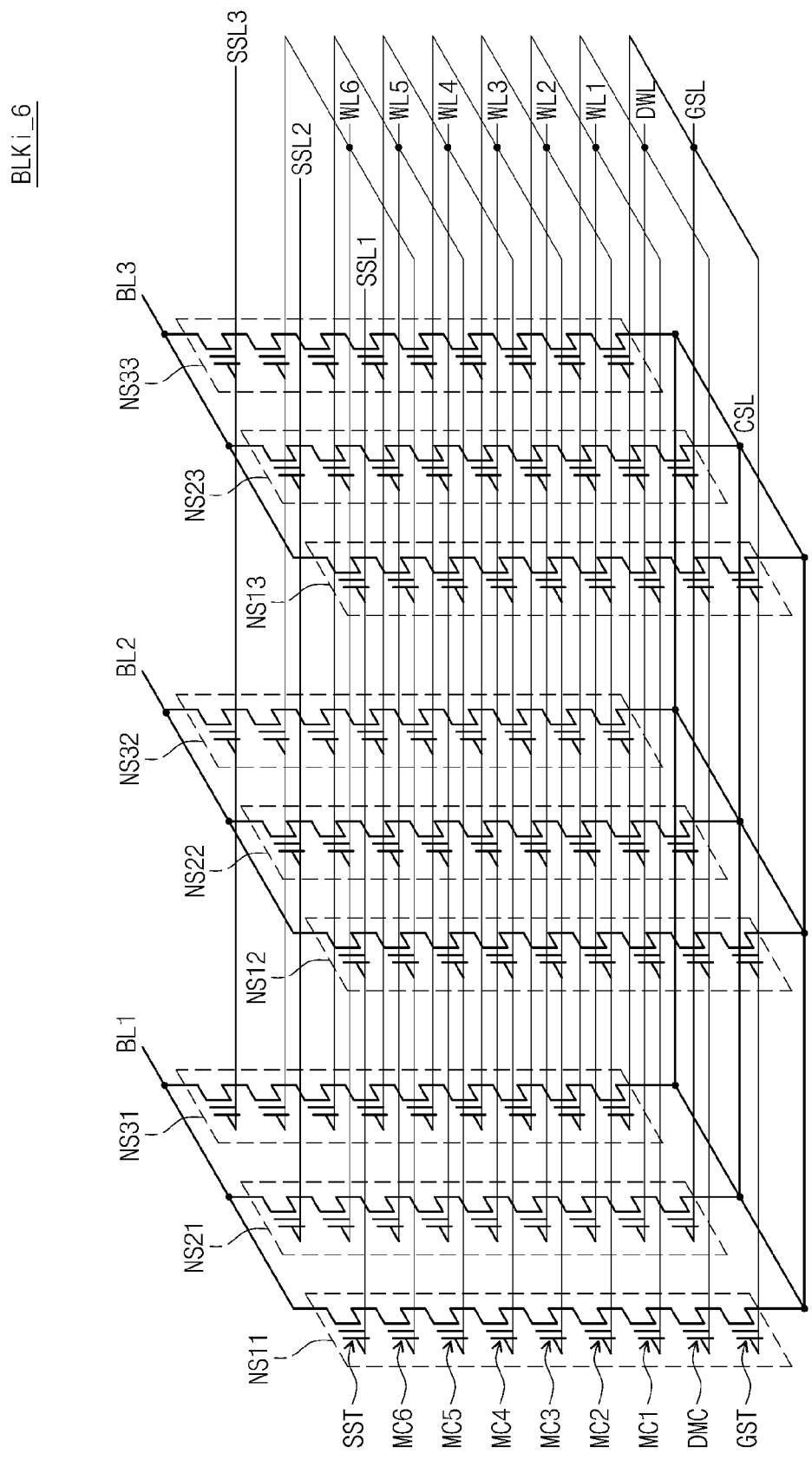
FIG. 30 is a circuit diagram illustrating an equivalent circuit BLKi_5 of the memory block BLKi described with reference to FIGS. 3 and 5 according to example embodiments of inventive concepts.

FIG. 30 is a circuit diagram illustrating an equivalent circuit BLKi_5 of the memory block BLKi described with reference to FIGS. 3 and 5 according to example embodiments of inventive concepts. Compared to the memory block BLKi of FIG. 6, the dummy memory cell DMC is provided between the ground selection transistor GST and the memory cell MC1 in each NAND string NS. The dummy memory cells DMC are commonly connected to the dummy word lines DWL. That is, the dummy word line DWL is provided between the ground selection line GSL and the word lines WL1.

Figure 31:
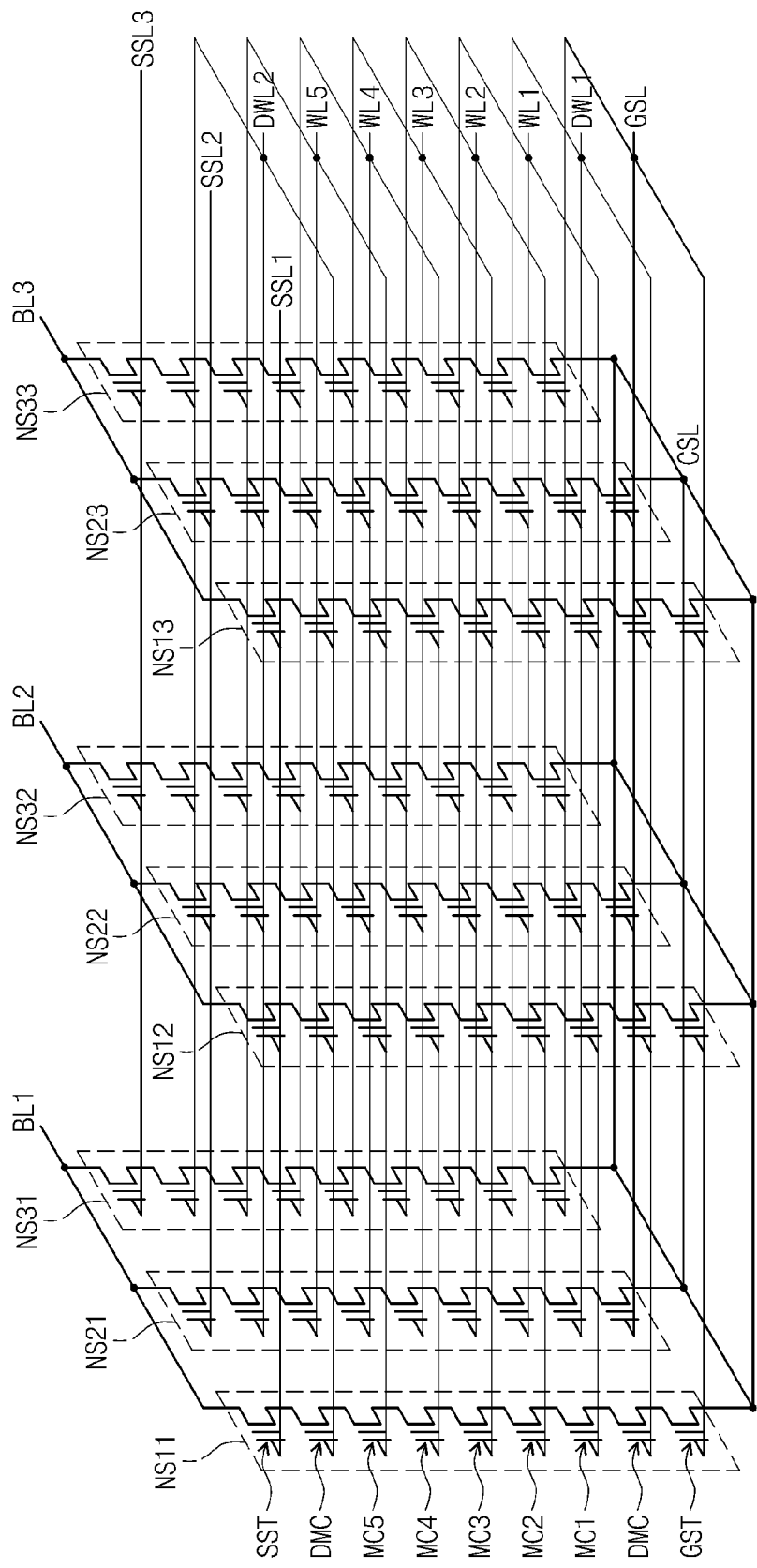
FIG. 31 is a circuit diagram illustrating an equivalent circuit BLKi_6 of the memory block BLKi described with reference to FIGS. 3 and 5 according to example embodiments of inventive concepts.

FIG. 31 is a circuit diagram illustrating an equivalent circuit BLKi_6 of the memory block BLKi described with reference to FIGS. 3 and 5 according to example embodiments of inventive concepts. Compared to the memory block BLKi of FIG. 6, a dummy memory cell DMC is provided between the ground selection transistor GST and the memory cell MC1 and between the string select transistor SST and the memory cell MC6 in each NAND string NS. The dummy memory cells DMC are commonly connected to the dummy word lines DWL1 and DWL2. That is, the dummy word line DWL1 is provided between the ground selection line GSL and the word line WL1 and the DWL2 is provided between the string select line SSL and the word line MC5. FIG. 22 is a perspective view of one of the memory blocks BLK1-BLKz according to example embodiments BLKi' of inventive concepts. A cross-sectional view taken along the line I-I' of the memory block BLKi' is the same as that of FIG. 3.

Compared to the memory block BLKi of FIG. 3, in the memory block BLKi, pillars 113' has a square pillar form. Moreover, between the pillars 113' spaced from each other along the first direction by a specific distance, insulation materials 101 are provided. Exemplarily, the insulation materials 101 extend along the second direction and contact the substrate 111.

The first conductive materials 211 to 291, 212 to 292, and 213 to 293 described with reference to FIG. 3 are divided into first portions 211a to 291a, 212a to 292a, and 213a to 293a and second portions 211b to 291b, 212b to 292b, and 213b to 293b in a region including the insulation materials 101.

In a region on first and second doping regions 311 and 312, each pillar 113' forms the first portions 211a to 291a and insulation layer 116 of the first conductive materials and one NAND string NS and forms the second portions 211b to 291b and insulation layer 116 of the first conductive materials and another NAND string NS.

In a region on second and third doping regions 312 and 313, each pillar 113' forms the first portions 212a to 292a and insulation layer 116 of the first conductive materials and one NAND string NS and forms the second portions 212b to 292b and insulation layer 116 of the first conductive materials and another NAND string NS.

In a region on third and fourth doping regions 313 and 314, each pillar 113' forms the first portions 213a to 293a and insulation layer 116 of the first conductive materials and one NAND string NS and forms the second portions 213b to 293b and insulation layer 116 of the first conductive materials and another NAND string NS.

That is, the first and second portions 211a to 291a and 211b to 291b of the first conductive materials provided at the both sides of each pillar 113' are separated using the insulation material 101, such that each pillar 113' may form two NAND strings.

As described with reference to FIGS. 3 through 6, the first portions 211a to 291a and the second portions 211b to 291b, 212b to 292b, and 213b to 293b of the first conductive materials may correspond to ground selection lines GSL, word lines WL, and string selection lines SST, respectively. The word lines WL having the same height are commonly connected.

Exemplarily, an equivalent circuit of the memory block BLKi' may be illustrated as the equivalent circuit BLKi_1 shown in FIG. 6 except the number of rows in the NAND strings NS. For example, the number of rows in the NAND strings NS of an equivalent circuit of the memory block BLKi' may be two times that in the NAND strings NS of the equivalent circuit BLKi_1 shown in FIG. 6.

Exemplarily, an equivalent circuit of the memory block BLKi' may be illustrated as the equivalent circuits BLKi_2 to BLKi_8 shown in FIGS. 15 through 21 except the number of rows in the NAND strings NS. For example, the number of rows in the NAND strings NS of an equivalent circuit of the memory block BLKi' may be two times that in the NAND strings NS of the equivalent circuits BLKi_2 to BLKi_8 shown in FIGS. 15 through 21.

Each NAND string of the memory block BLKi' may include a lateral transistor LTR. At least one dummy memory cell DMC may be provided between sub blocks of the memory block BLKi'. The number of memory cells DMC, which may be further provided between sub blocks of the memory block BLKi', may vary.

In each NAND string, at least two string selection transistors SST may be provided. In each NAND sting, at least two ground selection transistors GST may be provided. In each NAND string, at least one dummy memory cell DMC may be provided between the memory cells MC and the string selection transistor SST. In each NAND string, at least one dummy memory cell DMC may be provided between the memory cells MC and the ground selection transistor GST.

Figure 32:
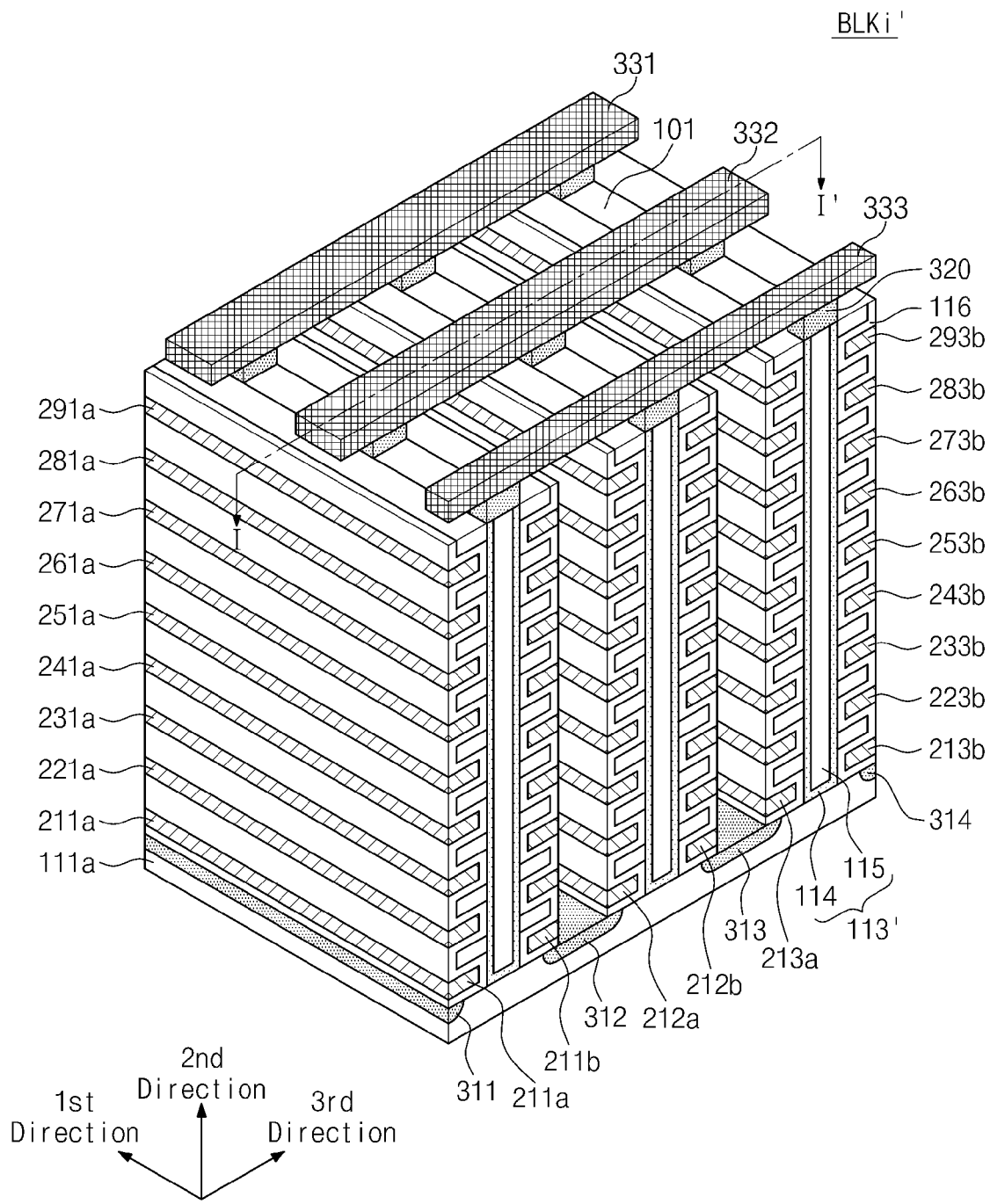
FIG. 32 is a perspective view illustrating a memory block of FIG. 3 according to another embodiment of the inventive concept.

FIG. 32 is a perspective view illustrating a memory block BLKi of FIG. 3 according to another embodiment of the inventive concept. Comparing with the memory block BLKi of FIG. 3, in a memory block BLKi', pillars 113' may be provided in a tetragonal pillar shape. Also, insulating materials 120 are provided between the pillars 113' that are disposed in the first direction.

Exemplarily, the insulating materials 120 are extended in the second direction and connected to the substrate 111. Also, the insulating materials 120 are extended in the first direction in a region other than a region to which the pillars 113' are provided. That is, the conductive materials 211 to 291, 212 to 292 and 213 to 293 that have been described above with reference to FIG. 3 may be divided into first portions 211a to 291a, 212a to 292a and 213a to 293a and second portions 211b to 291b, 212b to 292b and 213b to 293b by insulating materials 101, respectively. That is, the divided portions 211a to 291a, 211b to 291b, 212a to 292a, 212b to 292b, 213a to 293a and 213b to 293b of the conductive materials may be electrically insulated.

In a region on the first and second doping regions 311 and 312, each of the pillars 113', the first portions 211a to 291a of first conductive materials and the insulation layer 116 may form one NAND string NS, and each of the pillars 113', the second portions 211b to 291b of the first conductive materials and the insulation layer 116 may form another NAND string NS.

In a region on the second and third doping regions 312 and 313, each of the pillars 113', the first portions 212a to 292a of first conductive materials and the insulation layer 116 may form one NAND string NS, and each of the pillars 113', the second portions 212b to 292b of the first conductive materials and the insulation layer 116 may form another NAND string NS.

In a region on the third and fourth doping regions 313 and 314, each of the pillars 113', the first portions 213a to 293a of first conductive materials and the insulation layer 116 may form one NAND string NS, and each of the pillars 113', the second portions 213b to 293b of the first conductive materials and the insulation layer 116 may form another NAND string NS.

That is, by dividing the first and second portions 211a to 291a and 211b to 291b of the first conductive materials that are provided to the both-side surfaces of the each pillar 113' with the insulating material 101, the each pillar 113' may form two NAND strings NS.

Figure 33:
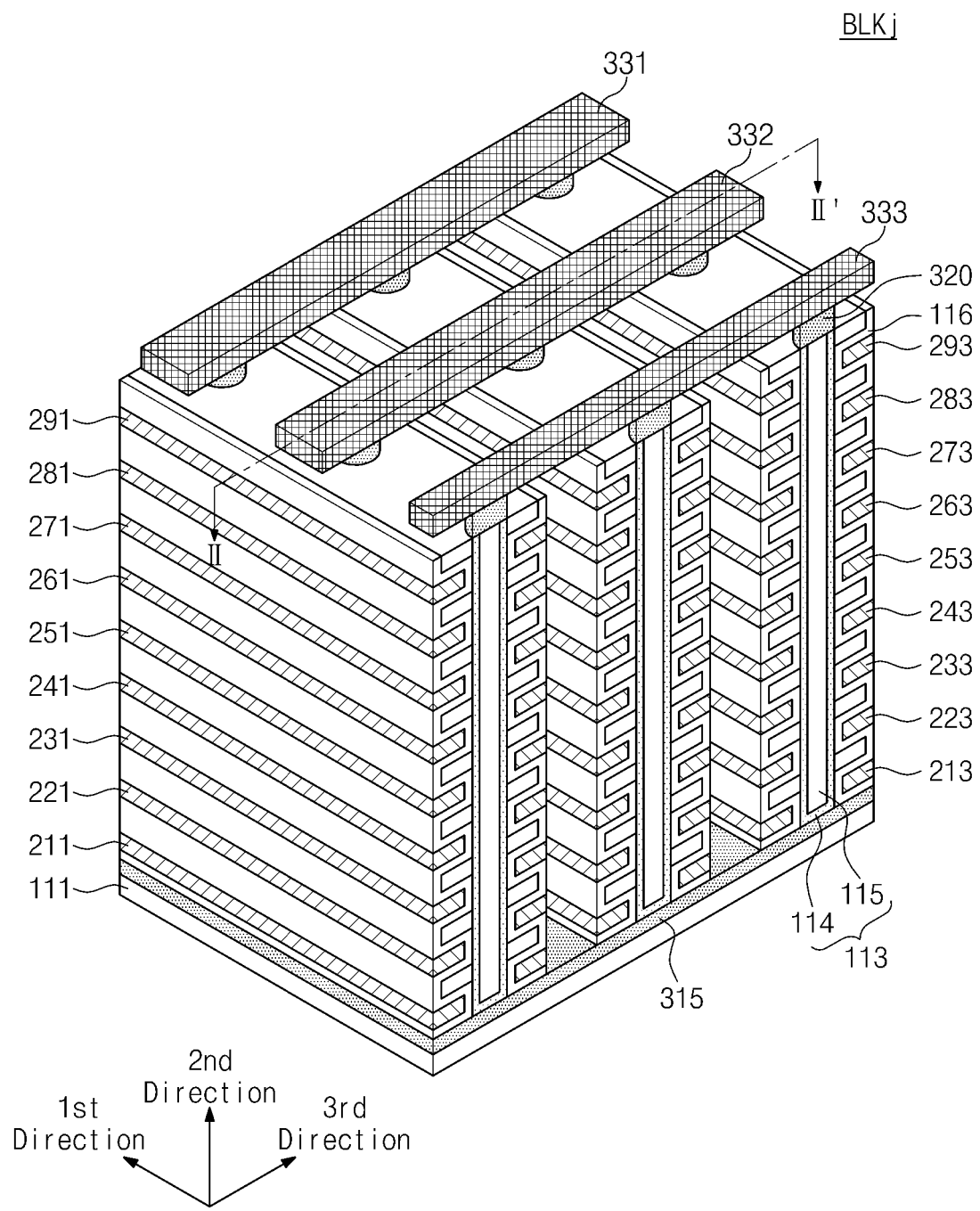
FIG. 33 is a perspective view of one of the memory blocks BLK1-BLKz according to example embodiments of inventive concepts.
Figure 34:
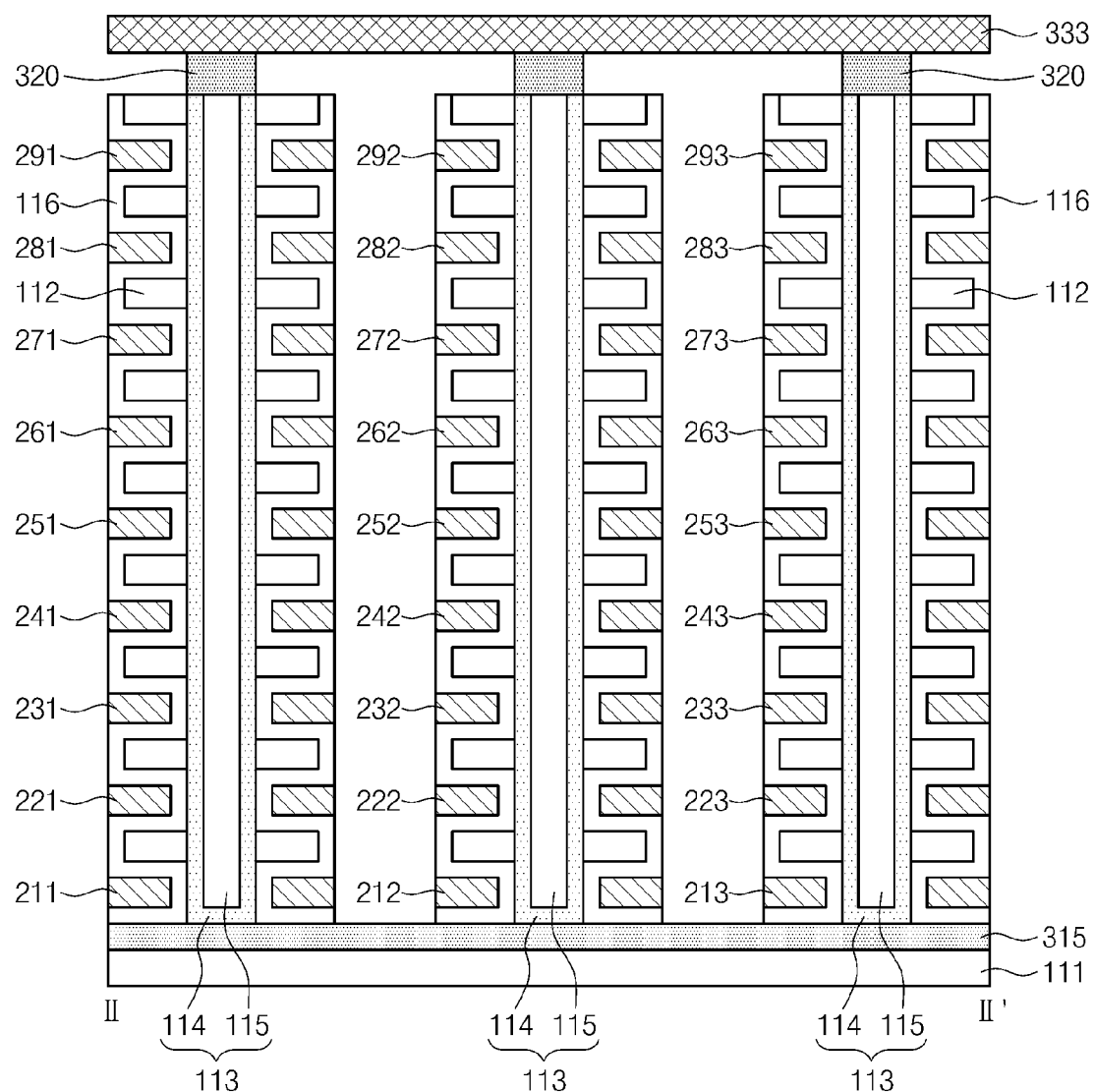
FIG. 34 is a sectional view taken along the line VI-VI' of the memory block BLKp of FIG. 33.

FIG. 33 is a perspective view of one of the memory blocks BLK1-BLKz according to example embodiments BLKp of inventive concepts. FIG. 34 is a sectional view taken along the line VI-VI' of the memory block BLKp of FIG. 33. Except that an n-type doping region 315 forming a common source line CSL is provided with a plate form, the memory block BLKp has the same configuration as the memory block BLKi described with reference to FIGS. 4 through 6. For example, an n-type doping region 315 may be provided as an n-type well.

As described with reference to FIGS. 4 through 6, the first conductive materials 211 to 291, 212 to 292, and 213 to 293 may correspond to ground selection lines GSL, word lines WL, and string selection lines SST, respectively. The word lines WL having the same height are commonly connected.

Figure 35:
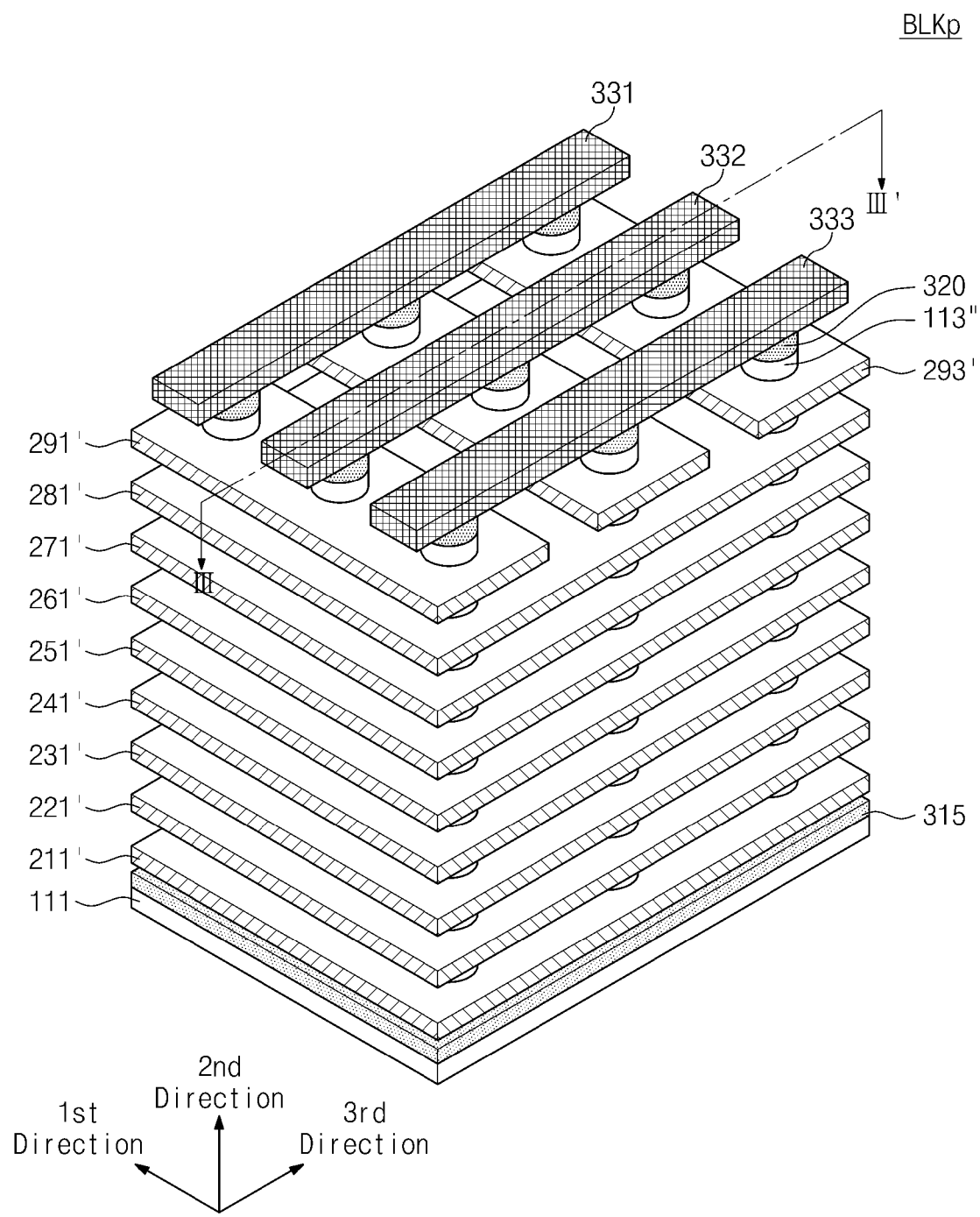
FIG. 35 is a perspective view of one of the memory blocks BLK1-BLKz according to example embodiments of inventive concepts.
Figure 36:
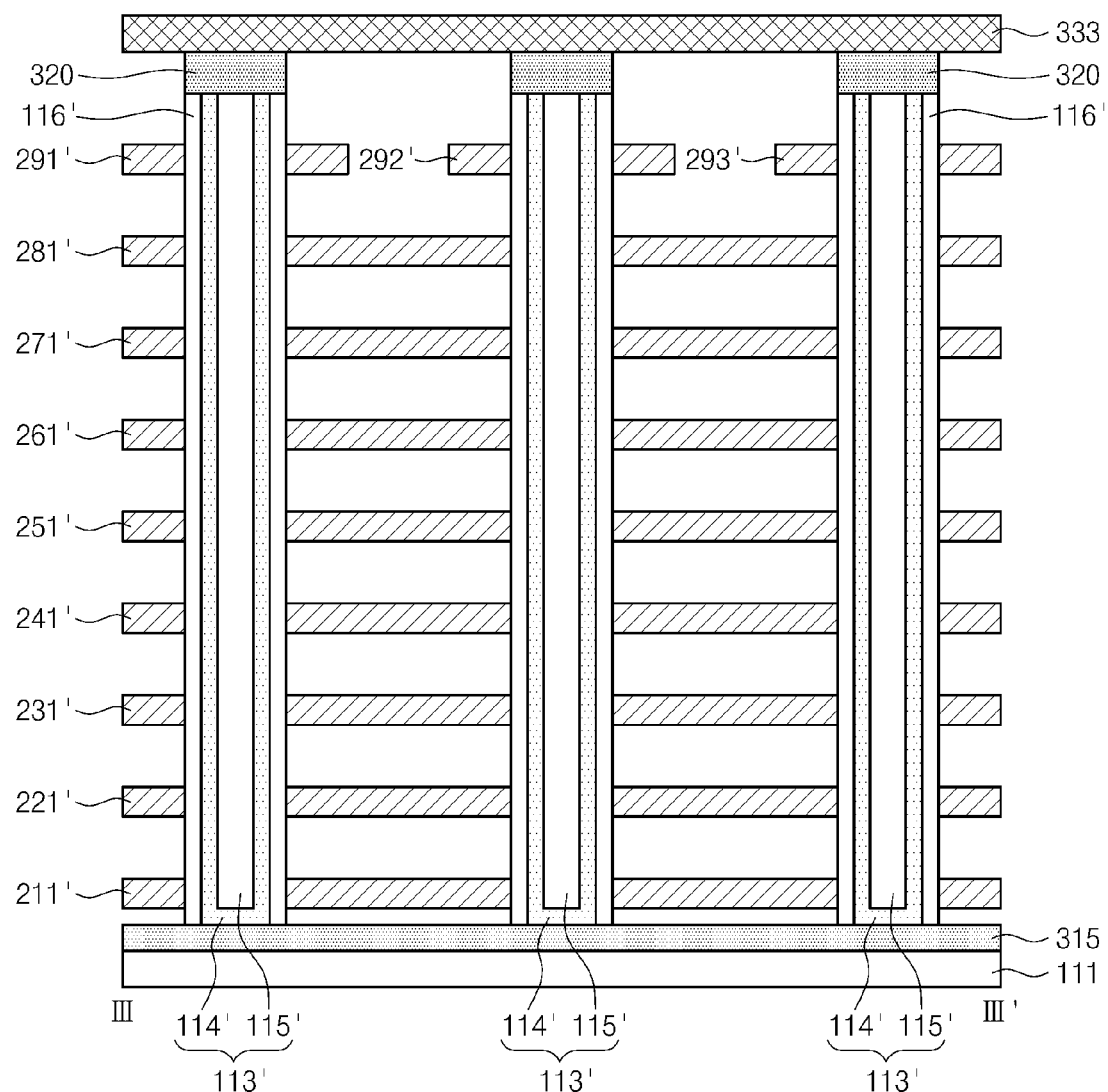
FIG. 36 is a sectional view taken along the line VIII-VIII' of the memory block BLKr of FIG. 35.

FIG. 35 is a perspective view illustrating a memory block of FIG. 2, according to another embodiment of the inventive concept. FIG. 36 is a cross-sectional view taken along line III'-III' of a memory block BLKp of FIG. 35.

Referring to FIGS. 35 and 36, a second type doping region 315 having a plate shape is provided onto a substrate 111. First conductive materials 221' to 281' are provided in a plate shape.

A surface layer 116' of a pillar 113' includes an insulation layer. The surface layer 116' of the pillar 113' is formed to store data like the insulation layer 116 that has been described above with reference to FIGS. 1 to 34. For example, the surface layer 116' may include a tunneling insulation layer, a charge storing layer, and a blocking insulation layer. An intermediate layer 114' of the pillar 113' includes p-type silicon. The intermediate layer 114' of the pillar 113' serves as a second-direction body. An inner layer 115' of the pillar 113' includes an insulating material.

Figure 37:
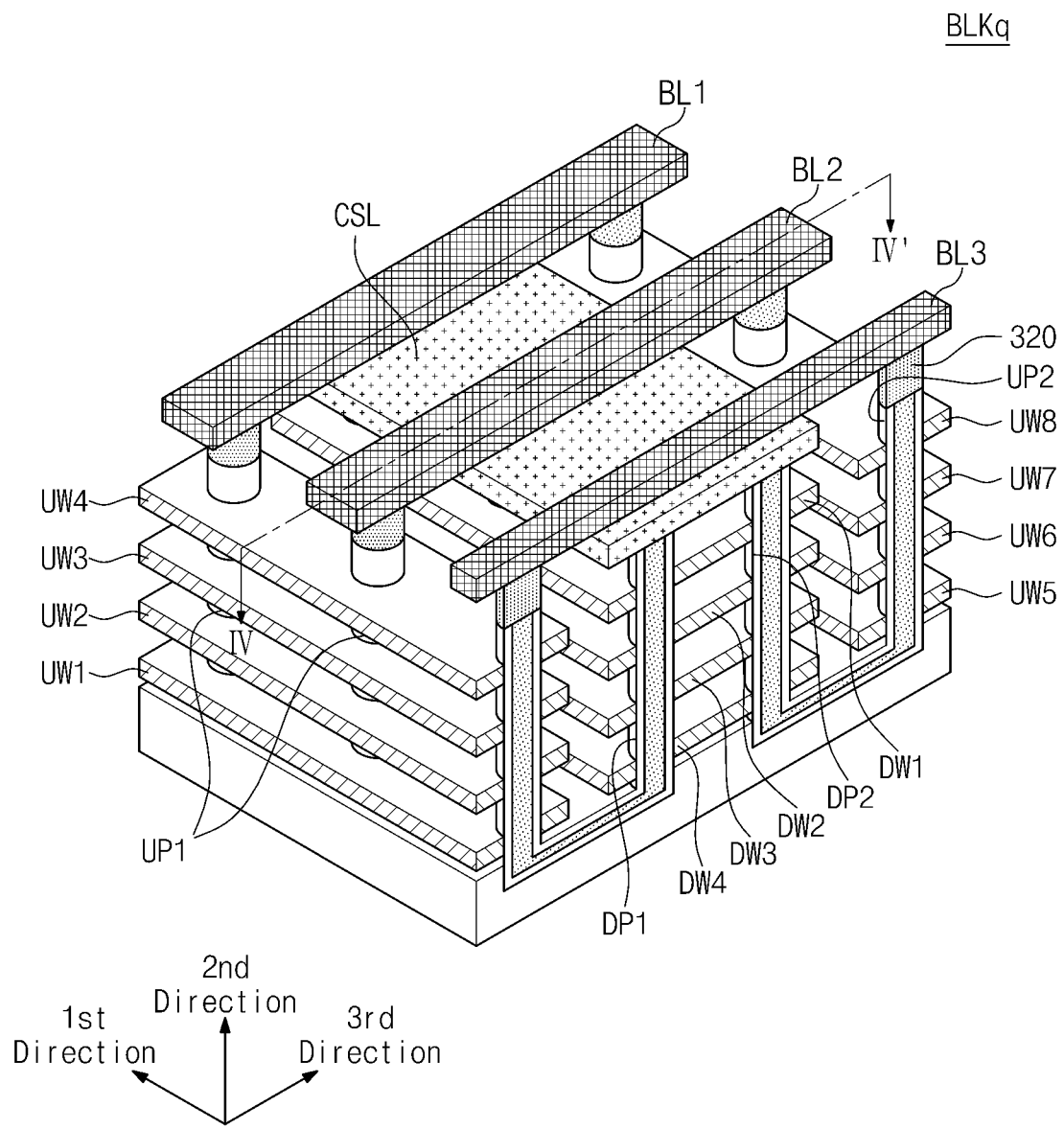
FIG. 37 is a perspective view of one of the memory blocks BLK1-BLKz according to example embodiments of inventive concepts.
Figure 38:
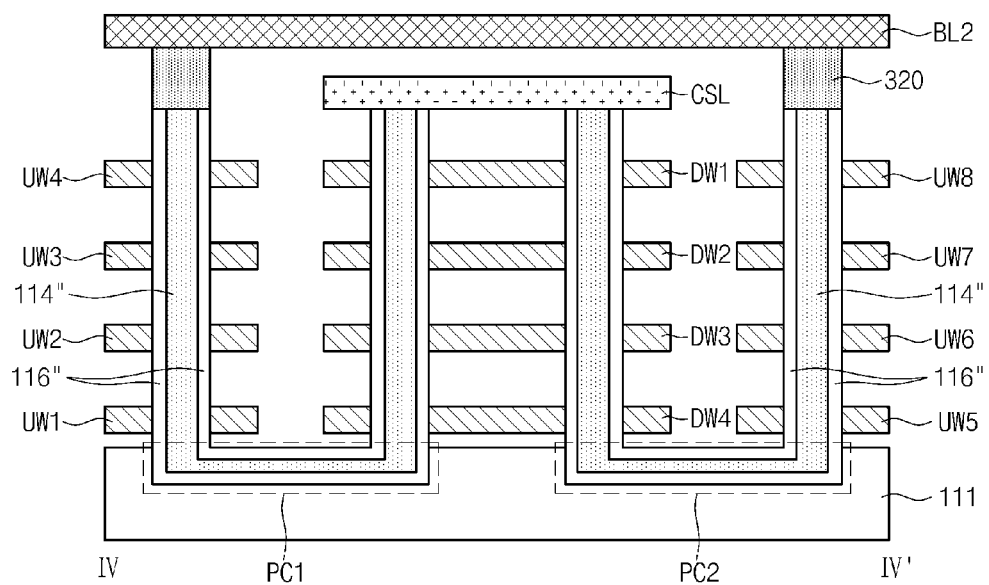
FIG. 38 is a sectional view taken along the line X-X of the memory block BLKt of FIG. 37.

FIG. 37 is a perspective view illustrating a memory block of FIG. 2, according to another embodiment of the inventive concept. FIG. 38 is a cross-sectional view taken along line IV-IV' of a memory block BLKq of FIG. 37.

Referring to FIGS. 37 and 38, first to fourth upper word lines UW1 to UW4 extended in a first direction are sequentially provided onto a substrate 111 in a second direction. The first to fourth upper word lines UW1 to UW4 are provided to be spaced apart by a predetermined distance in the second direction. Provided are first upper pillars UP1 that are sequentially disposed in the first direction and pass through the first to fourth upper word lines UW1 to UW4 in the second direction.

First to fourth lower word lines DW1 to DW4 extended in the first direction are sequentially provided in the second direction onto the substrate 111 that is separated from the first to fourth upper word lines UW1 to UW4 in a third direction. The first to fourth lower word lines DW1 to DW4 are provided to be spaced apart by a predetermined distance in the second direction. Provided are first lower pillars DP1 that are sequentially disposed in the first direction and pass through the first to fourth lower word lines DW1 to DW4 in the second direction. Furthermore, provided are second lower pillars DP1 that are sequentially disposed in the first direction and pass through the first to fourth lower word lines DW1 to DW4 in the second direction. For example, the first and second lower pillars DP1 and DP2 may be disposed in the second direction in parallel.

Fifth to eighth upper word lines UW5 to UW8 extended in the first direction are sequentially provided in the second direction onto the substrate 111 that is separated from the first to fourth lower word lines DW1 to DW4 in the third direction. The fifth to eighth upper word lines UW5 to UW8 are provided to be spaced apart by a predetermined distance in the second direction. Provided are second upper pillars UP2 that are sequentially disposed in the first direction and pass through the fifth to eighth upper word lines UW5 to UW8 in the second direction.

A common source line CSL extended in the first direction is provided onto the upper portions of the first and second lower pillars DP1 and DP2. Exemplarily, the common source line CSL may be n-type silicon. Exemplarily, when the common source line CSL is formed of a conductive material, having no polarity, such as metal or poly silicon, n-type sources may be additionally provided between the first and second lower pillars DP1 and DP2. Exemplarily, the common source line CSL and the first and second lower pillars DP1 and DP2 may be connected through contact plugs, respectively.

Drains 320 are provided onto the upper portions of the first and second upper pillars UP1 and UP2, respectively. Exemplarily, the drains 320 may be n-type silicon. A plurality of bit lines BL1 to BL3 extended in the third direction are sequentially provided onto the portions of the drains 320 in the first direction. Exemplarily, the bit lines BL1 to BL3 may be formed of a metal. Exemplarily, the bit lines BL1 to BL3 and the drains 320 may be connected through the contact plugs. Each of the first and second upper pillars UP1 and UP2 includes a surface layer 116" and an inner layer 114". Each of the first and second lower pillars DP1 and DP2 includes a surface layer 116" and an inner layer 114". The surface layer 116" of the first and second upper pillars UP1 and UP2 and first and second lower pillars DP1 and DP2 include a blocking insulation layer, a charge storing layer and a tunneling insulation layer.

The tunneling insulation layer may include a thermal oxide layer. The charge storing layer may include a nitride layer or metal oxide layer (for example, an aluminum oxide layer or a hafnium oxide layer). A blocking insulation layer 119 may be formed in a single layer or a multi layer. The blocking insulation layer 119 may be a high dielectric layer (for example, an aluminum oxide layer or a hafnium oxide layer) having a higher dielectric constant than the charge storing layer and the tunneling insulation layer. Exemplarily, the blocking insulation layer, the charge storing layer and the tunneling insulation layer may form ONO.

The inner layer 114" of the first and second upper pillars UP1 and UP2 and first and second lower pillars DP1 and DP2 may be p-type silicon. The inner layer 114" of the first and second upper pillars UP1 and UP2 and first and second lower pillars DP1 and DP2 may serve as a body. The first upper pillars UP1 and the first lower pillars DP1 are connected first pipeline contacts PC1. Exemplarily, the surface layers 116" of the first upper pillars UP1 and the first lower pillars DP1 are connected through the surface layers of the first pipeline contacts PC1. The surface layers of the first pipeline contacts PC1 may be formed of the same materials as those of the surface layers 116" of the first upper pillars UP1 and the first lower pillars DP1.

Exemplarily, the inner layers 114" of the first upper pillars UP1 and UP2 and first lower pillars DP1 are connected through the inner layers of the first pipeline contacts PC1. The inner layers of the first pipeline contacts PC1 may be formed of the same materials as those of the inner layers 114" of the first upper pillars UP1 and UP2 and first lower pillars DP1.

That is, the first upper pillars UP1 and the first to fourth upper word lines UW1 to UW4 form first upper strings, and the first lower pillars DP1 and the first to fourth lower word lines DW1 to DW4 form first lower strings. The first upper strings and the first lower strings are connected through the first pipeline contacts PC1, respectively. The drains 320 and the bit lines BL1 to BL3 are connected to the one ends of the first upper strings. The common source line CSL is connected to the one ends of the first lower strings. That is, the first upper strings and the first lower strings form a plurality of stings that are connected between the bit lines BL1 to BL3 and the common source line CSL.

Likewise, the second upper pillars UP2 and the fifth to eighth upper word lines UW5 to UW8 form second upper strings, and the second lower pillars DP2 and the first to fourth lower word lines DW1 to DW4 form second lower strings. The second upper strings and the second lower strings are connected through second pipeline contacts PC2, respectively. The drains 320 and the bit lines BL1 to BL3 are connected to the one ends of the second upper strings. The common source line CSL is connected to the one ends of the second lower strings. That is, the second upper strings and the second lower strings form a plurality of stings that are connected between the bit lines BL1 to BL3 and the common source line CSL.

Except for that eight transistors are provided to one string and two strings are respectively connected to the first to third bit lines BL1 to BL3, the equivalent circuit of a memory block BLKi_7 is configured like FIG. 3. However, the numbers of word lines, bit lines and strings of the memory block BLKi_7 are not limited.

For forming a channel at the bodies 114" in the first and second pipeline contacts PC1 and PC2, exemplarily, first and second pipeline contact gates (not shown) may be provided. Exemplarily, the first and second pipeline contact gates (not shown) may be provided onto the surfaces of the first and second pipeline contacts PC1 and PC2.

Exemplarily, it has been described above that the lower word lines DW1 to DW4 are shared in adjacent lower pillars DP1 and DP2. However, when upper pillars adjacent to the upper pillars UP1 or UP2 are added, the adjacent upper pillars may share the upper word lines UW1 to UW4 or UW5 to UW8.

Figure 39:
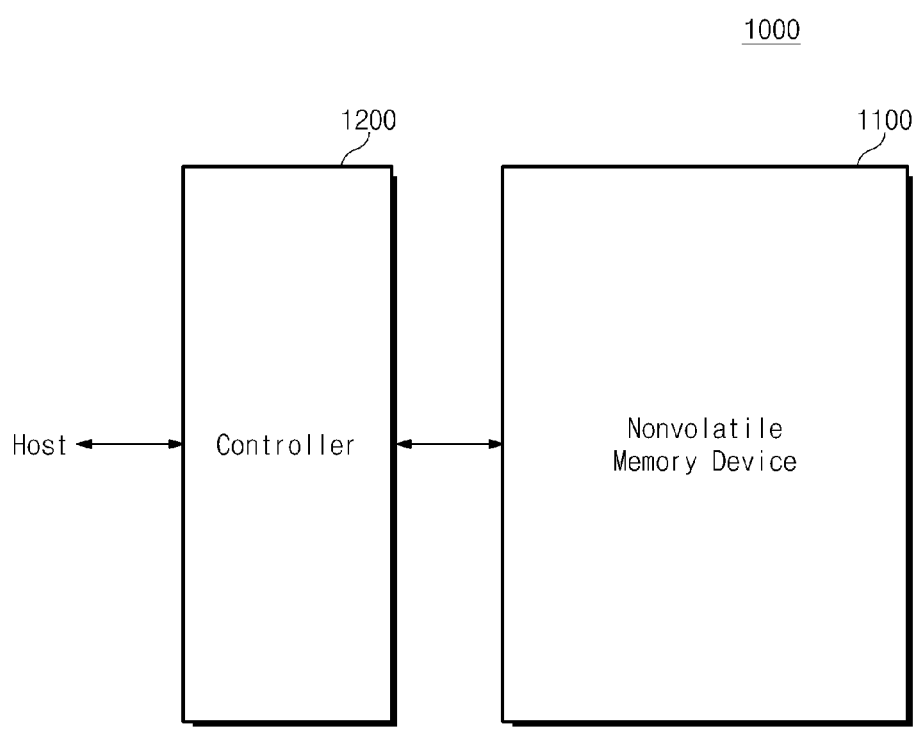
FIG. 39 is a block diagram illustrating a memory system which includes the nonvolatile memory device of FIG. 1, according to an embodiment of the inventive concept.

FIG. 39 is a block diagram illustrating a memory system 1000 which includes the nonvolatile memory device 100 of FIG. 1, according to an embodiment of the inventive concept.

Referring to FIG. 39, a memory system 1000 according to an embodiment of the inventive concept includes a nonvolatile memory device 1100 and a controller 1200.

The nonvolatile memory device 1100 is configured and operates, as described above with reference to FIGS. 1 to 238.

The controller 1200 is connected to a host and the nonvolatile memory device 1100. In response to a request from the host, the controller 1200 accesses the nonvolatile memory device 1100. For example, the controller 1200 controls the reading, writing, erasing and background operations of the nonvolatile memory device 1100. The controller 1200 provides interface between the nonvolatile memory device 1100 and the host. The controller 1200 drives firmware for controlling the nonvolatile memory device 1100.

Exemplarily, as described above with reference to FIG. 1, the controller 1200 provides a control signal CTRL and an address ADDR to the nonvolatile memory device 1100. Furthermore, the controller 12000 exchanges data DATA with the nonvolatile memory device 1100.

Exemplarily, the controller 1200 may further include a RAM, a processing unit, a host interface, and a memory interface. The RAM is used as at least one of a working memory of the processing unit, a cache memory between the nonvolatile memory device 1100 and the host, and a buffer memory between the nonvolatile memory device 1100 and the host. The processing unit controls the overall operation of the controller 1200.

The host interface includes a protocol for data exchange between the host and the controller 1200. Exemplarily, the controller 1200 communicates with external devices (for example, a host) through at least one of various interface protocols such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Component Small Interface (SCSI) protocol, an Enhanced Small Disk Interface (ESDI) protocol and a Integrated Drive Electronics (IDE) protocol. A memory interface interfaces with the nonvolatile memory device 1100. For example, the memory interface includes a NAND interface or a NOR interface.

The memory system 1000 may further include an error correction block. The error correction block detects and corrects the error of data that is read from the nonvolatile memory device 1100 with an Error Correction Code (ECC). Exemplarily, the error correction block is provided as the element of the controller 1200. The error correction block may be provided as the element of the nonvolatile memory device 1100.

The controller 1200 and the nonvolatile memory device 1100 may be integrated as one semiconductor device. Exemplarily, the controller 1200 and the nonvolatile memory device 1100 are integrated as one semiconductor device to configure a memory card. For example, the controller 1200 and the nonvolatile memory device 1100 are integrated as one semiconductor device to configure a memory card such as a PC card (Personal Computer Memory Card International Association (PCMICA)), a compact flash card (CF), a smart media card (SM, SMC), a memory stick, a multimedia card (MMC, RS-MMC, MMCmicro), an SD card (SD, miniSD, microSD, SDHC) and a universal flash memory device (UFS).

The controller 1200 and the nonvolatile memory device 1100 are integrated as one semiconductor device to configure a semiconductor drive (Solid State Drive (SSD)). The semiconductor drive (SSD) includes a storage unit for storing data in a semiconductor memory. When the memory system 1000 is used as the semiconductor drive (SSD), the operation speed of the host connected to the memory system 1000 is considerably improved.

As another example, the memory system 1000 is provided as one of various elements of electronic devices such as computers, Ultra Mobile PCs (UMPCs), workstations, netbooks, Personal Digital Assistants (PDAs), portable computers, web tablets, wireless phones, mobile phones, smart phones, e-books, Portable Multimedia Players (PMPs), portable game machines, navigation devices, black boxes, digital cameras, Digital Multimedia Broadcasting (DMB) players, digital audio recorders, digital audio players, digital picture recorders, digital picture players, digital video recorders, digital video players, devices for transmitting/receiving information at a wireless environment, one of various electronic devices configuring a home network, one of various electronic devices configuring a computer network, one of various electronic devices configuring a telematics network, RFID devices and one of various elements configuring a computing system.

Exemplarily, the nonvolatile memory device 1100 or the memory system 1000 may be mounted as various types of packages. For example, the nonvolatile memory device 1100 or the memory system 1000 may be packaged in a package type such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP), thereby being mounted.

Figure 40:
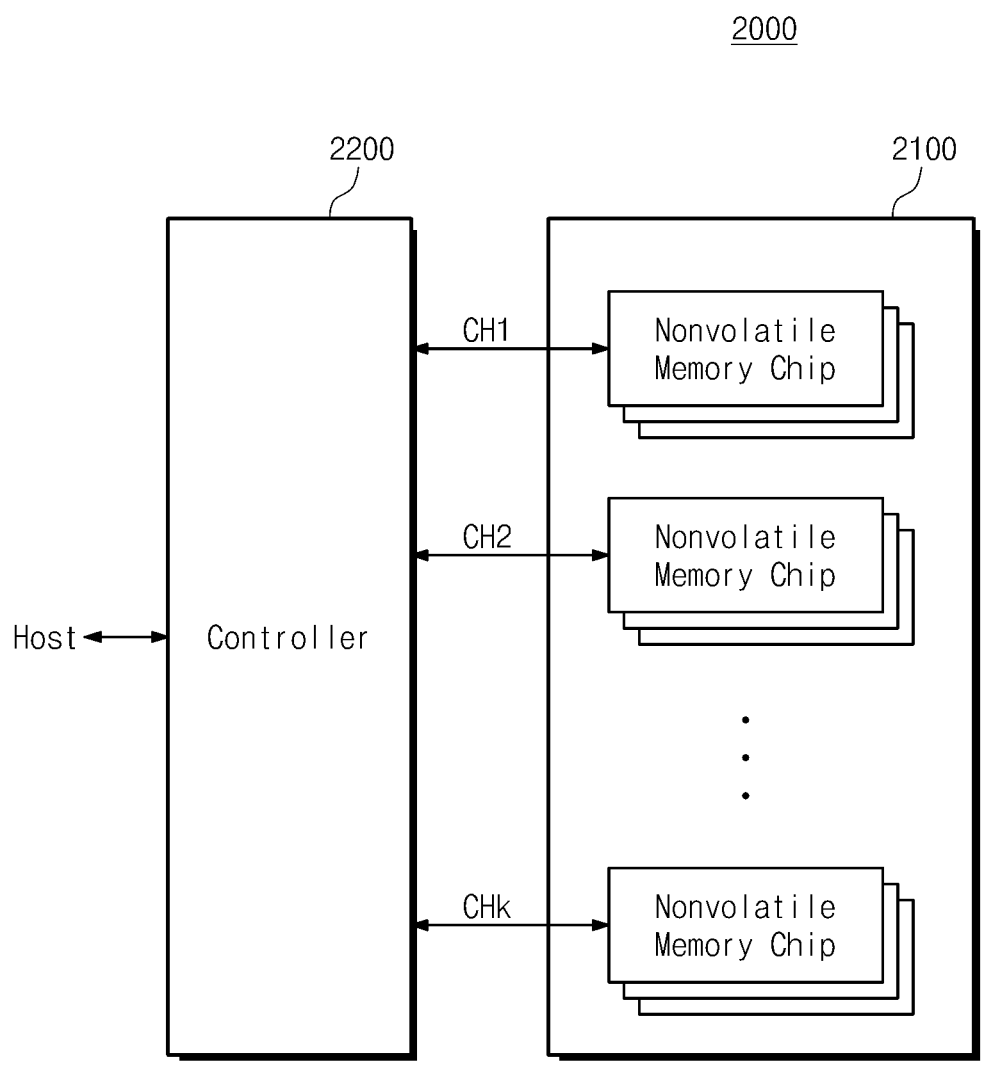
FIG. 40 is a block diagram illustrating an application example of the memory system of FIG. 39.

FIG. 40 is a block diagram illustrating an application example of the memory system 1000 of FIG. 39.

Referring to FIG. 40, a memory system 2000 includes a nonvolatile memory device 2100 and a controller 2200. The nonvolatile memory device 2100 includes a plurality of nonvolatile memory chips. The plurality of nonvolatile memory chips are divided into a plurality of groups. The each group of the nonvolatile memory chips communicates with the controller 2200 through a common channel. In FIG. 40, it is illustrated that the plurality of nonvolatile memory chips communicate with the controller 2200 through first to kth channels CH1 to CHk. Each nonvolatile memory chip is configured like the nonvolatile memory device 100 that has been described above with reference to FIGS. 1 to 38.

In FIG. 40, it has been described above that the plurality of nonvolatile memory chips are connected to one channel. However, the memory system 2000 may be modified so that one nonvolatile memory chip may be connected to one channel.

Figure 41:
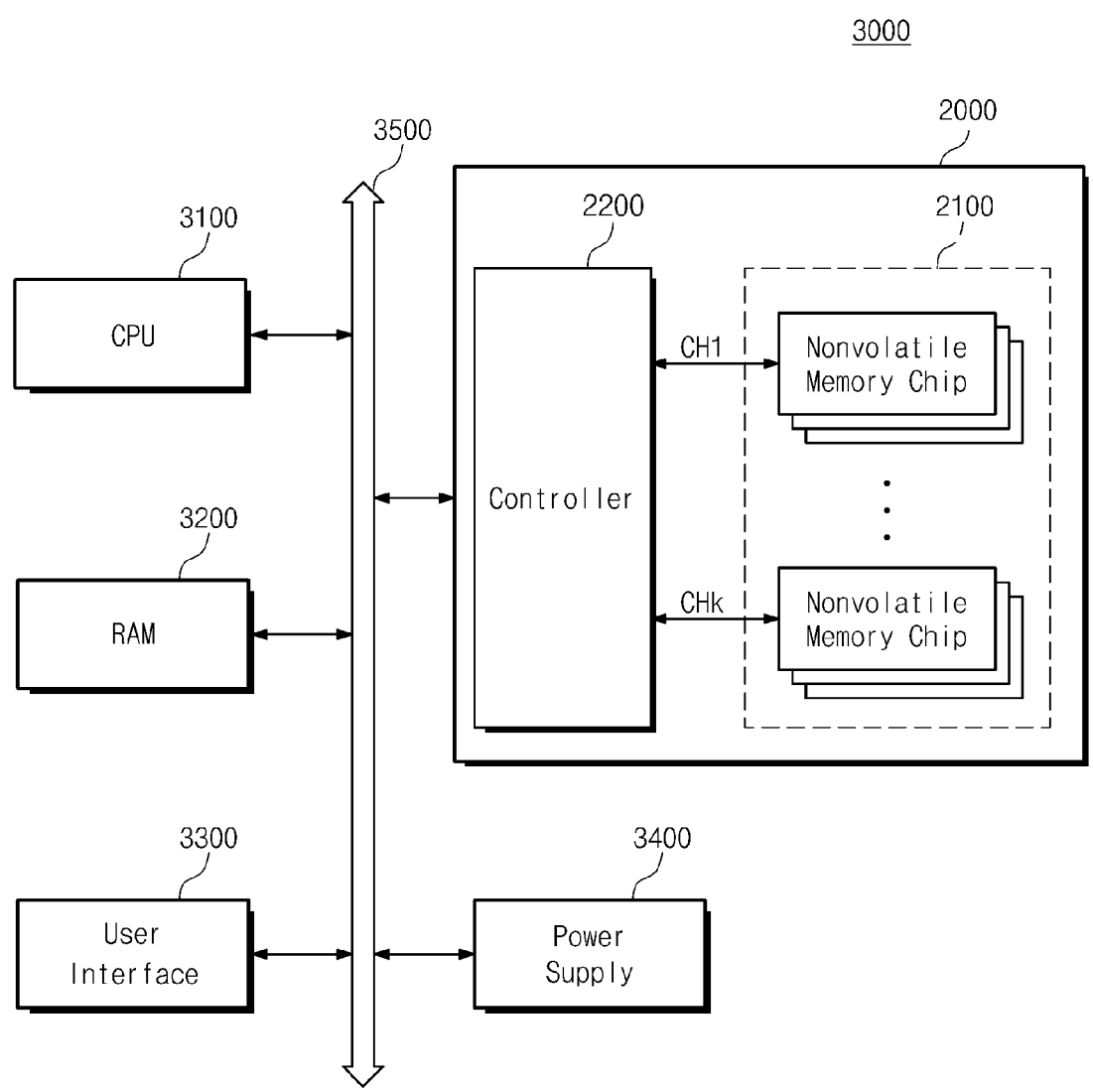
FIG. 41 is a block diagram illustrating a computing system including a memory system which will be described with reference to FIG. 40.

FIG. 41 is a block diagram illustrating a computing system 3000 including the memory system 2000 which has been described above with reference to FIG. 40.

Referring to FIG. 41, a computing system 3000 includes a Central Processing Unit (CPU) 3100, a RAM 3200, a user interface 3300, a power supply 3400, and the memory system 2000.

The memory system 2000 is electrically connected to the CPU 3100, the RAM 3200, the user interface 3300 and the power supply 3400 through a system bus 3500. Data, which is provided through the user interface 3300 or is processed by the CPU 3100, is stored in the memory system 2000.

In FIG. 41, it is illustrated that the nonvolatile memory device 2100 is connected to the system bus 3500 through the controller 2200. However, the nonvolatile memory device 2100 may be directly connected to the system bus 3500.

In FIG. 41, it is illustrated that the memory system 2000 is provided which has been described above with reference to FIG. 40. However, the memory system 2000 may be replaced by the memory system 1000 that has been described above with reference to FIG. 39.

Exemplarily, the computing system 3000 may include all the memory systems 1000 and 2000 that have respectively been described above with reference to FIGS. 39 and 40.

According to embodiments of the inventive concept, a positive voltage is applied to the selection bit line in the programming operation. Accordingly, leakage due to the difference between the channel voltage and the bit line voltage is reduced, and reliability of the nonvolatile memory device is improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A programming method of a nonvolatile memory device including a substrate and a plurality of strings arranged in rows and columns on the substrate, each string including a plurality of memory cells stacked in a direction vertical to a surface of the substrate and at least first and second string selection transistors stacked in the direction vertical to the surface of the substrate on the plurality of memory cells, first string selection transistors of each row being connected to a first string selection line commonly, second string selection transistors of each row being connected to a second string selection line commonly, second string selection transistors of each column being connected to a bit line commonly, memory cells of the plurality of strings having a same order from the surface of the substrate being connected to a word line commonly, the programming method comprising:

applying a first voltage to a selected bit line, the first voltage being a positive voltage;

applying a second voltage to an unselected bit line, the second voltage being a positive voltage higher than the first voltage;

applying third voltages to first and second string selection lines of a selected row, the third voltages turning on first and second string selection transistors connected to the first and second string lines of the selected row;

applying fourth voltages to first and second string selection lines of an unselected row, the fourth voltages turning off first and second string selection transistors connected to the first and second string selection lines of the unselected row;

applying a program voltage to a selected word line; and applying a pass voltages to an unselected word line, wherein a selected memory cell corresponding to the selected bit line, the selected row, and the selected word line is programmed, wherein an unselected memory cell corresponding to at least one of the unselected bit line, the unselected row, and the unselected word line is program-prohibited.

2. The programming method of claim 1, wherein the first and second string selection transistors of each string have structures identical with the plurality of memory cells of each string.

3. The programming method of claim 1, wherein the nonvolatile memory device further includes at least one dummy memory cell connected between the surface of the substrate and the plurality of memory cells, two memory cells of the plurality of memory cells, or the plurality of memory cells and the first string selection transistor, dummy memory cells of the plurality of strings are connected to a dummy word line commonly, and the programming method further includes applying a dummy pass voltage to the dummy word line.

4. A programming method of a nonvolatile memory device including a substrate and a plurality of strings arranged in rows and columns on the substrate, each string including at least first and second ground selection transistors, a plurality of memory cells and at least first and second string selection transistors sequentially stacked in a direction vertical to a surface of the substrate, first string selection transistors of each row being connected to a first string selection line commonly, second string selection transistors of each row being connected to a second string selection line commonly, second string selection transistors of each column being connected to a bit line commonly, memory cells of the plurality of strings having a same order from the surface of the substrate being connected to a word line commonly, first ground selection transistors of the plurality of strings being connected to a first ground selection line commonly, second ground selection transistors of the plurality of strings being connected to a second ground selection line commonly, the programming method comprising:

applying a first voltage to a selected bit line, the first voltage being a positive voltage;

applying a second voltage to an unselected bit line, the second voltage being a positive voltage higher than the first voltage;

applying third voltages to first and second string selection lines of a selected row, the third voltages turning on first and second string selection transistors connected to the first and second string lines of the selected row;

applying fourth voltages to first and second string selection lines of an unselected row, the fourth voltages turning off first and second string selection transistors connected to the first and second string selection lines of the unselected row;

applying fifth voltages to the first and second ground selection lines, the fifth voltages turning off the first and second ground selection transistors of the plurality of strings;

applying a program voltage to a selected word line; and applying a pass voltages to an unselected word line, wherein a selected memory cell corresponding to the selected bit line, the selected row, and the selected word line is programmed, wherein an unselected memory cell corresponding to at least one of the unselected bit line, the unselected row, and the unselected word line is program-prohibited.

5. A nonvolatile memory device comprising:

a memory cell array including a plurality of strings arranged in rows and columns on a substrate, each string including a plurality of memory cells stacked in a direction vertical to a surface of the substrate and at least first and second string selection transistors stacked in the direction vertical to the surface of the substrate on the plurality of memory cells, first string selection transistors of each row being connected to a first string selection line commonly, second string selection transistors of each row being connected to a second string selection line commonly, second string selection transistors of each column being connected to a bit line commonly, memory cells of the plurality of strings having a same order from the surface of the substrate being connected to a word line commonly; and a reading and writing circuit connected to the plurality of strings of the memory cell array and configured to, during a program operation, apply a first positive voltage to a selected bit line, apply a second positive voltage higher than the first positive voltage to an unselected bit line, apply third voltages to first and second string selection lines of a selected row, apply fourth voltages to first and second string selection lines of an unselected row, apply a program voltage to a selected word line, and apply a pass voltages to an unselected word line, wherein the third voltages turn on first and second string selection transistors connected to the first and second string lines of the selected row, wherein the fourth voltages turn off first and second string selection transistors connected to the first and second string selection lines of the unselected row;

wherein a selected memory cell corresponding to the selected bit line, the selected row, and the selected word line is programmed, wherein an unselected memory cell corresponding to at least one of the unselected bit line, the unselected row, and the unselected word line is program-prohibited.

6. A memory system comprising:

the nonvolatile memory device of claim 5; and a controller configured to control the nonvolatile memory device to perform a program operation.

* * * * *